(12) United States Patent
Uefuji et al.

(10) Patent No.: US 10,373,854 B2
(45) Date of Patent: Aug. 6, 2019

(54) ELECTROSTATIC CHUCK

(71) Applicant: TOTO LTD., Kitakyushu-shi, Fukuoka (JP)

(72) Inventors: Jumpei Uefuji, Kitakyushu (JP);
Hitoshi Sasaki, Kitakyushu (JP);
Kosuke Yamaguchi, Kitakyushu (JP);
Kengo Maehata, Kitakyushu (JP);
Yuichi Yoshii, Kitakyushu (JP); Tetsuro Itoyama, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 15/937,126

(22) Filed: Mar. 27, 2018

(65) Prior Publication Data

US 2018/0286732 A1    Oct. 4, 2018

(30) Foreign Application Priority Data

Mar. 29, 2017   (JP) .................................. 2017-064475
Feb. 23, 2018   (JP) .................................. 2018-031301

(51) Int. Cl.
*H01L 21/683*   (2006.01)
*H05B 3/28*   (2006.01)
(Continued)

(52) U.S. Cl.
CPC .... *H01L 21/6833* (2013.01); *H01L 21/67103* (2013.01); *H01L 21/67109* (2013.01);
(Continued)

(58) Field of Classification Search
CPC ......... H01L 21/67103; H01L 21/67109; H01L 21/6831
See application file for complete search history.

(56) References Cited

U.S. PATENT DOCUMENTS 6,617,553 B2   9/2003   Ho et al.
9,984,912 B2   5/2018   Cox
(Continued)

FOREIGN PATENT DOCUMENTS

JP   2006-500789 A   1/2006
JP   2010-040644 A   2/2010
(Continued)

*Primary Examiner* — Scott Bauer
(74) *Attorney, Agent, or Firm* — Carrier Blackman & Associates, P.C.; William D. Blackman; Joseph P. Carrier

(57) ABSTRACT

According to one embodiment, an electrostatic chuck includes a ceramic dielectric substrate, an electrode layer, a base plate, and a heater plate. The ceramic dielectric substrate has a first major surface where a processing object is placed. The electrode layer is provided in the ceramic dielectric substrate. The base plate supports the ceramic dielectric substrate. The heater plate is provided between the base plate and the first major surface. The heater plate includes a first heater element and a second heater element. The first heater element emits heat due to a current flowing. The second heater element emits heat due to a current flowing. When viewed along a direction perpendicular to the first major surface, bends of the first heater element is more than bends of the second heater element, and the first heater element includes a portion positioned at a gap of the second heater element.

25 Claims, 29 Drawing Sheets

(51) Int. Cl.
*H01L 21/67* (2006.01)
*H01L 21/687* (2006.01)

(52) U.S. Cl.
CPC .... *H01L 21/6831* (2013.01); *H01L 21/68785* (2013.01); *H05B 3/283* (2013.01)

(56) References Cited

U.S. PATENT DOCUMENTS

2014/0047705 A1* 2/2014 Singh .................... C23C 14/541
  29/611
2017/0236733 A1* 8/2017 Leeser .............. C23C 16/45544
  700/121

FOREIGN PATENT DOCUMENTS

| JP | 2016-100474 A | 5/2016 |
| JP | 2016-534556 A | 11/2016 |
| JP | 2017-183368 A | 10/2017 |

\* cited by examiner

ELECTROSTATIC CHUCK

CROSS-REFERENCE TO RELATED APPLICATIONS

This application is based upon and claims the benefit of priorities from Japanese Patent Application No. 2017-064475, filed on Mar. 29, 2017 and Japanese Patent Application No. 2018-031301, filed on Feb. 23, 2018; the entire contents of which are incorporated herein by reference.

FIELD

Embodiments described herein relate generally to an electrostatic chuck.

BACKGROUND

An electrostatic chuck is used to attract and hold a processing object such as a semiconductor wafer, a glass substrate, etc., inside a plasma processing chamber that performs etching, CVD (Chemical Vapor Deposition), sputtering, ion implantation, ashing, etc. The electrostatic chuck applies electrical power for electrostatic attraction to a built-in electrode and attracts and holds a substrate such as a silicon wafer, etc., by an electrostatic force.

In recent years, it is desirable to downsize and increase the processing speed of an IC chip including a semiconductor element such as a transistor, etc. Accordingly, it is desirable to increase the precision of the patterning such as etching, etc., when forming the semiconductor element on the wafer. The patterning precision of the etching indicates whether or not a pattern having the designed width and/or depth can be formed by patterning the wafer. By increasing the patterning precision of the etching, etc., the semiconductor element can be downscaled; and the integration can be increased. In other words, by increasing the patterning precision, faster speeds and downsizing of the chip are possible.

It is known that the patterning precision of etching or the like is dependent on the temperature of the wafer when patterning.

Therefore it is desirable to stably control the temperature of the wafer when patterning in a substrate processing apparatus including an electrostatic chuck. For example, the ability to cause the temperature distribution in the wafer surface to be uniform (temperature uniformity) is desirable. Also, the ability to deliberately set a temperature difference in the wafer surface (temperature controllability) is desirable. As a method for controlling the temperature of the wafer, a method is known in which an electrostatic chuck including a heater (a heating element) and/or a cooling plate is used (JP-A 2010-40644 (Kokai)).

A pattern that has a planar configuration is provided in a heater built into an electrostatic chuck. Thereby, for example, the output can be realized as necessary. For example, the pattern is formed by removing a portion of a metal foil used to form the heater by using wet etching, etc., or by printing the metal foil used to form the heater onto a ceramic sheet. In the case where wet etching or the like is used, the metal foil that remains without being removed is used to form the heater emitting heat due to an applied voltage. In other words, the electrostatic chuck includes a portion where the heater emitting heat is provided, and a portion where the heater is not provided.

Therefore, a temperature unevenness (an unevenness of the temperature) occurs in the electrostatic chuck according to the pattern of the heater. In other words, the temperature is high at the portion where the heater is provided; and the temperature is low at the portion where the heater is not provided. Even in the case of a wafer of which the temperature is controlled by the electrostatic chuck, a temperature unevenness occurs in the wafer surface due to the pattern of the heater; and the uniformity of the temperature distribution decreases.

In the case where two types of heaters are provided, the thickness of the entire heater increases; and there are cases where the response (the ramp rate) of the temperature of the wafer decreases. In other words, there are cases where the time necessary for controlling the temperature of the wafer undesirably lengthens.

The invention is based on a recognition of these problems and is directed to provide an electrostatic chuck in which the uniformity of the temperature distribution in the surface of the processing object can be increased.

DETAILED DESCRIPTION

Figure 1:
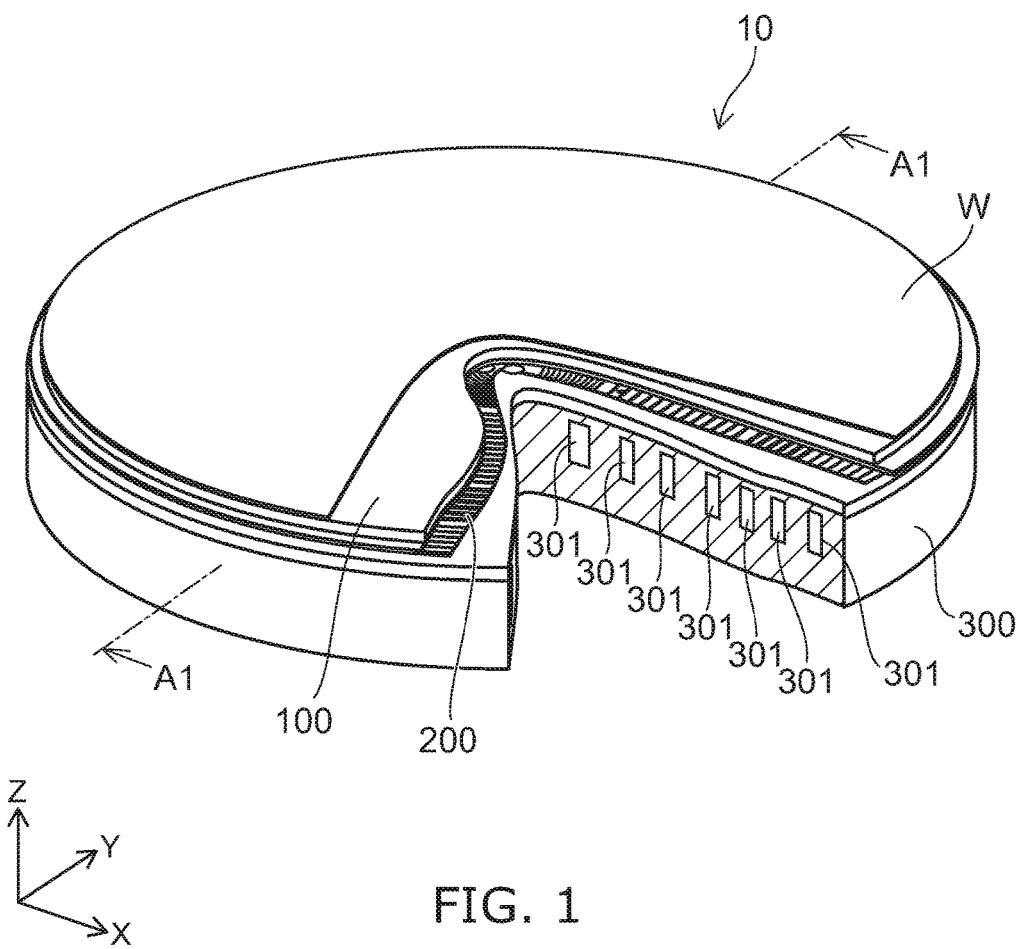
FIG. 1 is a schematic perspective view illustrating an electrostatic chuck according to the embodiment.

A first invention is an electrostatic chuck including a ceramic dielectric substrate, an electrode layer, a base plate, and a heater plate, wherein the ceramic dielectric substrate has a first major surface where a processing object is placed; the electrode layer is provided in the ceramic dielectric substrate; the base plate supports the ceramic dielectric substrate; the heater plate is provided between the base plate and the first major surface; the heater plate includes a first heater element and a second heater element; the first heater element generates heat due to a current flowing; the second heater element generates heat due to a current flowing; and when viewed along a direction perpendicular to the first major surface, bends of the first heater element are more than bends of the second heater element, and the first heater element includes a portion positioned at a gap of the second heater element.

According to the electrostatic chuck, the temperature unevenness (the unevenness of the temperature) in the surface of the processing object occurring due to the pattern of the second heater element can be suppressed by the first heater element. Accordingly, the uniformity of the temperature distribution in the surface of the processing object can be increased.

A second invention is the electrostatic chuck of the first invention wherein the heater plate includes multiple first heater regions and multiple second heater regions; the first heater element includes multiple first heater electrodes provided independently from each other in the multiple first heater regions; the second heater element includes multiple second heater electrodes provided independently from each other in the multiple second heater regions; and the number of the first heater regions is larger than the number of the second heater regions.

According to the electrostatic chuck, the temperature can be controlled independently for each region in the surface of the processing object because the first heater electrode and the second heater electrode are independent from each other in the multiple regions. By providing many regions where the first heater electrodes are provided, fine adjustment of the temperature by the first heater electrodes is possible. Accordingly, the uniformity of the temperature distribution in the surface of the processing object can be increased.

A third invention is the electrostatic chuck of the second invention wherein an electrical resistance of the first heater electrode is higher than an electrical resistance of the second heater electrode.

According to the electrostatic chuck, the output of the first heater electrode can be set to be lower than the output of the second heater electrode because the electrical resistance of the first heater electrode is relatively high. The temperature unevenness in the surface of the processing object due to the pattern of the second heater electrode can be suppressed by the first heater electrode. Accordingly, the uniformity of the temperature distribution in the surface of the processing object can be increased.

A fourth invention is the electrostatic chuck of any one of the first to third inventions wherein the second heater element includes a connection region; an electrically conductive body is connected to the connection region and supplies electrical power to the second heater element; and when viewed along a direction perpendicular to the first major surface, at least a portion of the first heater element overlaps the connection region.

According to the electrostatic chuck, the temperature unevenness in the surface of the processing object occurring due to the connection region of the second heater element can be suppressed by the first heater element. Accordingly, the uniformity of the temperature distribution in the surface of the processing object can be increased.

A fifth invention is the electrostatic chuck of the second or third invention wherein the heater plate further includes a bypass layer that is electrically conductive and is electrically connected to at least one of the first heater element or the second heater element.

According to the electrostatic chuck, the electrical power can be supplied from the outside to the heater elements via the bypass layer. Also, the degrees of freedom of the arrangement of the terminals supplying the electrical power to the heater elements can be high. Thereby, for example, the terminals that easily become singularities of the temperature can be arranged to be dispersed; and the heat is diffused easily at the peripheries of the singularities. Accordingly, the uniformity of the temperature distribution in the surface of the processing object can be increased further.

A sixth invention is the electrostatic chuck of the fifth invention wherein the bypass layer is electrically connected to both the first heater element and the second heater element.

According to the electrostatic chuck, a common bypass layer can be used for the electrical power supply to the first heater element and the electrical power supply to the second heater element. Thereby, the increase of the number of layers of the heater plate can be suppressed; and the thermal capacity of the heater plate can be reduced. Accordingly, the response (the ramp rate) of the temperature can be improved.

A seventh invention is the electrostatic chuck of the fifth or sixth invention wherein the bypass layer includes multiple bypass portions; and the number of the bypass portions electrically connected to the first heater element is not more than 2 times the number of the first heater regions.

According to the electrostatic chuck, the number of terminals connected to the multiple bypass portions can be reduced by suppressing the number of bypass portions electrically connected to the first heater element to be not more than 2 times the number of the first heater regions.

Thereby, the temperature unevenness in the surface of the processing object due to the singularities of the temperature can be suppressed.

An eighth invention is the electrostatic chuck of any one of the second, third, or fifth to seventh inventions wherein the first heater electrode is not provided in one of the multiple first heater regions.

According to the electrostatic chuck, the thickness of the heater plate in the region where the first heater electrode is not provided can be thin. The thermal capacity of the heater plate can be reduced. Accordingly, the response (the ramp rate) of the temperature can be improved.

A ninth invention is the electrostatic chuck of any one of the second, third, or fifth to seventh inventions wherein the first heater electrode is not provided in one of the multiple first heater regions; the heater plate includes an electrically conductive portion provided in the first heater region where the first heater electrode is not provided; and the electrically conductive portion is not supplied with power from the outside.

According to the electrostatic chuck, by providing the electrically conductive portion in the region where the first heater electrode is not provided, the unevenness of the heater plate can be improved; and the uniformity of the temperature distribution in the surface of the processing object can be increased.

A tenth invention is the electrostatic chuck of any one of the first to ninth inventions wherein the heater plate further includes a third heater element that generates heat due to a current flowing; the third heater element is provided in a layer different from a layer where the first heater element is provided and different from a layer where the second heater element is provided; and when viewed along a direction perpendicular to the first major surface, bends of the third heater element are more than the bends of the second heater element, and the third heater element includes a portion positioned at a gap of the second heater element.

According to the electrostatic chuck, the temperature unevenness in the surface of the processing object occurring due to the pattern of the first and second heater elements can be suppressed by the third heater element. Accordingly, the uniformity of the temperature distribution in the surface of the processing object can be increased further.

An eleventh invention is the electrostatic chuck of any one of the first to tenth inventions wherein the first heater element is provided between the first major surface and the second heater element.

According to the electrostatic chuck, the distance between the first heater element and the processing object is shorter than the distance between the second heater element and the processing object. By setting the first heater element to be relatively proximal to the processing object, the temperature of the processing object is controlled easily by the first heater element. In other words, the temperature unevenness in the surface of the processing object occurring due to the pattern of the second heater element is suppressed easily by the first heater element. Accordingly, the uniformity of the temperature distribution in the surface of the processing object can be increased.

A twelfth invention is the electrostatic chuck of any one of the first to eleventh inventions wherein the heater plate further includes at least one of a first support plate or a second support plate; the first support plate is provided on the first heater element and the second heater element; the second support plate is provided under the first heater element and the second heater element; a thermal conductivity of the first support plate is higher than a thermal conductivity of the first heater element and higher than a thermal conductivity of the second heater element; and a thermal conductivity of the second support plate is higher than the thermal conductivity of the first heater element and higher than the thermal conductivity of the second heater element.

According to the electrostatic chuck, in the case where the heater plate includes the first support plate, the temperature unevenness in the surface of the processing object occurring due to the pattern of the first and second heater elements can be improved. In the case where the heater plate includes the second support plate, the effects of the temperature unevenness in the surface of the base plate on the temperature of the heater plate can be improved. Also, the warp of the heater plate can be reduced by the first and second support plates.

A thirteenth invention is the electrostatic chuck of the twelfth invention wherein at least one of the first support plate or the second support plate has multiple types of recesses having mutually-different depths.

According to the electrostatic chuck, the temperature distribution in the surface of the processing object can be adjusted by adjusting the pattern of the multiple types of unevennesses. Thereby, the temperature unevenness in the surface of a processing object W can be improved; and the uniformity of the temperature distribution in the surface can be increased.

A fourteenth invention is the electrostatic chuck of any one of the first to thirteenth inventions wherein the first heater element includes a first connection portion; an electrically conductive body is connected to the first connection portion and supplies electrical power to the first heater element; the second heater element includes a second connection portion; an electrically conductive body is connected to the second connection portion and supplies electrical power to the second heater element; and a width of the first connection portion is narrower than a width of the second connection portion.

According to the electrostatic chuck, because the width of the first connection portion is narrow, the unevenness of the temperature distribution that occurs can be suppressed by the first connection portion.

A fifteenth invention is the electrostatic chuck of any one of the first to fourteenth inventions that further includes a power supply terminal supplying electrical power to the heater plate and being provided from the heater plate toward the base plate, wherein the power supply terminal includes a connection member, a conducting lead portion, a supporter, and a coupling portion; the connection member is connected to a socket supplying the electrical power from the outside; the conducting lead portion is finer than the connection member; the supporter is connected to the conducting lead portion; the coupling portion is connected to the supporter and coupled to at least one of the first heater element or the second heater element; and the power supply terminal supplies the electrical power to at least one of the first heater element or the second heater element.

According to the electrostatic chuck, the resistance of the contact portion between the power supply terminal and the at least one of the first heater element and the second heater element can be reduced by the coupling portion. Thereby, abnormal heat can be suppressed; and the uniformity of the temperature distribution in the surface of the processing object can be increased. Because the connection member is wider than the conducting lead portion, the connection member can supply a relatively large current to the heater element. Because the conducting lead portion is finer than the connection member, the conducting lead portion can be deformed more easily than the connection member; and the position of the connection member can be shifted from the center of the coupling portion. Thereby, the power supply terminal can be fixed to a member (e.g., the base plate) that is different from the heater plate.

For example, in the case where the supporter is coupled to the conducting lead portion and the coupling portion by welding, coupling utilizing laser light, soldering, brazing, etc., a wider contact surface area for at least one of the first heater element or the second heater element can be ensured while relaxing the stress applied to the power supply terminal. Also, for example, in the case where the supporter is coupled to the conducting lead portion and the coupling portion by welding, coupling utilizing laser light, soldering, brazing, etc., a coupling portion that has substantially the same thickness as the heater element can be provided.

A sixteenth invention is the electrostatic chuck of any one of the first to fourteenth inventions that further includes a power supply terminal supplying electrical power to the heater plate and being provided in the base plate, wherein the power supply terminal includes a power supply portion and a terminal portion; the power supply portion is connected to a socket supplying the electrical power from the outside; and the terminal portion is connected to the power supply portion and pressed onto at least one of the first heater element or the second heater element.

According to the electrostatic chuck, compared to the case where the power supply terminal is coupled by welding, etc., the diameter of the hole provided for supplying power can be reduced. Because the power supply terminal can be smaller, the periphery of the power supply terminal that becomes a singularity of the temperature can be suppressed. Thereby, the uniformity of the temperature distribution in the surface of the processing object can be increased.

A seventeenth invention is the electrostatic chuck of any one of the first to fourteenth inventions that further includes a first power supply terminal and a second power supply terminal, wherein the first power supply terminal supplies electrical power to the heater plate and is provided in the base plate; the second power supply terminal supplies electrical power to the heater plate and is provided from the heater plate toward the base plate; the first power supply terminal includes a power supply portion and a terminal portion; the power supply portion is connected to a socket supplying the electrical power from the outside; the terminal portion is connected to the power supply portion and pressed onto the first heater element; the first power supply terminal supplies the electrical power to the first heater element; the second power supply terminal includes a connection member, a conducting lead portion, a supporter, and a coupling portion; the connection member is connected to a socket supplying the electrical power from the outside; the conducting lead portion is finer than the connection member; the supporter is connected to the conducting lead portion; the coupling portion is connected to the supporter and coupled to the second heater element; and the second power supply terminal supplies the electrical power to the second heater element.

According to the electrostatic chuck, compared to the case where the power supply terminal is coupled by welding, etc., to the first power supply terminal supplying the electrical power to the first heater element, the diameter of the hole provided for supplying power can be reduced. Because the power supply terminal can be reduced, the periphery of the power supply terminal that becomes a singularity of the temperature can be suppressed. Thereby, the uniformity of the temperature distribution in the surface of the processing object can be increased. On the other hand, at the second power supply terminal that supplies the electrical power to the second heater element, the resistance of the contact portion between the second heater element and the power supply terminal can be reduced by the coupling portion. Thereby, abnormal heat can be suppressed; and the uniformity of the temperature distribution in the surface of the processing object can be increased. Because the connection member is wider than the conducting lead portion, the connection member can supply a relatively large current to the heater element. Because the conducting lead portion is finer than the connection member, the conducting lead portion is deformed more easily than the connection member; and the position of the connection member can be shifted from the center of the coupling portion. Thereby, the power supply terminal can be fixed to a member (e.g., the base plate) that is different from the heater plate. For example, in the case where the supporter is coupled to the conducting lead portion and the coupling portion by welding, coupling utilizing laser light, soldering, brazing, etc., a wider contact surface area for the second heater element can be ensured while relaxing the stress applied to the power supply terminal. For example, in the case where the supporter is coupled to the conducting lead portion and the coupling portion by welding, coupling utilizing laser light, soldering, brazing, etc., a coupling portion that has substantially the same thickness as the heater elements and the bypass layer can be provided.

An eighteenth invention is the electrostatic chuck of any one of the fifth to seventh inventions that further includes a power supply terminal supplying electrical power to the heater plate and being provided from the heater plate toward the base plate, wherein the power supply terminal includes a connection member, a conducting lead portion, a supporter, and a coupling portion; the connection member is connected to a socket supplying the electrical power from the outside; the conducting lead portion is finer than the connection member; the supporter is connected to the conducting lead portion; the coupling portion is connected to the supporter and coupled to the bypass layer; and the power supply terminal supplies the electrical power via the bypass layer to at least one of the first heater element or the second heater element.

According to the electrostatic chuck, the resistance of the contact portion between the bypass layer and the power supply terminal can be reduced by the coupling portion. Thereby, abnormal heat can be suppressed; and the uniformity of the temperature distribution in the surface of the processing object can be increased. Because the connection member is wider than the conducting lead portion, the connection member can supply a relatively large current to the heater element. Because the conducting lead portion is finer than the connection member, the conducting lead portion is deformed more easily than the connection member; and the position of the connection member can be shifted from the center of the coupling portion. Thereby, the power supply terminal can be fixed to a member (e.g., the base plate) that is different from the heater plate. For example, in the case where the supporter is coupled to the conducting lead portion and the coupling portion by welding, coupling utilizing laser light, soldering, brazing, etc., a wider contact surface area for the bypass layer can be ensured while relaxing the stress applied to the power supply terminal. For example, in the case where the supporter is coupled to the conducting lead portion and the coupling portion by welding, coupling utilizing laser light, soldering, brazing, etc., a coupling portion that has substantially the same thickness as the heater elements and the bypass layer can be provided.

A nineteenth invention is the electrostatic chuck of any one of the fifth to seventh inventions that further includes a power supply terminal supplying electrical power to the heater plate and being provided in the base plate, wherein the power supply terminal includes a power supply portion and a terminal portion; the power supply portion is connected to a socket supplying the electrical power from the outside; and the terminal portion is connected to the power supply portion and pressed onto the bypass layer.

According to the electrostatic chuck, the diameter of the hole provided for supplying power can be reduced compared to the case where the power supply terminal is coupled by welding, etc. Because the power supply terminal can be smaller, the periphery of the power supply terminal that becomes a singularity of the temperature can be suppressed. Thereby, the uniformity of the temperature distribution in the surface of the processing object can be increased.

A twentieth invention is the electrostatic chuck of the fifth to seventh inventions that further includes a first power supply terminal and a second power supply terminal, wherein the first power supply terminal supplies electrical power to the heater plate and is provided in the base plate; the second power supply terminal supplies electrical power to the heater plate and is provided from the heater plate toward the base plate; the first power supply terminal includes a power supply portion and a terminal portion; the power supply portion is connected to a socket supplying the electrical power from the outside; the terminal portion is connected to the power supply portion and pressed onto the bypass layer; the first power supply terminal supplies the electrical power to the first heater element; the second power supply terminal includes a connection member, a conducting lead portion, a supporter, and a coupling portion; the connection member is connected to a socket supplying the electrical power from the outside; the conducting lead portion is finer than the connection member; the supporter is connected to the conducting lead portion; the coupling portion is connected to the supporter and coupled to the bypass layer; and the second power supply terminal supplies the electrical power via the bypass layer to the second heater element.

According to the electrostatic chuck, the diameter of the hole provided for supplying power can be reduced compared to the case where the power supply terminal is coupled by welding, etc., to the first power supply terminal supplying the electrical power to the first heater element. Because the power supply terminal can be smaller, the periphery of the power supply terminal that becomes a singularity of the temperature can be suppressed. Thereby, the uniformity of the temperature distribution in the surface of the processing object can be increased. On the other hand, at the second power supply terminal that supplies the electrical power to the second heater element, the resistance of the contact portion between the bypass layer and the power supply terminal can be reduced by the coupling portion. Thereby, abnormal heat can be suppressed; and the uniformity of the temperature distribution in the surface of the processing object can be increased. Because the connection member is wider than the conducting lead portion, the connection member can supply a relatively large current to the heater element. Because the conducting lead portion is finer than the connection member, the conducting lead portion is deformed more easily than the connection member; and the position of the connection member can be shifted from the center of the coupling portion. Thereby, the power supply terminal can be fixed to a member (e.g., the base plate) that is different from the heater plate. For example, in the case where the supporter is coupled to the conducting lead portion and the coupling portion by welding, coupling utilizing laser light, soldering, brazing, etc., a wider contact surface area for the bypass layer can be ensured while relaxing the stress applied to the power supply terminal. For example, in the case where the supporter is coupled to the conducting lead portion and the coupling portion by welding, coupling utilizing laser light, soldering, brazing, etc., a coupling portion that has substantially the same thickness as the heater elements and the bypass layer can be provided.

Embodiments of the invention will now be described with reference to the drawings. Similar components in the drawings are marked with the same reference numerals; and a detailed description is omitted as appropriate.

FIG. 1 is a schematic perspective view illustrating an electrostatic chuck according to the embodiment.

Figure 2A:
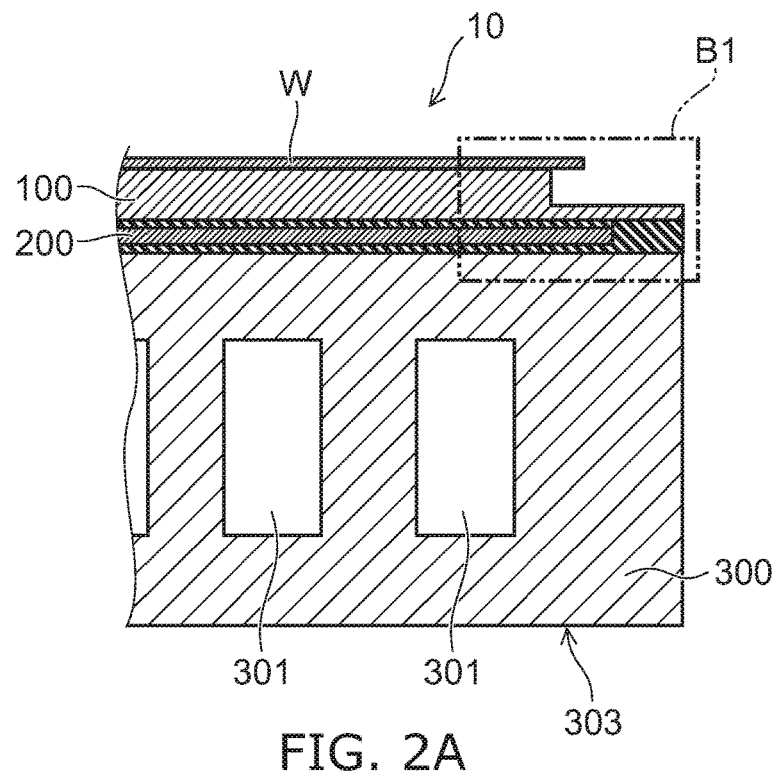
FIG. 2A and FIG. 2B are schematic cross-sectional views illustrating the electrostatic chuck according to the embodiment.
Figure 2B:
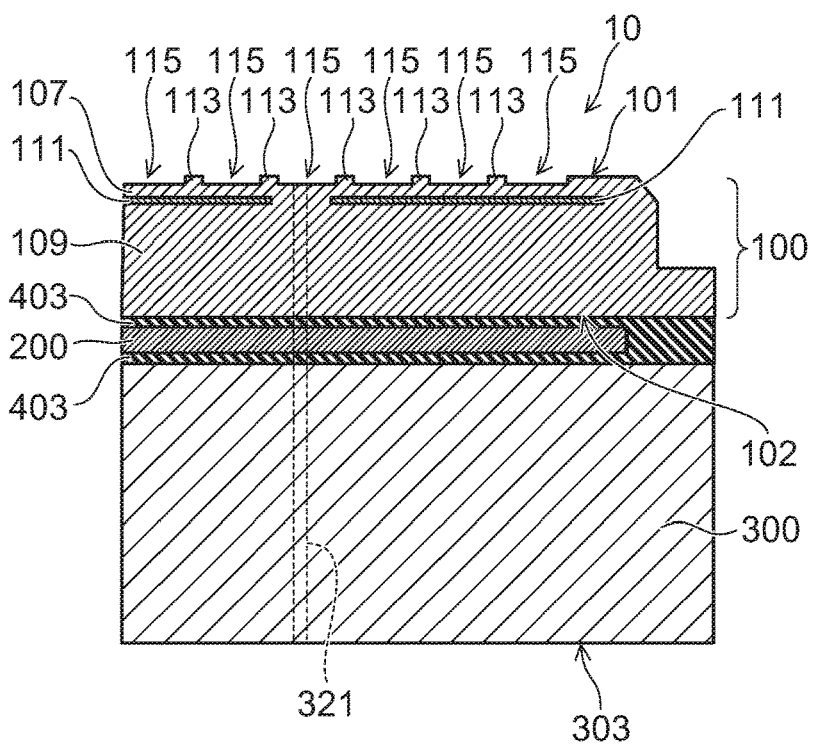

FIG. 2A and FIG. 2B are schematic cross-sectional views illustrating the electrostatic chuck according to the embodiment.

In FIG. 1, a cross-sectional view of a portion of the electrostatic chuck is illustrated for convenience of description. FIG. 2A is, for example, a schematic cross-sectional view of an A1-A1 cross section illustrated in FIG. 1. FIG. 2B is an enlarged schematic view of region B1 illustrated in FIG. 2A.

The electrostatic chuck 10 according to the embodiment includes a ceramic dielectric substrate 100, a heater plate 200, and a base plate 300.

In the example, the ceramic dielectric substrate 100 is provided at a position separated from the base plate 300. The ceramic dielectric substrate 100 is, for example, a base material having a flat plate configuration made of a polycrystalline ceramic sintered body, has a first major surface 101 where a processing object W such as a semiconductor wafer or the like is placed, and has a second major surface 102 on the side opposite to the first major surface 101.

Here, in the description of the embodiment, a direction that connects the first major surface 101 and the second major surface 102 is taken as a Z-direction. The Z-direction is perpendicular to the first major surface 101. One direction orthogonal to the Z-direction is taken as an X-direction; and a direction orthogonal to the Z-direction and the X-direction is taken as a Y-direction. In this specification, "in the plane" is, for example, in the X-Y plane.

For example, $Al_2O_3$, $Y_2O_3$, YAG, etc., are examples of the material of the crystal included in the ceramic dielectric substrate 100. By using such materials, the infrared transmissivity, the insulation stability, and the plasma resistance of the ceramic dielectric substrate 100 can be increased.

An electrode layer 111 is provided in the interior of the ceramic dielectric substrate 100. The electrode layer 111 is interposed between the first major surface 101 and the second major surface 102. In other words, the electrode layer 111 is formed to be inserted into the ceramic dielectric substrate 100. The electrode layer 111 is sintered as one body with the ceramic dielectric substrate 100.

The electrode layer 111 is not limited to being interposed between the first major surface 101 and the second major surface 102 and may be accessorily provided at the second major surface 102.

By applying an attracting/holding voltage to the electrode layer 111, the electrostatic chuck 10 generates a charge on the first major surface 101 side of the electrode layer 111 and holds the processing object W by an electrostatic force.

The electrode layer 111 is provided along the first major surface 101 and the second major surface 102. The electrode layer 111 is an attraction electrode for attracting and holding the processing object W. The electrode layer 111 may be a unipole-type or a dipole-type. The electrode layer 111 also may be a tripole-type or another multi-pole type. The number of the electrode layers 111 and the arrangement of the electrode layers 111 are appropriately selected.

The ceramic dielectric substrate 100 includes a first dielectric layer 107 between the electrode layer 111 and the first major surface 101, and a second dielectric layer 109 between the electrode layer 111 and the second major surface 102. In the ceramic dielectric substrate 100, it is favorable for the infrared spectral transmittance of at least the first dielectric layer 107 to be 20% or more. In the embodiment, the infrared spectral transmittance is a value converted to a thickness of 1 mm.

The infrared rays that are emitted from the heater plate 200 in the state in which the processing object W is placed on the first major surface 101 can efficiently pass through the ceramic dielectric substrate 100 by setting the infrared spectral transmittance of at least the first dielectric layer 107 of the ceramic dielectric substrate 100 to be 20% or more. Accordingly, the heat is not stored easily in the processing object W; and the controllability of the temperature of the processing object W increases.

For example, in the case where the electrostatic chuck 10 is used inside a chamber in which plasma processing is performed, the temperature of the processing object W increases more easily as the plasma power increases. In the electrostatic chuck 10 of the embodiment, the heat that is transferred to the processing object W by the plasma power is transferred efficiently to the ceramic dielectric substrate 100. Further, the heat that is transferred to the ceramic dielectric substrate 100 by the heater plate 200 is transferred efficiently to the processing object W. Accordingly, the processing object W is maintained more easily at the desired temperature by efficiently transferring heat.

In the electrostatic chuck 10 according to the embodiment, it is desirable for the infrared spectral transmittance of the second dielectric layer 109, in addition to the first dielectric layer 107, to be 20% or more. By setting the infrared spectral transmittances of the first dielectric layer 107 and the second dielectric layer 109 to be 20% or more, the infrared rays emitted from the heater plate 200 pass through the ceramic dielectric substrate 100 more efficiently; and the temperature controllability of the processing object W can be increased.

The base plate 300 is provided on the second major surface 102 side of the ceramic dielectric substrate 100 and supports the ceramic dielectric substrate 100 via the heater plate 200. A passageway 301 is provided in the base plate 300. Namely, the passageway 301 is provided in the interior of the base plate 300. For example, aluminum is an example of the material of the base plate 300.

The base plate 300 performs the role of the temperature adjustment of the ceramic dielectric substrate 100. For example, in the case where the ceramic dielectric substrate 100 is cooled, a cooling medium is caused to flow into the passageway 301 and pass through the passageway 301; and the cooling medium is caused to flow out from the passageway 301. Thereby, the heat of the base plate 300 is absorbed by the cooling medium; and the ceramic dielectric substrate 100 that is mounted on the base plate 300 can be cooled.

On the other hand, in the case where the ceramic dielectric substrate 100 is heated, it is also possible to provide a heating medium into the passageway 301. Or, it is also possible for a not-illustrated heater to be built into the base plate 300. Thus, when the temperature of the ceramic dielectric substrate 100 is adjusted by the base plate 300, the temperature of the processing object W held by the electrostatic chuck 10 can be adjusted easily.

Protrusions 113 are provided as necessary on the first major surface 101 side of the ceramic dielectric substrate 100. Grooves 115 are provided between the protrusions 113 adjacent to each other. The grooves 115 communicate with each other. A space is formed between the grooves 115 and the back surface of the processing object W placed on the electrostatic chuck 10.

An introduction path 321 that pierces the base plate 300 and the ceramic dielectric substrate 100 is connected to the grooves 115. If a transfer gas such as helium (He) or the like is introduced from the introduction path 321 in the state in which the processing object W is held, the transfer gas flows in the space provided between the processing object W and the grooves 115; and the processing object W can be directly heated or cooled by the transfer gas.

The heater plate 200 is provided between the first major surface 101 and the base plate 300. The heater plate 200 generates heat due to the flow of a heater current; and the temperature of the processing object W can be higher compared to the case where the heater plate 200 does not generate heat. In the example, the heater plate 200 is a separate body from the ceramic dielectric substrate 100 and is provided between the ceramic dielectric substrate 100 and the base plate 300.

A bonding agent 403 is provided between the base plate 300 and the heater plate 200. The bonding agent 403 is provided between the heater plate 200 and the ceramic dielectric substrate 100. A heat-resistant resin such as silicone that has a relatively high thermal conductivity or the like is an example of the material of the bonding agent 403. The thickness of the bonding agent 403 is, for example, not less than about 0.1 millimeters (mm) and not more than about 1.0 mm. The thickness of the bonding agent 403 is the same as the distance between the base plate 300 and the heater plate 200 or the distance between the heater plate 200 and the ceramic dielectric substrate 100.

In the embodiment, the heater plate 200 may be interposed between the first major surface 101 and the second major surface 102. In other words, the heater plate 200 may be formed to be inserted into the ceramic dielectric substrate 100.

Figure 3:
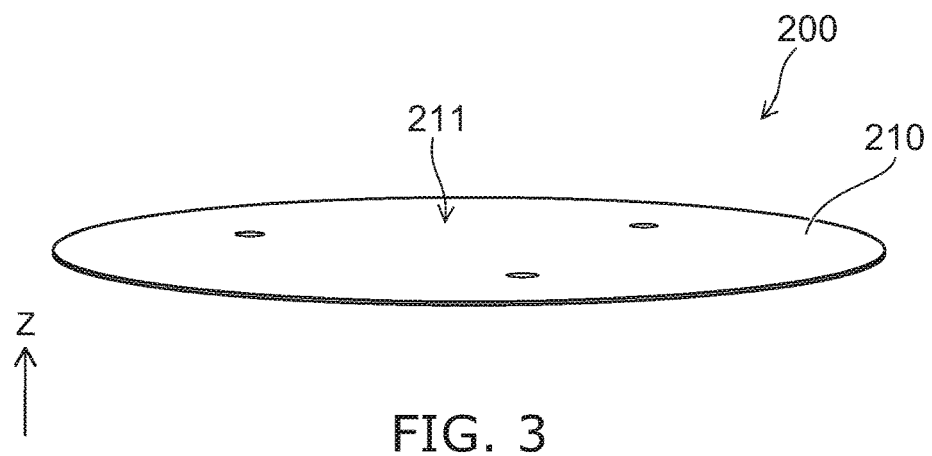
FIG. 3 is a schematic perspective view illustrating the heater plate according to the embodiment.

FIG. 3 is a schematic perspective view illustrating the heater plate according to the embodiment.

Figure 4A:
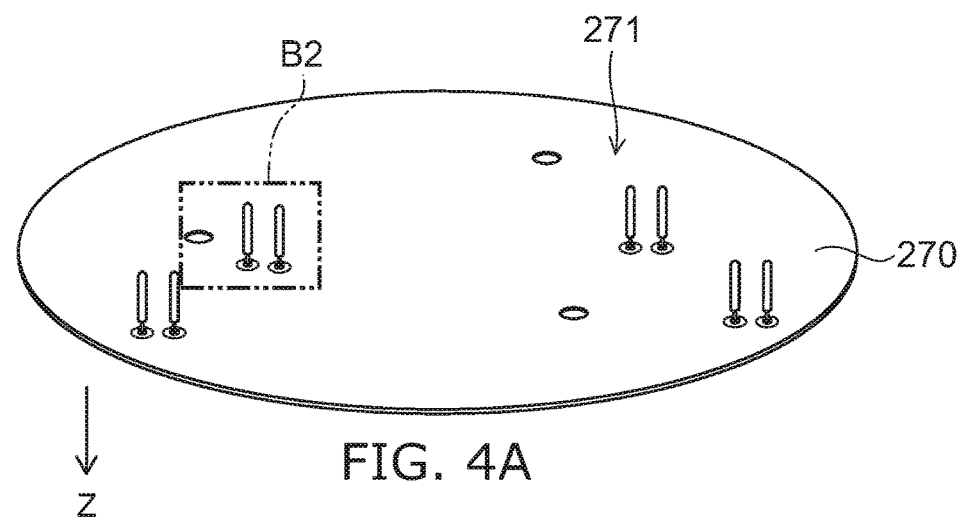
FIG. 4A and FIG. 4B are schematic perspective views illustrating the heater plate according to the embodiment.
Figure 4B:
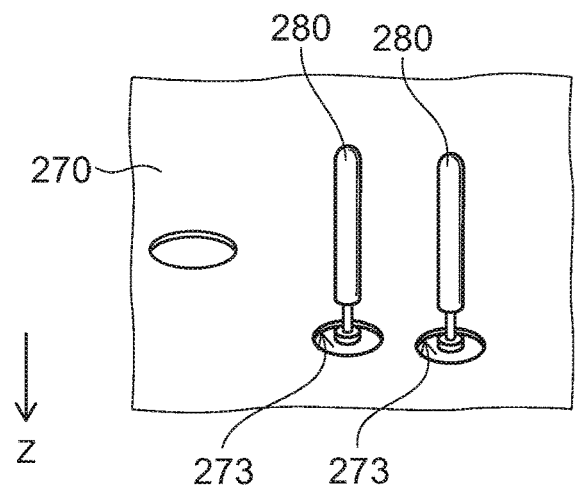

FIG. 4A and FIG. 4B are schematic perspective views illustrating the heater plate according to the embodiment.

Figure 5:
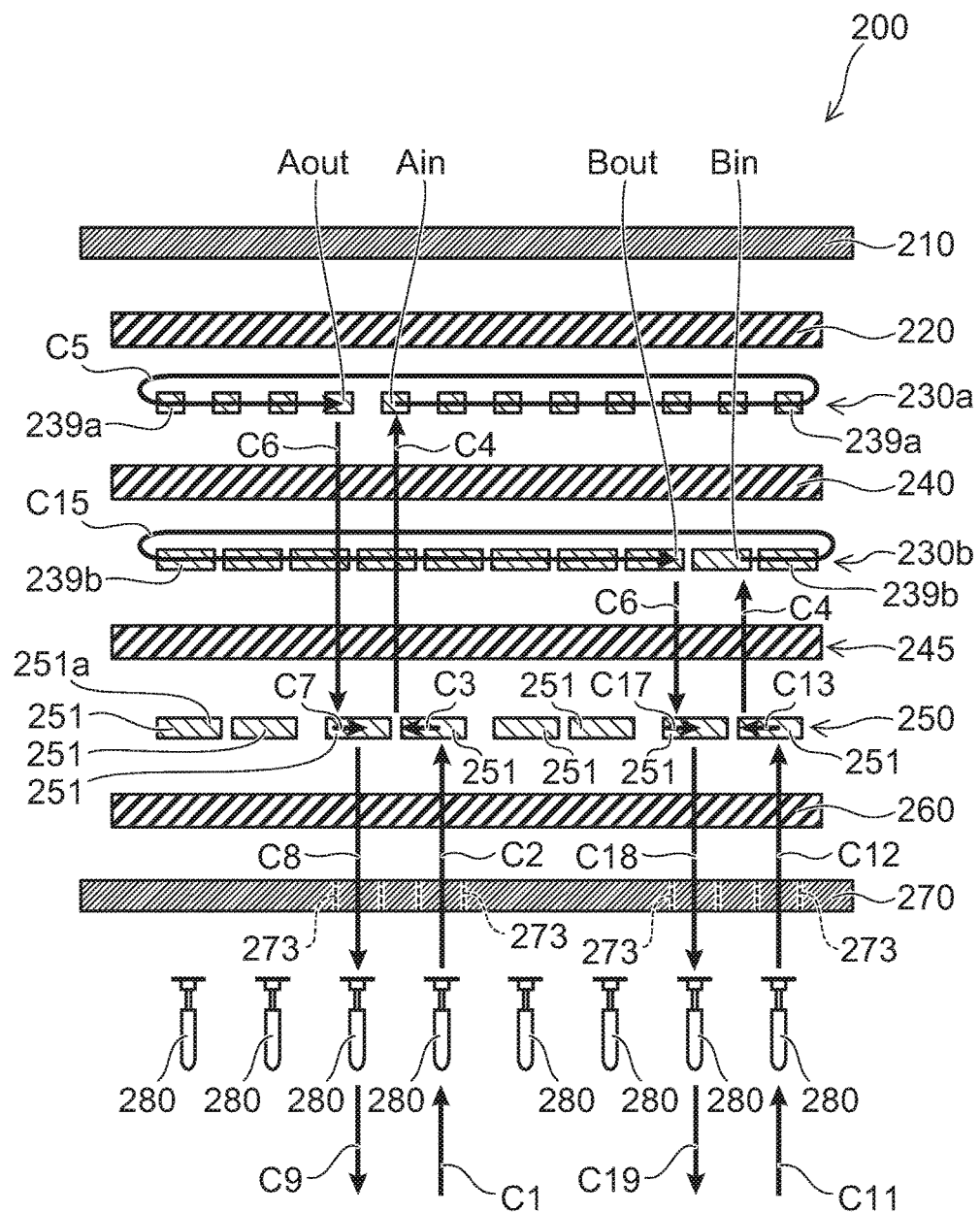
FIG. 5 is a schematic exploded view illustrating the heater plate according to the embodiment.

FIG. 5 is a schematic exploded view illustrating the heater plate according to the embodiment.

Figure 6:
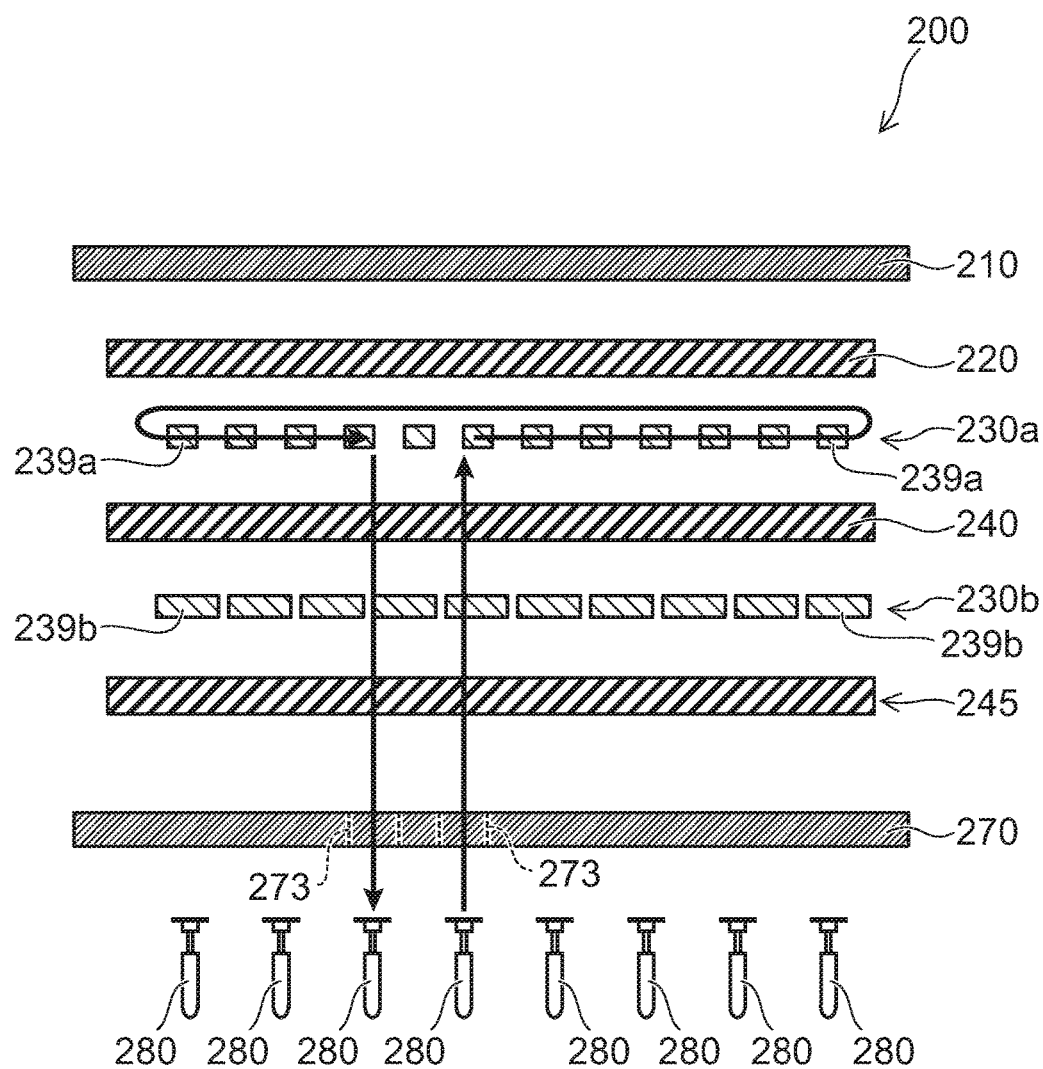
FIG. 6 is a schematic exploded view illustrating a modification of the heater plate according to the embodiment.

FIG. 6 is a schematic exploded view illustrating a modification of the heater plate according to the embodiment.

FIG. 3 is a schematic perspective view of the heater plate of the embodiment viewed from the upper surface (the surface on the ceramic dielectric substrate 100 side). FIG. 4A is a schematic perspective view of the heater plate of the embodiment viewed from the lower surface (the surface on the base plate 300 side). FIG. 4B is an enlarged schematic view of region B2 illustrated in FIG. 4A.

As illustrated in FIG. 5, the heater plate 200 includes a first support plate 210, a first resin layer 220, a first heater element (a heating layer) 230a, a second resin layer 240, a second heater element 230b, a third resin layer 245, a bypass layer 250, a fourth resin layer 260, a second support plate 270, and power supply terminals 280.

The first support plate 210 is provided on the first heater element 230a, the second heater element 230b, the bypass layer 250, etc. The second support plate 270 is provided under the first heater element 230a, the second heater element 230b, the bypass layer 250, etc. As illustrated in FIG. 3, a surface 211 (the upper surface) of the first support plate 210 forms the upper surface of the heater plate 200.

As illustrated in FIGS. 4A and 4B, a surface 271 (the lower surface) of the second support plate 270 forms the lower surface of the heater plate 200. The first support plate 210 and the second support plate 270 are support plates that support the first and second heater elements 230a and 230b, etc. In the example, the first support plate 210 and the second support plate 270 clamp and support the first resin layer 220, the first heater element 230a, the second resin layer 240, the second heater element 230b, the third resin layer 245, the bypass layer 250, and the fourth resin layer 260.

The first resin layer 220 is provided between the first support plate 210 and the second support plate 270. The first heater element 230a is provided between the first resin layer 220 and the second support plate 270. Thus, the first heater element 230a is provided to overlap the first support plate 210. In other words, the first resin layer 220 is provided between the first support plate 210 and the first heater element 230a.

The second resin layer 240 is provided between the first heater element 230a and the second support plate 270. The second heater element 230b is provided between the second resin layer 240 and the second support plate 270. Thus, the second heater element 230b is provided in a different layer than the layer in which the first heater element 230a is provided. The third resin layer 245 is provided between the second heater element 230b and the second support plate 270. The bypass layer 250 is provided between the third resin layer 245 and the second support plate 270. The fourth resin layer 260 is provided between the bypass layer 250 and the second support plate 270.

In other words, the first heater element 230a is provided between the first resin layer 220 and the second resin layer 240. In other words, the second heater element 230b is provided between the second resin layer 240 and the third resin layer 245. In other words, the bypass layer 250 is provided between the third resin layer 245 and the fourth resin layer 260.

For example, the first heater element 230a contacts the first resin layer 220 and the second resin layer 240. For example, the second heater element 230b contacts the second resin layer 240 and the third resin layer 245. For example, the bypass layer 250 contacts the third resin layer 245 and the fourth resin layer 260.

As illustrated in FIG. 6, the bypass layer 250 and the fourth resin layer 260 may not always be provided. In the case where the bypass layer 250 and the fourth resin layer 260 are not provided, the third resin layer 245 is provided between the second heater element 230b and the second support plate 270. In the description hereinbelow, the case where the heater plate 200 includes the bypass layer 250 and the fourth resin layer 260 is used as an example.

The first support plate 210 has a relatively high thermal conductivity. For example, the thermal conductivity of the first support plate 210 is higher than the thermal conductivity of the first heater element 230a and higher than the thermal conductivity of the second heater element 230b. For example, a metal that includes at least one of aluminum, copper, or nickel, graphite that has a multilayered structure, etc., are examples of the material of the first support plate 210. The thickness (the length in the Z-direction) of the first support plate 210 is, for example, not less than about 0.1 mm and not more than about 3.0 mm. More favorably, the thickness of the first support plate 210 is, for example, not less than about 0.3 mm and not more than about 1.0 mm. The first support plate 210 increases the uniformity of the temperature distribution in the surface of the heater plate 200. The first support plate 210 suppresses the warp of the heater plate 200. The first support plate 210 increases the strength of the bond between the heater plate 200 and the ceramic dielectric substrate 100.

An RF (Radio Frequency) voltage (high frequency voltage) is applied in the processing process of the processing object W. When the high frequency voltage is applied, the first and second heater elements 230a and 230b may generate heat due to the effects of the high frequency waves. Thereby, the temperature controllability of the first and second heater elements 230a and 230b degrades.

Conversely, in the embodiment, the first support plate 210 shields the first heater element 230a, the second heater element 230b, and the bypass layer 250 from the high frequency waves. Thereby, the first support plate 210 can suppress the heat generation of the first and second heater elements 230a and 230b to an abnormal temperature.

The material, thickness, and function of the second support plate 270 are respectively the same as the material, thickness, and function of the first support plate 210. For example, the thermal conductivity of the second support plate 270 is higher than the thermal conductivity of the first heater element 230a and higher than the thermal conductivity of the second heater element 230b. The first support plate 210 is electrically coupled to the second support plate 270. Here, in this specification, contact is within the scope of "coupled." Details of the electrical coupling between the second support plate 270 and the first support plate 210 are described below.

Thus, the first support plate 210 and the second support plate 270 have relatively high thermal conductivities. Thereby, the first support plate 210 and the second support plate 270 improve the thermal diffusion of the heat supplied from the first and second heater elements 230a and 230b. The temperature unevenness in the surface of the processing object W occurring due to the pattern of the first and second heater elements 230a and 230b can be improved by the first support plate 210. The effects of the temperature unevenness in the surface of the base plate 300 on the temperature of the heater plate 200 can be improved by the second support plate 270. In the embodiment, at least one of the first support plate 210 or the second support plate 270 may be omitted.

By providing the first support plate 210 and the second support plate 270 with moderate thicknesses and rigidities, for example, the warp of the heater plate 200 is suppressed. For example, the first support plate 210 and the second support plate 270 improve the shielding performance for the RF voltage applied to the electrodes of the wafer processing apparatus, etc. For example, the effects of the RF voltage on the first and second heater elements 230a and 230b are suppressed. Thus, the first support plate 210 and the second support plate 270 have the function of thermal diffusion, the function of warp suppression, and the function of shielding from the RF voltage.

For example, polyimide, polyamide-imide, etc., are examples of the material of the first resin layer 220. The thickness (the length in the Z-direction) of the first resin layer 220 is, for example, not less than about 0.01 mm and not more than about 0.20 mm. The first resin layer 220 couples the first support plate 210 and the first heater element 230a to each other. The first resin layer 220 electrically insulates between the first support plate 210 and the first heater element 230a. Thus, the first resin layer 220 has the function of electric insulation and the function of surface coupling.

The material and thickness of the second resin layer 240 are respectively about the same as the material and thickness of the first resin layer 220. The material and thickness of the third resin layer 245 are respectively about the same as the material and thickness of the first resin layer 220. The material and thickness of the fourth resin layer 260 are respectively about the same as the material and thickness of the first resin layer 220.

The second resin layer 240 couples the first heater element 230a and the second heater element 230b to each other. The second resin layer 240 electrically insulates between the first heater element 230a and the second heater element 230b. Thus, the second resin layer 240 has the function of electric insulation and the function of surface coupling.

The third resin layer 245 couples the second heater element 230b and the bypass layer 250 to each other. The third resin layer 245 electrically insulates between the second heater element 230b and the bypass layer 250. Thus, the third resin layer 245 has the function of electric insulation and the function of surface coupling.

The fourth resin layer 260 couples the bypass layer 250 and the second support plate 270 to each other. The fourth resin layer 260 electrically insulates between the bypass layer 250 and the second support plate 270. Thus, the fourth resin layer 260 has the function of electric insulation and the function of surface coupling.

For example, a metal that includes at least one of stainless steel, titanium, chrome, nickel, copper, or aluminum or the like is an example of the material of the first heater element 230a. The thickness (the length in the Z-direction) of the first heater element 230a is, for example, not less than about 0.01 mm and not more than about 0.20 mm. The material and thickness of the second heater element 230b are respectively about the same as the material and thickness of the first heater element 230a. The first heater element 230a and the second heater element 230b each are electrically coupled to the bypass layer 250. On the other hand, the first heater element 230a and the second heater element 230b each are electrically insulated from the first support plate 210 and the second support plate 270. The details of the electrical coupling between the first heater element 230a and the bypass layer 250 and the electrical coupling between the second heater element 230b and the bypass layer 250 are described below.

The first heater element 230a and the second heater element 230b each generate heat when a current flows, and control the temperature of the processing object W. For example, the first and second heater elements 230a and 230b heat the processing object W to a prescribed temperature. For example, the first and second heater elements 230a and 230b cause the temperature distribution in the surface of the processing object W to be uniform. For example, the first and second heater elements 230a and 230b deliberately provide a difference of the temperature in the surface of the processing object W.

The bypass layer 250 is disposed to be substantially parallel to the first support plate 210 and disposed to be substantially parallel to the second support plate 270. The bypass layer 250 includes multiple bypass portions 251. The bypass layer 250 includes, for example, eight bypass portions 251. The number of the bypass portions 251 is not limited to eight. The bypass layer 250 has a plate configuration. Conversely, the first heater element 230a includes a first heater electrode 239a having a band configuration; and the second heater element 230b includes a second heater electrode 239b having a band configuration. When viewed perpendicularly to the surface of the bypass layer 250 (surfaces 251a of the bypass portions 251), the surface area of the bypass layer 250 is wider than the surface area of the first heater element 230a (the surface area of the first heater electrode 239a) and wider than the surface area of the second heater element 230b (the surface area of the second heater electrode 239b).

The bypass layer 250 is electrically conductive. The bypass layer 250 is electrically insulated from the first support plate 210 and the second support plate 270. For example, a metal that includes stainless steel or the like is an example of the material of the bypass layer 250. The thickness (the length in the Z-direction) of the bypass layer 250 is, for example, not less than about 0.03 mm and not more than about 0.30 mm. The thickness of the bypass layer 250 is thicker than the thickness of the first resin layer 220. The thickness of the bypass layer 250 is thicker than the thickness of the second resin layer 240. The thickness of the bypass layer 250 is thicker than the thickness of the third resin layer 245. The thickness of the bypass layer 250 is thicker than the thickness of the fourth resin layer 260.

For example, the material of the bypass layer 250 is the same as the material of the first and second heater elements 230a and 230b. On the other hand, the thickness of the bypass layer 250 is thicker than the thickness of the first heater element 230a and thicker than the thickness of the second heater element 230b. Therefore, the electrical resistance of the bypass layer 250 is lower than the electrical resistance of the first heater element 230a and lower than the electrical resistance of the second heater element 230b. Thereby, even in the case where the material of the bypass layer 250 is the same as the material of the first and second heater elements 230a and 230b, the heat generation by the bypass layer 250 becoming such as that of the first and second heater elements 230a and 230b can be suppressed. That is, the electrical resistance of the bypass layer 250 can be suppressed; and the heat generation amount of the bypass layer 250 can be suppressed. The method for suppressing the electrical resistance of the bypass layer 250 and suppressing the heat generation amount of the bypass layer 250 may be realized not by using the thickness of the bypass layer 250 but by using a material having a relatively low volume resistivity. In other words, the material of the bypass layer 250 may be different from the material of the first and second heater elements 230a and 230b. For example, a metal that includes at least one of stainless steel, titanium, chrome, nickel, copper, or aluminum or the like is an example of the material of the bypass layer 250.

The power supply terminal 280 is electrically coupled to the bypass layer 250. The power supply terminal 280 is provided from the heater plate 200 toward the base plate 300 in the state in which the heater plate 200 is provided between the base plate 300 and the ceramic dielectric substrate 100. The power supply terminal 280 supplies, via the bypass layer 250 to the first heater element 230a and the second heater element 230b, electrical power supplied from outside the electrostatic chuck 10. For example, the power supply terminal 280 may be connected directly to the first heater element 230a and the second heater element 230b. Thereby, the bypass layer 250 is omissible.

The heater plate 200 includes the multiple power supply terminals 280. The heater plate 200 illustrated in FIG. 3 to FIG. 5 includes eight power supply terminals 280. The number of the power supply terminals 280 is not limited to eight. One power supply terminal 280 is electrically coupled to one bypass portion 251. Holes 273 pierce the second support plate 270. The power supply terminals 280 are electrically coupled to the bypass portions 251 by passing through the holes 273.

As illustrated by arrow C1 and arrow C2 illustrated in FIG. 5, when the electrical power is supplied to the power supply terminals 280 from outside the electrostatic chuck 10, the current flows from the power supply terminals 280 toward the bypass layer 250. As illustrated by arrow C3 and arrow C4 illustrated in FIG. 5, the current that flows toward the bypass layer 250 flows from the bypass layer 250 toward the first heater element 230a. As illustrated by arrow C5 and arrow C6 illustrated in FIG. 5, the current that flows toward the first heater element 230a flows through a prescribed zone (region) of the first heater element 230a and flows from the first heater element 230a toward the bypass layer 250. The details of the zone (the first heater region) of the first heater element 230a are described below. As illustrated by arrow C7 and arrow C8 illustrated in FIG. 5, the current that flows toward the bypass layer 250 flows from the bypass layer 250 toward the power supply terminals 280. As illustrated by arrow C9 illustrated in FIG. 5, the current that flows toward the power supply terminals 280 flows outside the electrostatic chuck 10.

Similarly, as illustrated by arrow C11 and arrow C12, when the electrical power is supplied to the power supply terminals 280 from outside the electrostatic chuck 10, the current flows from the power supply terminals 280 toward the bypass layer 250. As illustrated by arrow C13 and arrow C14 illustrated in FIG. 5, the current that flows toward the bypass layer 250 flows from the bypass layer 250 toward the second heater element 230b. As illustrated by arrow C15 and arrow C16 illustrated in FIG. 5, the current that flows toward the second heater element 230b flows through the prescribed zone (region) of the second heater element 230b and flows from the second heater element 230b toward the bypass layer 250. The details of the zones (the second heater regions) of the second heater element 230b are described below. As illustrated by arrow C17 and arrow C18 illustrated in FIG. 5, the current that flows toward the bypass layer 250 flows from the bypass layer 250 toward the power supply terminals 280. As illustrated by arrow C19 illustrated in FIG. 5, the current that flows toward the power supply terminals 280 flows outside the electrostatic chuck 10.

Thus, in the coupling portions between the first heater element 230a and the bypass layer 250, a portion Ain where the current enters the first heater element 230a exists; and a portion Aout where the current exits from the first heater element 230a exists. That is, a pair of coupling portions between the first heater element 230a and the bypass layer 250 exists.

Similarly, in the coupling portions between the second heater element 230b and the bypass layer 250, a portion Bin where the current enters the second heater element 230b exists; and a portion Bout where the current exits from the second heater element 230b exists. That is, a pair of coupling portions between the second heater element 230b and the bypass layer 250 exists.

The heater plate 200 illustrated in FIG. 3 to FIG. 5 includes eight power supply terminals 280. In the example, the total of the number of pairs of coupling portions between the first heater element 230a and the bypass layer 250 and the number of pairs of coupling portions between the second heater element 230b and the bypass layer 250 is four. For example, the current that flows in the first heater element 230a and the current that flows in the second heater element 230b are controlled separately. However, common bypass portions 251 may be used as the bypass portions 251 connected to the first heater element 230a and the bypass portions 251 connected to the second heater element 230b as appropriate.

For example, the thermal conductivity of the material of the bypass layer 250 is lower than the thermal conductivity of the second support plate 270. The bypass layer 250 suppresses the transfer into the second support plate 270 of the heat supplied from the first and second heater elements 230a and 230b. That is, the bypass layer 250 has a thermal insulation effect for the second support plate 270 side when viewed from the bypass layer 250; and the uniformity of the temperature distribution in the surface of the processing object W can be increased.

The periphery of the power supply terminal 280 easily becomes a singularity of the temperature (a point where the temperature is relatively much different from that of the surrounding region). Conversely, by providing the bypass layer 250, the degrees of freedom of the arrangement of the power supply terminals 280 can be increased. For example, the power supply terminals that easily become singularities of the temperature can be arranged to be dispersed; and the heat is easily diffused at the peripheries of the singularities. Thereby, the uniformity of the temperature distribution in the surface of the processing object W can be increased.

By providing the bypass layer 250, the power supply terminals that have large thermal capacities may not be directly coupled to the first and second heater elements 230a and 230b. Thereby, the uniformity of the temperature distribution in the surface of the processing object W can be increased. Also, by providing the bypass layer 250, the power supply terminals 280 may not be coupled to the relatively thin heater elements (230a and 230b). Thereby, the reliability of the heater plate 200 can be increased.

As described above, the power supply terminal 280 is provided from the heater plate 200 toward the base plate 300. Therefore, the electrical power can be supplied to the power supply terminal 280 via a member called a socket, etc., from a lower surface 303 (referring to FIG. 2A and FIG. 2B) side of the base plate 300. Thereby, the wiring of the heater is realized while suppressing the exposure of the power supply terminal 280 inside the chamber where the electrostatic chuck 10 is placed.

Figure 7A:
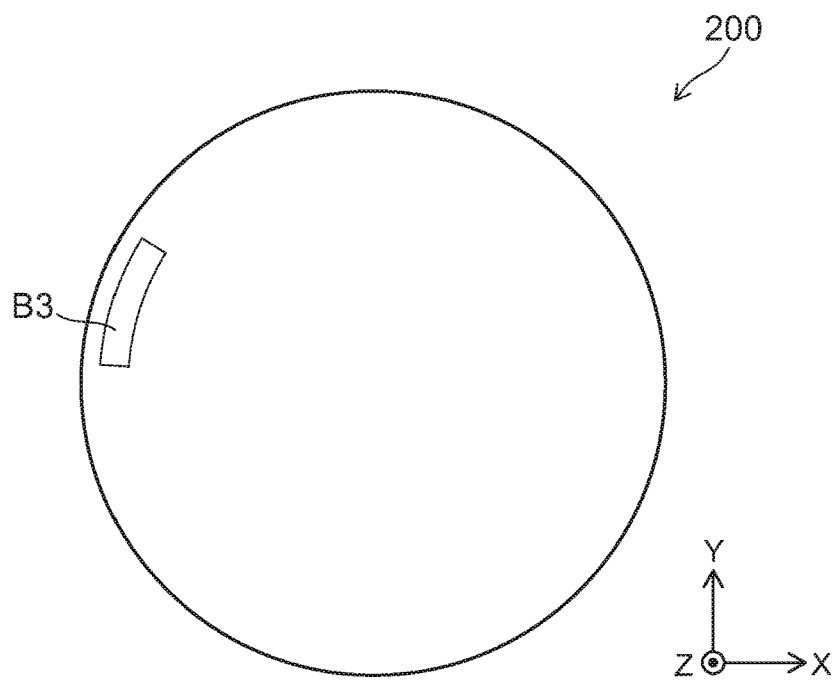
FIG. 7A and FIG. 7B are schematic plan views illustrating the heater plate according to the embodiment.
Figure 7B:
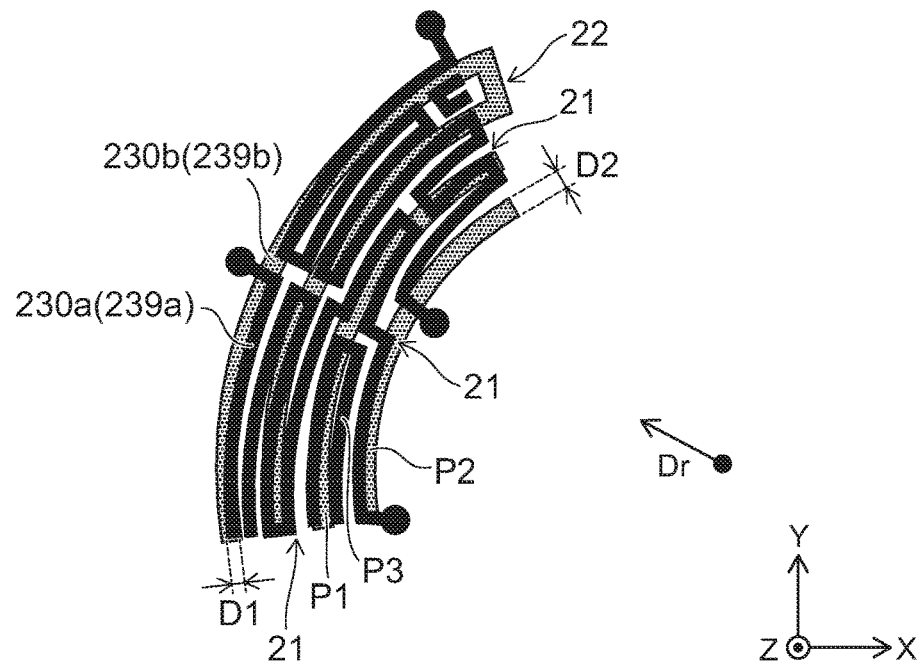

FIG. 7A and FIG. 7B are schematic plan views illustrating the heater plate according to the embodiment. FIG. 7B is an enlarged schematic view of region B3 shown in FIG. 7A and displays only the first heater element 230a and the second heater element 230b.

As illustrated in FIG. 7B, the first heater element 230a overlaps the second heater element 230b. The pattern of the planar configuration of the first heater element 230a is different from the pattern of the planar configuration of the second heater element 230b. A width D1 of the first heater electrode 239a having the band configuration of the first heater element 230a is narrower than a width D2 of the second heater electrode 239b having the band configuration of the second heater element 230b. The width D1 is, for example, not less than 0.1 mm and not more than 2 mm. The width D2 is, for example, not less than 0.5 mm and not more than 3 mm. The width of the first heater electrode 239a having the band configuration and the width of the second heater electrode 239b having the band configuration may not always be constant in the plane. In such a case, the average value of the width of the first heater electrode 239a in the plane (e.g., inside a first heater region R1 described below) may be set to the width D1 described above. Similarly, the average value of the width of the second heater electrode 239*b* in the plane (e.g., inside a second heater region R2 described below) may be set to the width D2 described above.

When viewed along the Z-direction as in FIG. 7B, the first heater element 230*a* (the first heater electrode 239*a*) includes bent portions 21. When viewed along the Z-direction, the second heater element 230*b* (the second heater electrode 239*b*) includes bent portions 22. The number of the bent portions 21 of the first heater element 230*a* is more than the number of the bent portions 22 of the second heater element 230*b*.

A "bent portion (bend)" refers to a portion where a direction in which the heater element extends (a direction in which the current flows) changes from a first direction to a second direction different from the first direction. The direction in which the heater element extends may not change discontinuously at the bent portion. In other words, the outer perimeter of the bent portion may be a configuration having rounded corners. As an example, when viewed along the Z-direction, a portion within the range of about 10 mm square where the direction in which the heater element extends changes 60 degrees or more can be taken as a "bent portion."

For example, the length of the first heater element 230*a* (the first heater electrode 239*a*) is longer than the length of the second heater element 230*b* (the second heater electrode 239*b*).

The length of the first heater element 230*a* is the length of the path in which the current flows from the portion Ain where the current enters the first heater element 230*a* to the portion Aout where the current exits from the first heater element 230*a*. In other words, the length of the first heater element 230*a* is the length of the path of the current shown by arrow C5 of FIG. 5.

Similarly, the length of the second heater element 230*b* is the length of the path in which the current flows from the portion Bin where the current enters the second heater element 230*b* to the portion Bout where the current exits from the second heater element 230*b*. In other words, the length of the second heater element 230*b* is the length of the path of the current shown by arrow C15 of FIG. 5.

The electrical resistance of the first heater element 230*a* (the first heater electrode 239*a*) is higher than the electrical resistance of the second heater element 230*b* (the second heater electrode 239*b*). Thereby, the output (the heat generation amount or the power consumption) of the first heater element 230*a* can be set to be lower than the output (the heat generation amount or the power consumption) of the second heater element 230*b*. In other words, the first heater element 230*a* is a low-output heater; and the second heater element 230*b* is a high-output heater.

The electrical resistance of the first heater element 230*a* is the electrical resistance between the portion Ain where the current enters the first heater element 230*a* and the portion Aout where the current exits from the first heater element 230*a*. In other words, the electrical resistance of the first heater element 230*a* is the electrical resistance of the path shown by arrow C5 of FIG. 5.

Similarly, the electrical resistance of the second heater element 230*b* is the electrical resistance between the portion Bin where the current enters the second heater element 230*b* and the portion Bout where the current exits from the second heater element 230*b*. In other words, the electrical resistance of the second heater element 230*b* is the electrical resistance of the path shown by arrow C15 of FIG. 5.

The method for setting the electrical resistance of the first heater element 230*a* to be relatively high is not limited to using the first heater electrode 239*a* that is long and has a narrow width. For example, a material that has a relatively high volume resistivity may be used as the first heater electrode 239*a*; or the thickness of the first heater electrode 239*a* may be set to be relatively thin.

When viewed along the Z-direction, the first heater element 230*a* includes a portion positioned at a gap of the second heater element 230*b*. For example, in the example shown in FIG. 7B, the second heater element 230*b* includes portions P1 and P2 that are adjacent to each other in a diametrical direction Dr of the heater plate 200. When viewed along the Z-direction, the first heater element 230*a* includes a portion P3 positioned between the portion P1 and the portion P2. When viewed along the Z-direction, the portion P3 does not overlap the second heater element 230*b*.

In the case where the first heater element 230*a* is not provided, the temperature of the processing object W easily becomes relatively high directly above the pattern of the second heater element 230*b*; and the temperature of the processing object becomes relatively low directly above the portions where the pattern of the second heater element 230*b* is not provided. In other words, a temperature unevenness that corresponds to the pattern of the second heater element 230*b* occurs in the processing object.

Conversely, in the embodiment, the bends of the first heater element 230*a* are more than the bends of the second heater element 230*b*; and the first heater element 230*a* that is disposed at the gap of the second heater element 230*b* is provided. Thereby, the portions of the processing object W that are difficult to heat by the second heater element 230*b* can be heated by the first heater element 230*a*. In other words, the temperature unevenness in the surface of the processing object W occurring due to the pattern of the second heater element 230*b* can be suppressed by the first heater element 230*a*. Accordingly, the uniformity of the temperature distribution in the surface of the processing object W can be increased.

Calculation results of the temperature distribution in the case where the first and second heater elements 230*a* and 230*b* are provided will now be described with reference to FIG. 8A to FIG. 10.

FIG. 8A to FIG. 8C and FIG. 9A to FIG. 9C are schematic views illustrating the model used in the calculations.

Figure 8A:
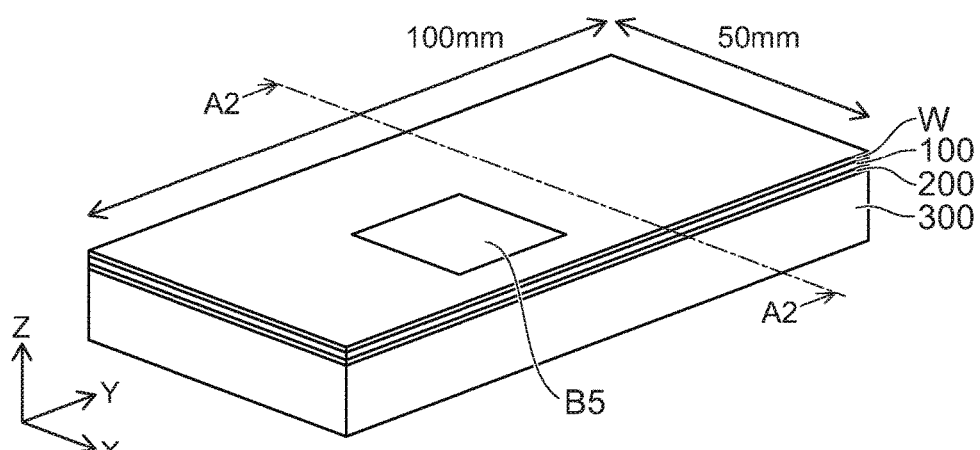
FIG. 8A to FIG. 8C are schematic views illustrating the model used in the calculations.
Figure 8B:
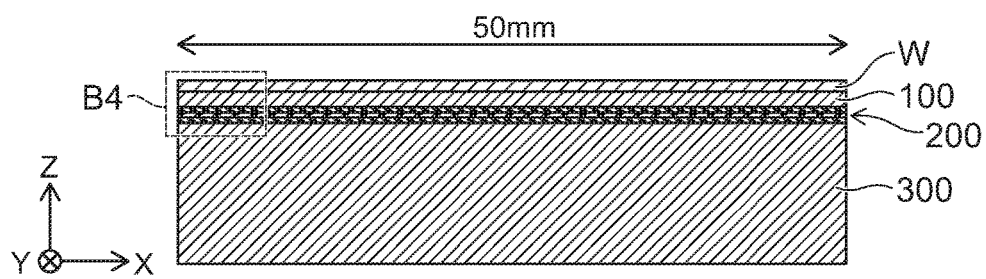
Figure 8C:
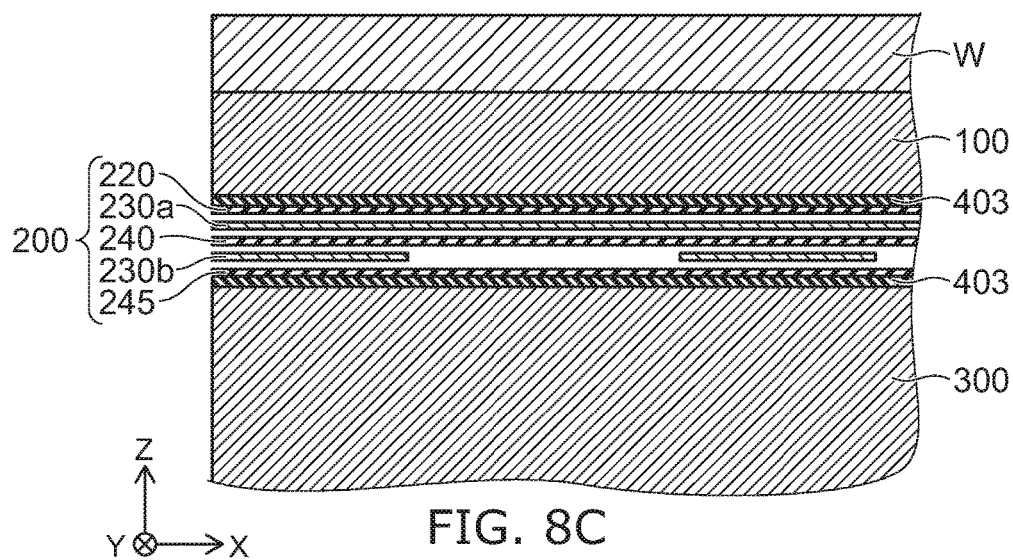

FIG. 8A is a perspective view of the model of the electrostatic chuck used in the calculations. The calculations were performed for a region having a rectangular parallelepiped configuration of 50 mm×100 mm. FIG. 8B is a schematic cross-sectional view of an A2-A2 cross section shown in FIG. 8A. FIG. 8C is an enlarged schematic view of region B4 shown in FIG. 8B.

For better understanding in FIG. 8C, gaps are shown for convenience between the resin layers on and under the first heater element 230*a* and between the resin layers on and under the second heater element 230*b*. However, in the model used in the calculations, the first and second heater elements 230*a* and 230*b* each contact the resin layers above and below.

Figure 9A:
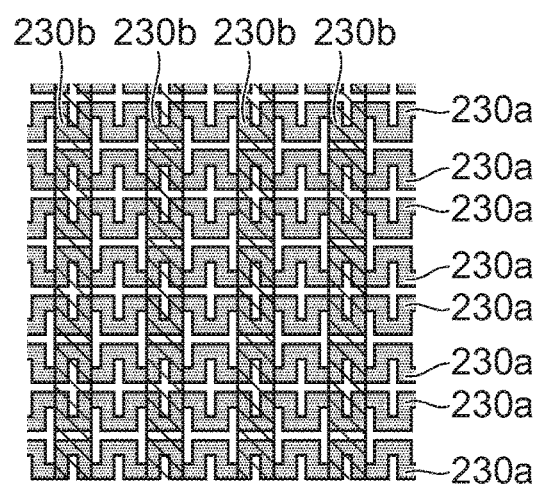
FIG. 9A to FIG. 9C are schematic views illustrating the model used in the calculations.

FIG. 9A is a plan view when the first heater element 230*a* and the second heater element 230*b* are viewed along the Z-direction. FIG. 9A corresponds to region B5 shown in FIG. 8A.

Figure 9B:
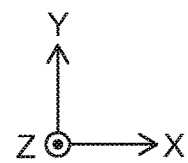
Figure 9B:
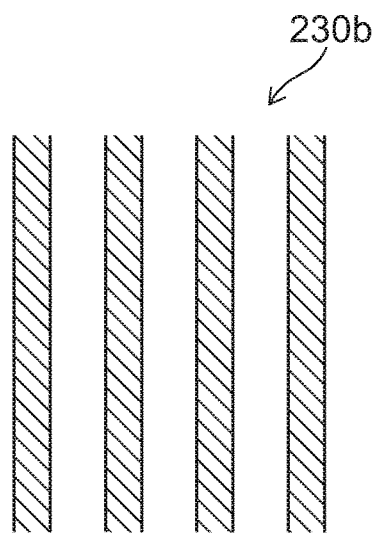
Figure 9C:
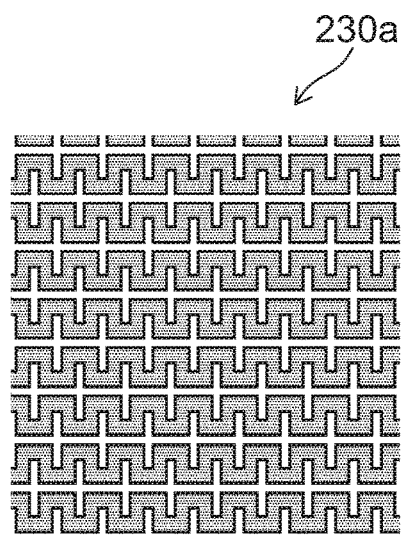

FIG. 9B shows only the pattern of the second heater element 230*b* of FIG. 9A. FIG. 9C shows only the pattern of the first heater element 230a of FIG. 9A. In other words, FIG. 9A is a drawing in which FIG. 9B and FIG. 9C are overlaid.

As illustrated in FIG. 9A to FIG. 9C, the bends of the first heater element 230a are more than the bends of the second heater element 230b. The first heater element 230a includes a portion positioned at a gap of the second heater element 230b. As illustrated in FIG. 9B, bends may not be provided in the second heater element 230b.

Figure 10:
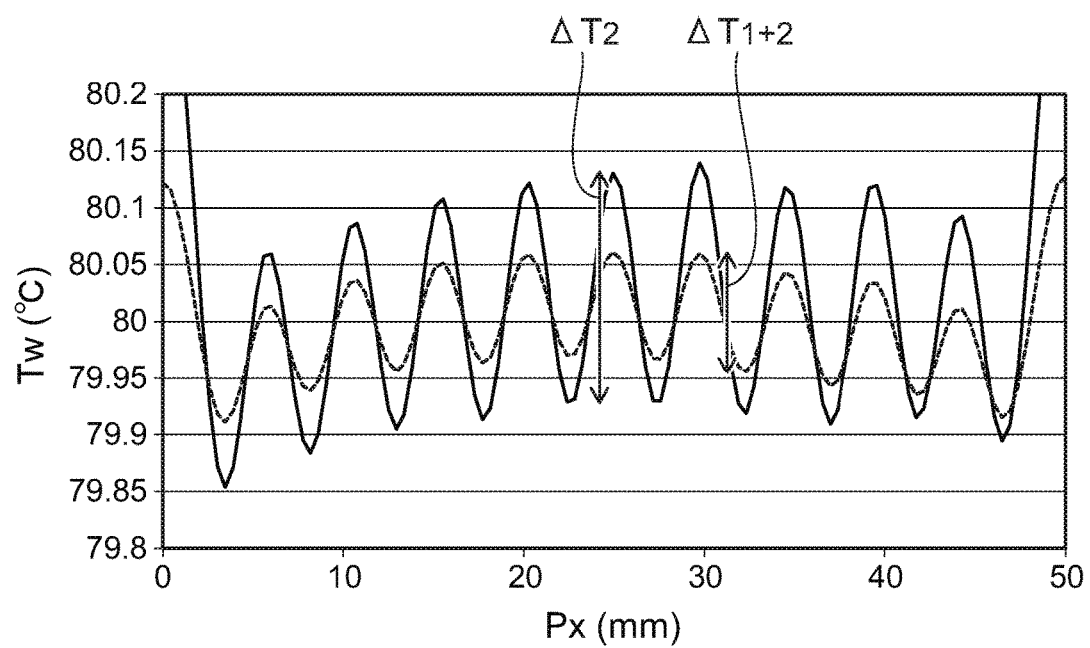
FIG. 10 is a graph showing the calculation results of the temperature distribution of the processing object.

FIG. 10 is a graph showing the calculation results of the temperature distribution of the processing object W of the model described above.

The horizontal axis of FIG. 10 is a position Px (mm) in the Y-direction of the cross section shown in FIG. 8B; and the vertical axis of FIG. 10 is a temperature Tw (° C.) of the processing object W. The solid line of FIG. 10 illustrates the temperature distribution of the processing object W in the case where only the second heater element 230b is used. The broken line of FIG. 10 illustrates the temperature distribution of the processing object W in the case where both the first heater element 230a and the second heater element 230b are used.

In the case where only the second heater element 230b is used, a magnitude $\Delta T_2$ of the temperature unevenness (the unevenness of the temperature) of the processing object W is about 0.2° C. Conversely, in the case where the first heater element 230a and the second heater element 230b are used, a magnitude $\backslash T_{1+2}$ of the temperature unevenness of the processing object W is reduced about 0.1° C.

A method for manufacturing the heater plate 200 of the embodiment will now be described with reference to the drawings.

Figure 11A:
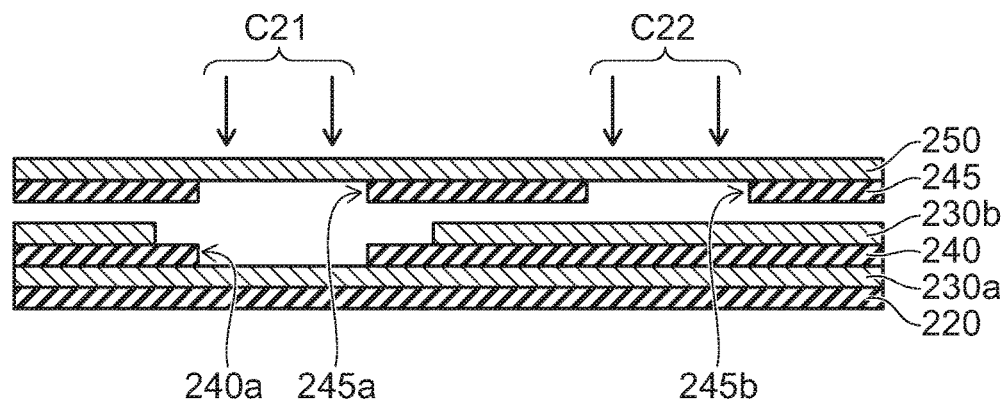
FIG. 11A and FIG. 11B are schematic cross-sectional views illustrating an example of the manufacturing method according to the embodiment.
Figure 11B:
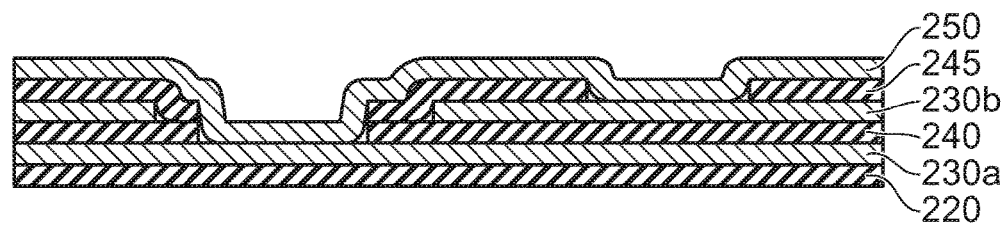

FIG. 11A and FIG. 11B are schematic cross-sectional views illustrating an example of the manufacturing method according to the embodiment.

Figure 12:
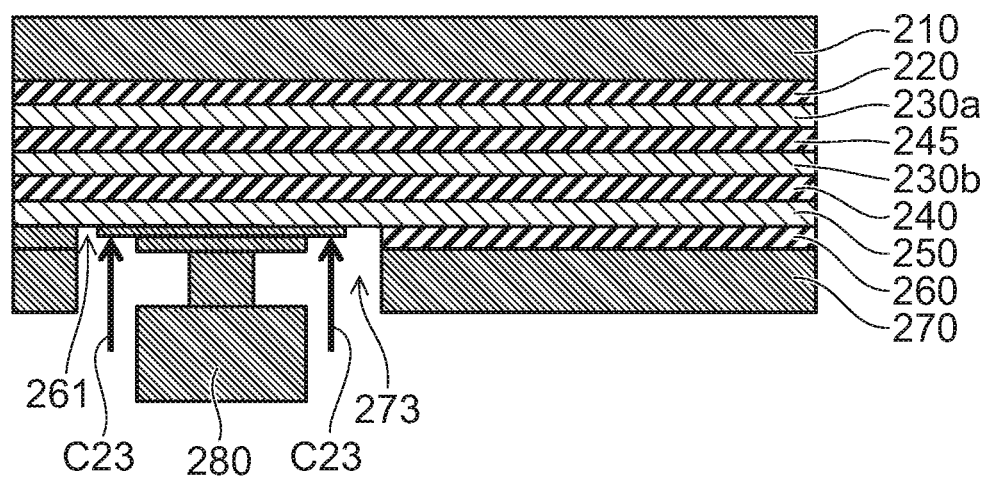
FIG. 12 is a schematic cross-sectional view illustrating another example of the manufacturing method according to the embodiment.

FIG. 12 is a schematic cross-sectional view illustrating another example of the manufacturing method according to the embodiment.

FIG. 11A is a schematic cross-sectional view illustrating the state before coupling the bypass layer and the heater elements. FIG. 11B is a schematic cross-sectional view illustrating the state after coupling the bypass layer and the heater elements. FIG. 12 is a schematic cross-sectional view illustrating an example of the coupling process between the bypass layer and the power supply terminal.

First, in the method for manufacturing the electrostatic chuck 10 according to the embodiment, for example, the first support plate 210 and the second support plate 270 are manufactured by performing machining of aluminum. For example, an inspection of the first support plate 210 and the second support plate 270 is performed using a three-dimensional measuring instrument, etc.

Then, for example, the first resin layer 220, the second resin layer 240, the third resin layer 245, and the fourth resin layer 260 are manufactured by cutting a polyimide film by using a laser, machining, punching, dissolving, etc. For example, an inspection of the first resin layer 220, the second resin layer 240, the third resin layer 245, and the fourth resin layer 260 is performed by naked eye, etc.

Then, the heater patterns are formed by cutting stainless steel by punching, machining, etching utilizing photolithography technology and/or printing technology, etc. Thereby, the first and second heater elements 230a and 230b are manufactured. Measurements of the resistance values of the first and second heater elements 230a and 230b, etc., are performed.

Continuing as illustrated in FIG. 11A and FIG. 11B, the coupling between the first heater element 230a and the bypass layer 250 and the coupling between the second heater element 230b and the bypass layer 250 are performed. The coupling is performed by soldering, brazing, welding, contacting, etc. As illustrated in FIG. 11A, a hole 240a is provided in the second resin layer 240. The hole 240a pierces the second resin layer 240. A hole 245a and a hole 245b are provided in the third resin layer 245. The hole 245a and the hole 245b each pierce the third resin layer 245. For example, spot welding is performed from the bypass layer 250 side as illustrated by arrows C21 and C22 illustrated in FIG. 11A. Thereby, the first heater element 230a and the bypass layer 250 are coupled; and the second heater element 230b and the bypass layer 250 are coupled.

The coupling between the first heater element 230a and the bypass layer 250 and the coupling between the second heater element 230b and the bypass layer 250 are not limited to welding. For example, coupling utilizing laser light, soldering, brazing, contacting, etc., may be performed.

Continuing, the members of the heater plate 200 are stacked and pressed using a hot pressing machine. By the processes recited above, for example, an unevenness is formed in the members of the heater plate 200. In the example shown in FIG. 11B, an unevenness is formed in the bypass layer 250 and the third resin layer 245. An unevenness may be formed in the first support plate 210, the first resin layer 220, the first heater element 230a, the second resin layer 240, the second heater element 230b, and the second support plate 270 as well.

Continuing as illustrated in FIG. 12, the coupling between the power supply terminal 280 and the bypass layer 250 is performed. The coupling between the power supply terminal 280 and the bypass layer 250 is performed by welding, laser, soldering, brazing, etc. As illustrated in FIG. 12, the hole 273 is provided in the second support plate 270. The hole 273 pierces the second support plate 270. This is as described above in reference to FIG. 4B. A hole 261 is provided in the fourth resin layer 260. The hole 261 pierces the fourth resin layer 260. As illustrated by arrow C23 illustrated in FIG. 12, the power supply terminal 280 and the bypass layer 250 are coupled by performing welding, laser, soldering, brazing, etc., from the second support plate 270 toward the first support plate 210.

Thus, the heater plate 200 of the embodiment is manufactured.

An inspection of the heater plate 200 is appropriately performed after the manufacturing, etc.

Figure 13:
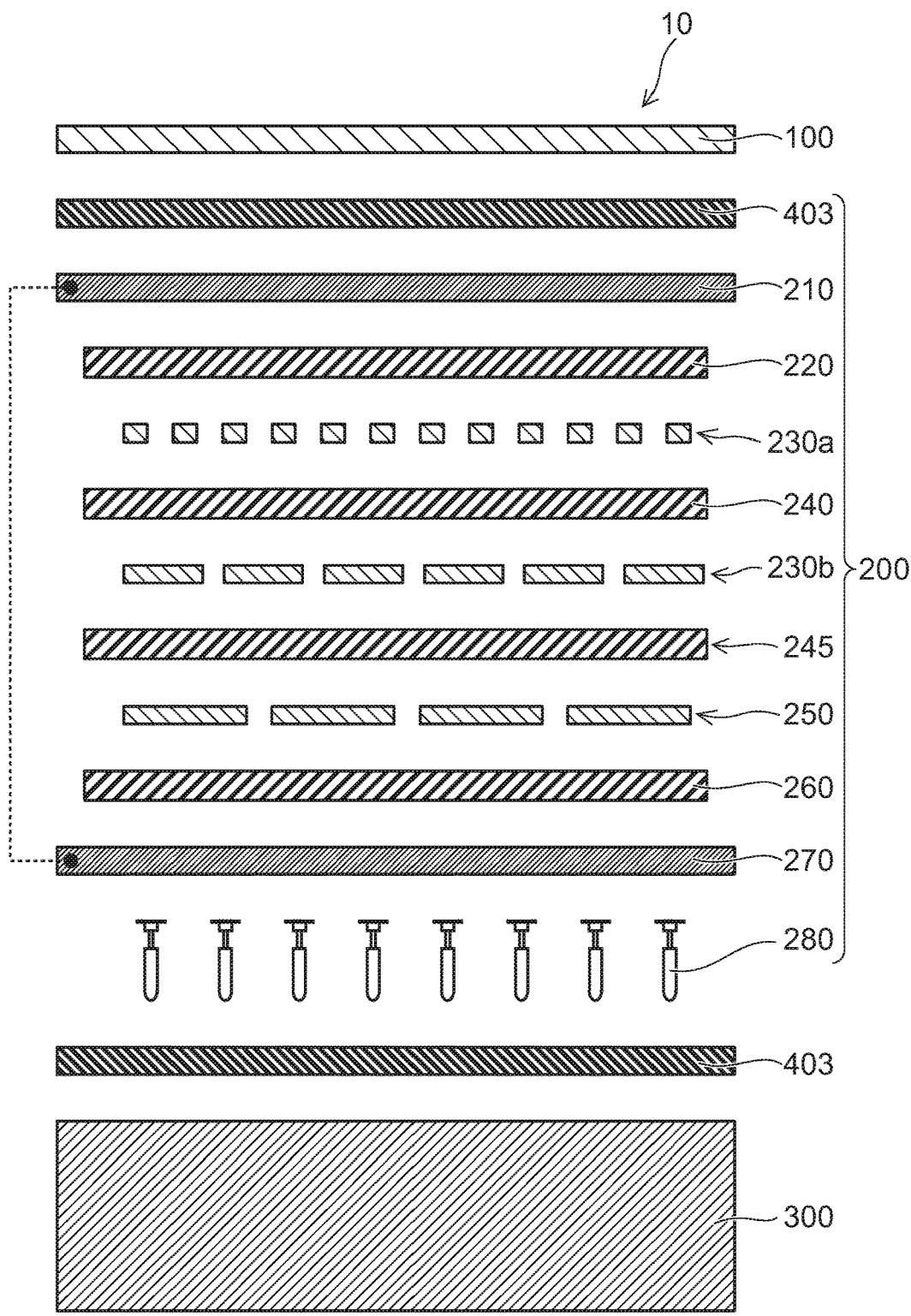
FIG. 13 is a schematic exploded view illustrating the electrostatic chuck according to the embodiment.

FIG. 13 is a schematic exploded view illustrating the electrostatic chuck according to the embodiment.

As illustrated in FIG. 13, the first support plate 210 is electrically coupled to the second support plate 270. The coupling between the first support plate 210 and the second support plate 270 is performed by, for example, welding, coupling utilizing laser light, soldering contacting, etc.

For example, if the first support plate 210 is not electrically coupled reliably to the second support plate 270, fluctuation of the etching rate may occur when the plasma is generated. Even if the first support plate 210 is not electrically coupled to the second support plate 270, when the plasma is generated, currents may flow in the first heater element 230a and the second heater element 230b; and the first heater element 230a and the second heater element 230b may generate heat. In other words, if the first support plate 210 is not electrically coupled reliably to the second support plate 270, the first heater element 230a and the second heater element 230b may generate heat due to a current other than the heater current.

Conversely, in the electrostatic chuck 10 according to the embodiment, the first support plate 210 is electrically coupled to the second support plate 270. Thereby, the occurrence of the fluctuation of the etching rate when the plasma is generated due to the current flowing from the first support plate 210 toward the second support plate 270 or the current flowing from the second support plate 270 toward the first support plate 210 can be suppressed. The heat generation of the first and second heater elements 230a and 230b due to a current other than the heater current can be suppressed.

The first and second heater elements 230a and 230b and the bypass layer 250 can be shielded from the high frequency waves. Thereby, the heat generation of the first and second heater elements 230a and 230b to an abnormal temperature can be suppressed. The impedance of the heater plate 200 can be suppressed.

Specific examples of the heater plate 200 of the embodiment will now be described with reference to the drawings.

Figure 14A:
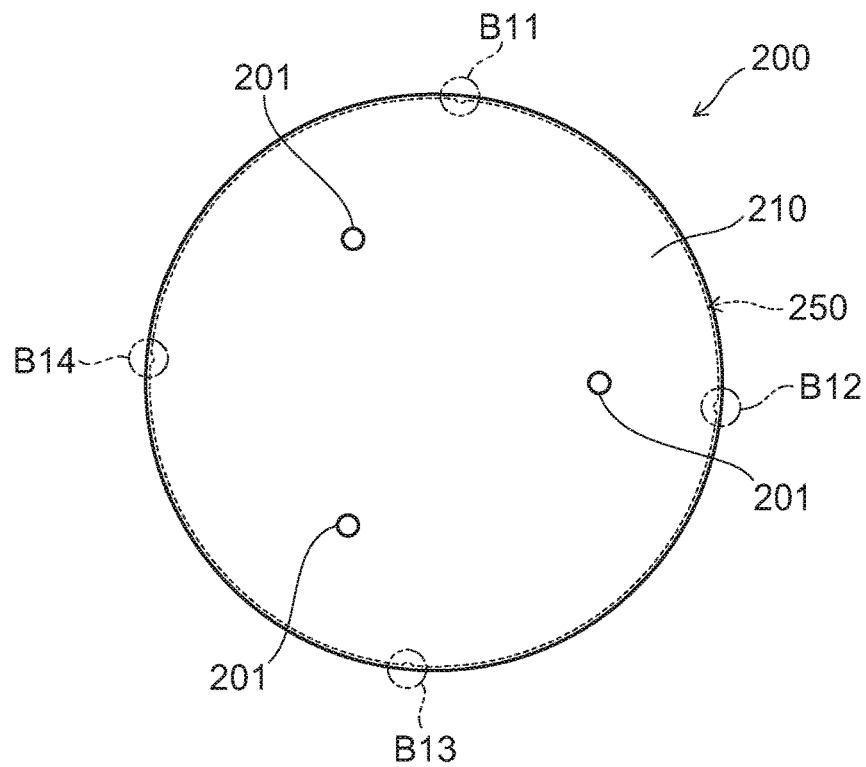
FIG. 14A and FIG. 14B are schematic plan views illustrating the heater plate according to the embodiment.
Figure 14B:
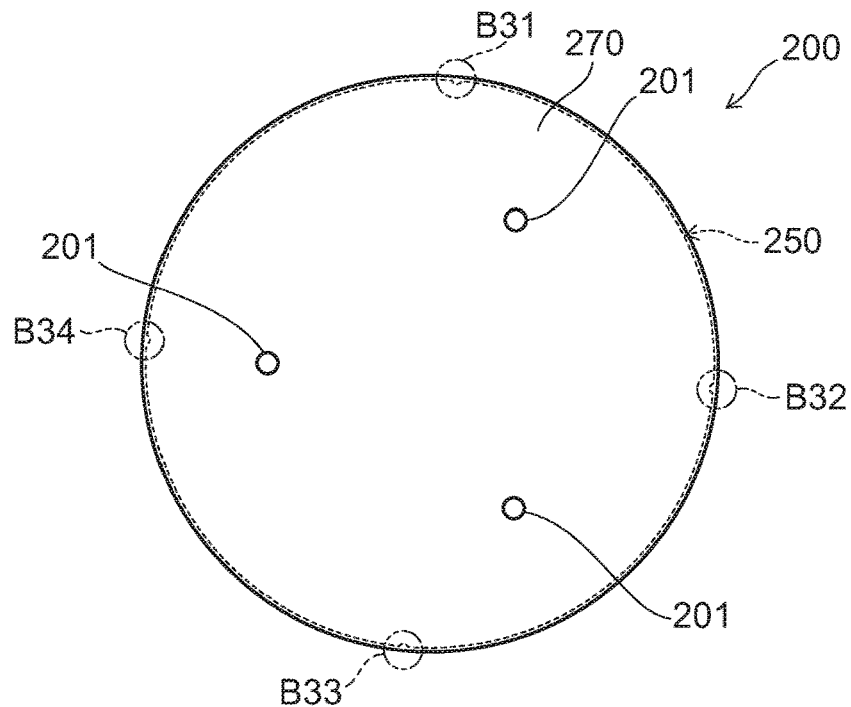

FIG. 14A and FIG. 14B are schematic plan views illustrating the heater plate according to the embodiment. FIG. 14A illustrates the heater plate viewed from the upper surface; and FIG. 14B shows the heater plate viewed from the lower surface.

As illustrated in FIG. 14A and FIG. 14B, the first support plate 210 is electrically coupled to the second support plate 270 in regions B11 to B14 and regions B31 to B34. The regions B11 to B14 correspond respectively to the regions B31 to B34. That is, in the example, the first support plate 210 is electrically coupled to the second support plate 270 in four regions and is not electrically coupled to the second support plate 270 in eight regions.

The heater plate 200 has lift pin holes 201. In the example illustrated in FIG. 14A and FIG. 14B, the heater plate 200 has three lift pin holes 201. The number of the lift pin holes 201 is not limited to three.

Figure 15A:
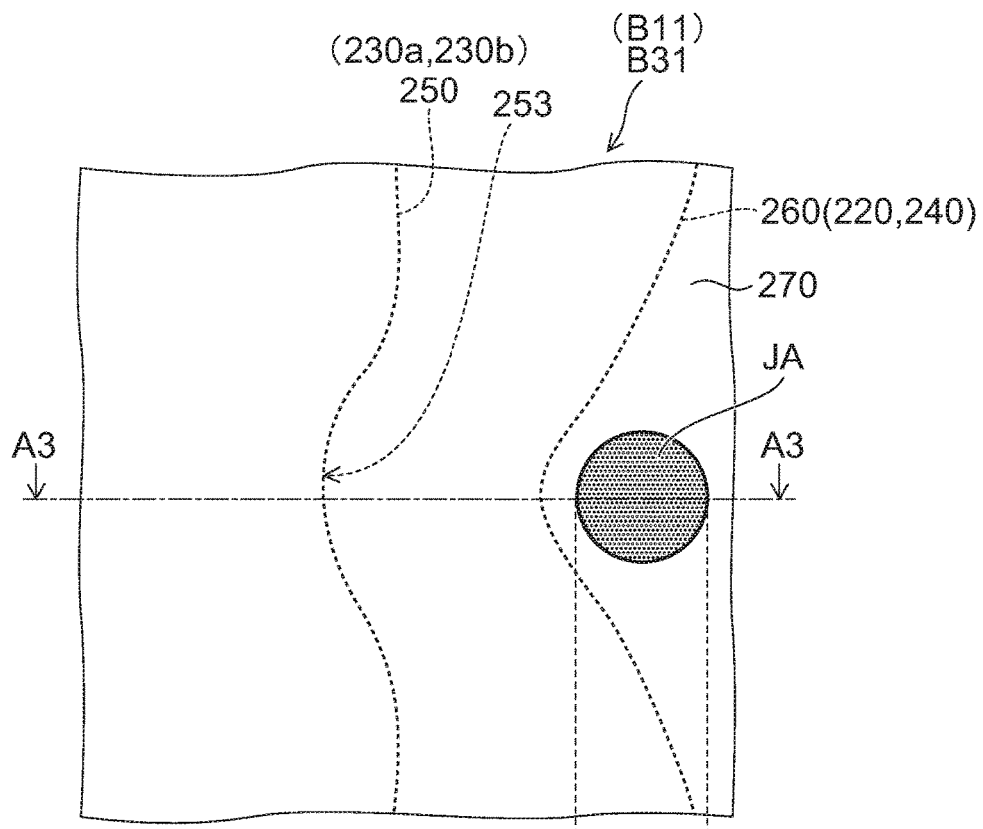
FIG. 15A and FIG. 15B are enlarged schematic views of a portion of the heater plate according to the embodiment.
Figure 15B:
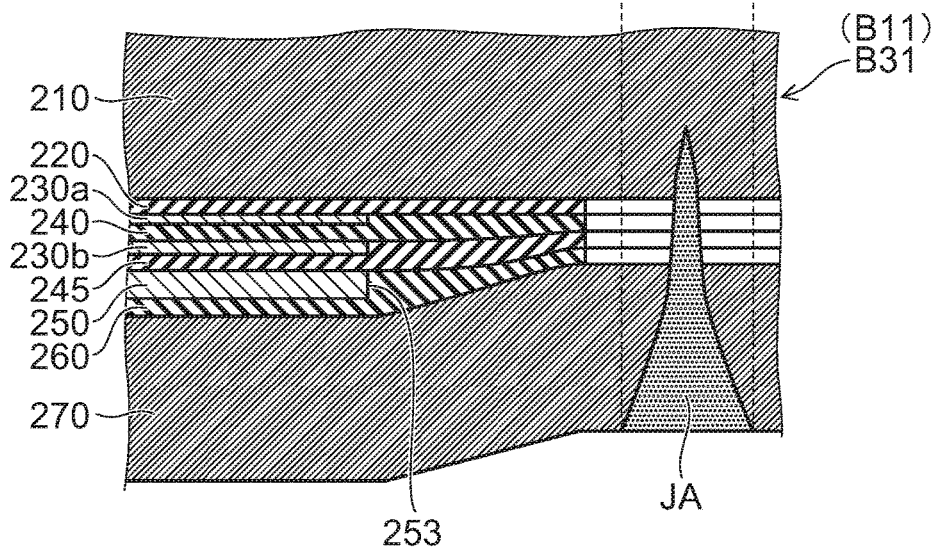

FIG. 15A and FIG. 15B are enlarged schematic views of a portion of the heater plate according to the embodiment.

FIG. 15A and FIG. 15B illustrate an example of a region B31 (a region B11). FIG. 15A is a schematic plan view of the region B31; and FIG. 15B is a schematic cross-sectional view of the region B31. FIG. 15B schematically illustrates an A3-A3 cross section of FIG. 15A. The other regions B12 to B14 and regions B32 to B34 are similar to the regions B11 and B31; and a detailed description is therefore omitted.

As illustrated in FIG. 15A and FIG. 15B, a coupling region JA is provided in the region B31. The coupling region JA couples the first support plate 210 and the second support plate 270 to each other. The coupling region JA is provided at the outer edges of the first support plate 210 and the second support plate 270. The coupling region JA is formed by, for example, laser welding from the second support plate 270 side. Thereby, the coupling region JA is formed in a spot configuration. The coupling region JA may be formed from the first support plate 210 side. The method for forming the coupling region JA is not limited to laser welding and may be another method. The configuration of the coupling region JA is not limited to a spot configuration and may be an elliptical configuration, a semicircular configuration, a polygonal configuration, etc.

The surface area of the coupling region JA where the first support plate 210 is coupled to the second support plate 270 is narrower than the surface area of the surface 211 of the first support plate 210 (referring to FIG. 3). The surface area of the coupling region JA is narrower than the surface area difference of the surface area of the first heater element 230a subtracted from the surface area of the surface 211. In other words, the surface area of the coupling region JA is narrower than the surface area of the region of the first support plate 210 not overlapping the first heater element 230a when projected onto a plane parallel to the surface 211. The surface area of the coupling region JA is narrower than the surface area difference of the surface area of the second heater element 230b subtracted from the surface area of the surface 211. In other words, the surface area of the coupling region JA is narrower than the surface area of the region of the first support plate 210 not overlapping the second heater element 230b when projected onto a plane parallel to the surface 211. The surface area of the coupling region JA where the first support plate 210 is coupled to the second support plate 270 is narrower than the surface area of the surface 271 of the second support plate 270 (referring to FIG. 4A). The surface area of the coupling region JA is narrower than the surface area difference of the surface area of the first heater element 230a subtracted from the surface area of the surface 271. In other words, the surface area of the coupling region JA is narrower than the surface area of the region of the second support plate 270 not overlapping the first heater element 230a when projected onto a plane parallel to the surface 271. The surface area of the coupling region JA is narrower than the surface area difference of the surface area of the second heater element 230b subtracted from the surface area of the surface 271. In other words, the surface area of the coupling region JA is narrower than the surface area of the region of the second support plate 270 not overlapping the second heater element 230b when projected onto a plane parallel to the surface 271.

The diameter of the coupling region JA formed in the spot configuration is, for example, 1 mm (not less than 0.5 mm and not more than 3 mm). On the other hand, the diameter of the first support plate 210 and the second support plate 270 is, for example, 300 mm. The diameter of the first support plate 210 and the second support plate 270 is set according to the processing object W to be held. Thus, the surface area of the coupling region JA is sufficiently small compared to the surface area of the surface 211 of the first support plate 210 and the surface area of the surface 271 of the second support plate 270. The surface area of the coupling region JA is, for example, not more than 1/5000 of the surface area of the surface 211 (the surface area of the surface 271). Here, more specifically, the surface area of the coupling region JA is the surface area when projected onto a plane parallel to the surface 211 of the first support plate 210. In other words, the surface area of the coupling region JA is the surface area when viewed in the top view.

In the example, four coupling regions JA that correspond to the regions B11 to B14 and the regions B31 to B34 are provided. The number of the coupling regions JA is not limited to four. The number of the coupling regions JA may be any number. For example, twelve coupling regions JA may be provided in the first support plate 210 and the second support plate 270 every 30°. The configuration of the coupling region JA is not limited to a spot configuration. The configuration of the coupling region JA may be an elliptical configuration, a polygonal configuration, a line configuration, etc. For example, the coupling region JA may be formed in a ring configuration along the outer edge of the first support plate 210 and the second support plate 270.

The second support plate 270 has the hole 273 (referring to FIG. 4B and FIG. 12). On the other hand, the first support plate 210 does not have a hole where the power supply terminal 280 passes through. Therefore, the surface area of the surface 211 of the first support plate 210 is greater than the surface area of the surface 271 of the second support plate 270.

Figure 16A:
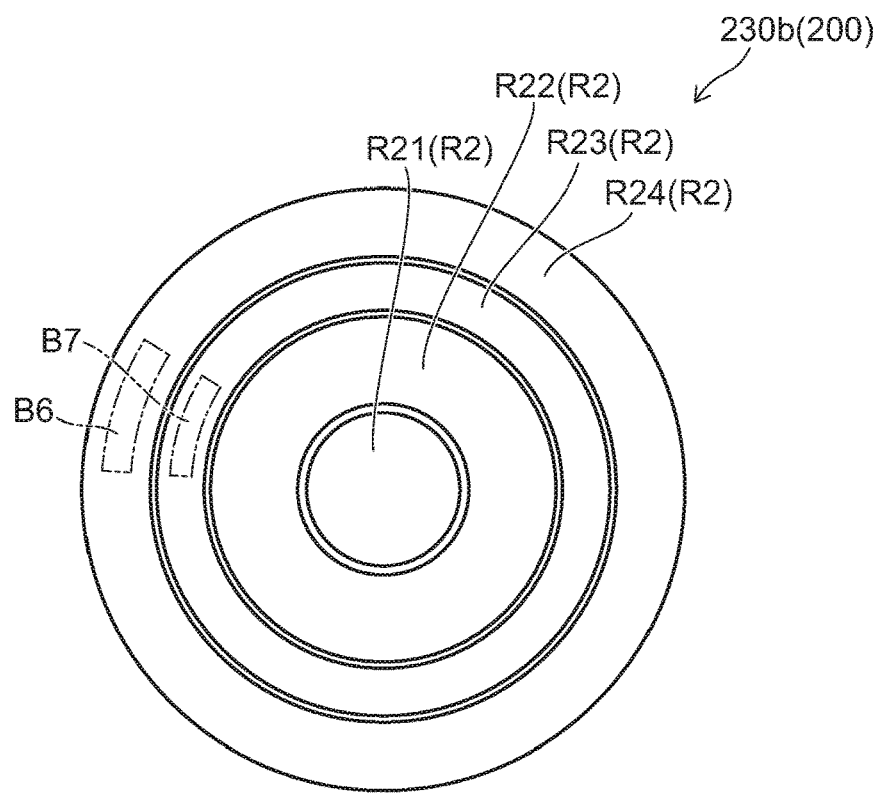
FIG. 16A to FIG. 16C are schematic plan views illustrating the second heater element according to the embodiment.
Figure 16B:
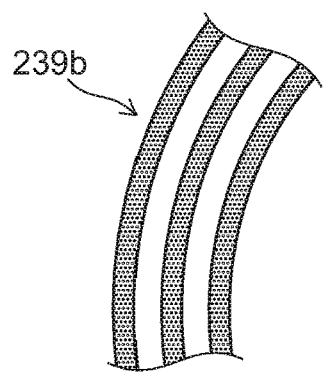
Figure 16C:
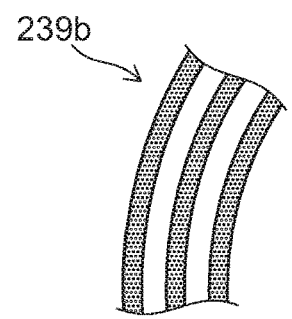

FIG. 16A to FIG. 16C are schematic plan views illustrating the second heater element according to the embodiment. FIG. 16A shows an example of regions (the second heater regions) of the second heater element.

The heater plate 200 is subdivided into multiple regions for the second heater element 230b; and independent temperature control is performed in each region. For example, as shown in FIG. 16A, the heater plate 200 includes the multiple second heater regions R2. The second heater regions R2 are arranged to form substantially a circle.

In the example, the multiple second heater regions R2 includes regions R21, R22, R23, and R24. The region R21 is positioned at the central portion of the heater plate 200. The region R22 is positioned on the outer side of the region R21. The region R23 is positioned on the outer side of the region R22. The region R24 is positioned on the outer side of the region R23. The planar configuration and number of the second heater regions R2 may be arbitrary. For example, the second heater regions R2 may have a substantially fan-like shape.

The second heater element 230b includes the multiple second heater electrodes 239b provided in the multiple second heater regions R2. For example, one of the second heater electrodes 239b is provided in each of the multiple second heater regions R2.

FIG. 16B is an enlarged view illustrating the second heater electrode 239b provided in region B6 shown in FIG. 16A. FIG. 16C is an enlarged view illustrating the second heater electrode 239b provided in region B7 shown in FIG. 16A. Although not illustrated, the second heater electrode 239b shown in FIG. 16B is one continuous pattern; and the second heater electrode 239b shown in FIG. 16C is one continuous pattern. Thus, the second heater electrode 239b that has one continuous band configuration is provided in each of the second heater regions R2.

The second heater electrode 239b may not be provided in all of the subdivided regions. That is, the second heater electrode 239b may not be provided in one of the multiple second heater regions R2. The number of the second heater electrodes 239b provided in one second heater region R2 is 1 or less.

The multiple second heater electrodes 239b are independent from each other. For example, the second heater electrode 239b that is disposed in the region R21 is not electrically connected to the second heater electrode 239b disposed in the region R22. The second heater electrode 239b that is disposed in the region R22 is not electrically connected to the second heater electrode 239b disposed in the region R23. The second heater electrode 239b that is disposed in the region R23 is not electrically connected to the second heater electrode 239b disposed in the region R24.

Thus, the multiple second heater electrodes 239b are provided in mutually-independent states in multiple regions. In other words, the multiple second heater electrodes 239b are not electrically connected to each other. Thereby, voltages can be applied respectively to the second heater electrodes 239b. In other words, the temperature in the surface of the processing object W can be controlled independently for each of the second heater regions R2.

Figure 17A:
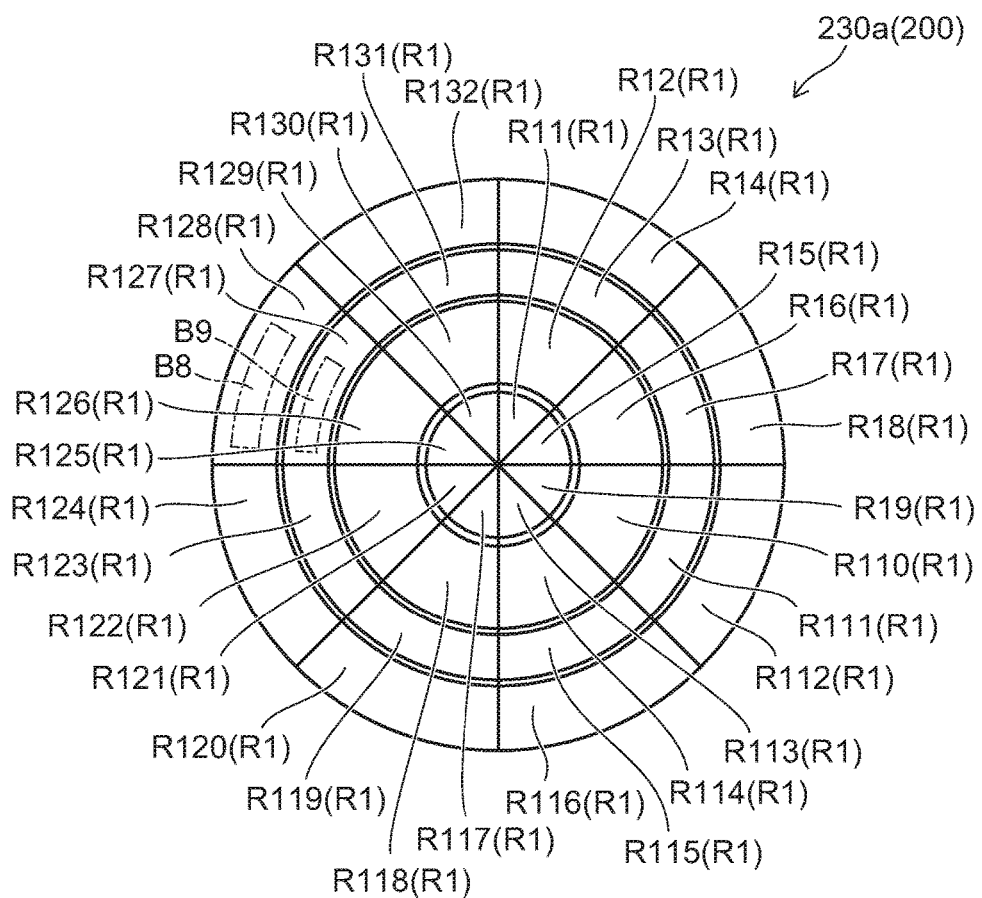
FIG. 17A to FIG. 17C are schematic plan views illustrating the first heater element according to the embodiment.
Figure 17B:
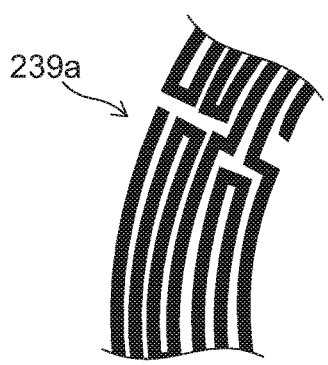
Figure 17C:
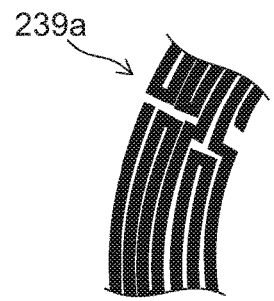

FIG. 17A to FIG. 17C are schematic plan views illustrating the first heater element according to the embodiment. FIG. 17A shows an example of a region (a first heater region) of the first heater element.

The heater plate 200 is subdivided into multiple regions for the first heater element 230a; and independent temperature control is performed in each region. For example, as shown in FIG. 17A, the heater plate 200 includes the multiple first heater regions R1.

In the example, the first heater regions R1 are arranged to form at least a portion of a substantially fan-like shape. The multiple first heater regions R1 include regions R11 to R132. The regions that are subdivided into eight along the circumferential direction are further subdivided into four along the diametrical direction. The planar configuration and number of the first heater regions R1 may be arbitrary.

The first heater element 230a includes the multiple first heater electrodes 239a provided in the multiple first heater regions R1. For example, one of the first heater electrodes 239a is provided in each of the multiple first heater regions R1.

FIG. 17B is an enlarged view illustrating the first heater electrode 239a provided in region B8 shown in FIG. 17A. FIG. 17C is an enlarged view illustrating the first heater electrode 239a provided in region B9 shown in FIG. 17A. Although not illustrated, the first heater electrode 239a shown in FIG. 17B is one continuous pattern; and the first heater electrode 239a shown in FIG. 17C is one continuous pattern. Thus, the first heater electrode 239a that has one continuous band configuration is provided in each of the first heater regions R1.

The first heater electrode 239a may not be provided in all of the subdivided regions. That is, the first heater electrode 239a may not be provided in one of the multiple first heater regions R1. The number of the first heater electrodes 239a provided in one first heater region R1 is 1 or less.

The multiple first heater electrodes 239a are provided in mutually-independent states in multiple regions. The multiple first heater electrodes 239a are not electrically connected to each other. That is, the first heater electrode 239a that is disposed in any one of the first heater regions R1 is not electrically connected to the first heater electrode 239a disposed in the other first heater regions R1. Thereby, voltages can be applied respectively to the first heater electrodes 239a. In other words, the temperature in the surface of the processing object W can be controlled independently for each of the first heater regions R1.

For example, the number of the first heater regions R1 is larger than the number of the second heater regions R2 shown in FIG. 16A. The number of the first heater electrodes 239a is larger than the number of the second heater electrodes 239b. Thus, by increasing the number of the regions where the first heater electrode 239a is provided, fine adjustment of the temperature is possible by using the first heater electrode 239a. Thereby, the uniformity of the temperature distribution in the surface of the processing object W can be increased.

As described above, the first heater element 230a is a low-output heater; and the second heater element 230b is a high-output heater. In other words, the electrical resistance of one independently-controlled first heater electrode 239a (the electrical resistance between the power supply terminals supplying the electrical power to the first heater electrode 239a) is relatively high. The electrical resistance of one independently-controlled second heater electrode 239b (the electrical resistance between the power supply terminals supplying the electrical power to the second heater electrode 239b) is relatively low.

The resistance density of the first heater element 230a is higher than the resistance density of the second heater element 230b.

The resistance density of the first heater element 230a is the ratio of the electrical resistance of the first heater electrode 239a disposed in one first heater region R1 to the surface area of the first heater region R1. In other words, the resistance density of the first heater element 230a is calculated by (the electrical resistance of the first heater electrode 239a)/(the surface area of the first heater region R1).

Similarly, the resistance density of the second heater element 230b is the ratio of the electrical resistance of the second heater electrode 239b disposed in one second heater region R2 to the surface area of the second heater region R2. In other words, the resistance density of the second heater element 230b is calculated by (the electrical resistance of the second heater electrode 239b)/(the surface area of the second heater region R2).

The boundaries of the regions when calculating the surface area of the first heater region R1 and the surface area of the second heater region R2 will now be described.

FIG. 18A to FIG. 18F are schematic plan views describing the heater element according to the embodiment.

Figure 18A:
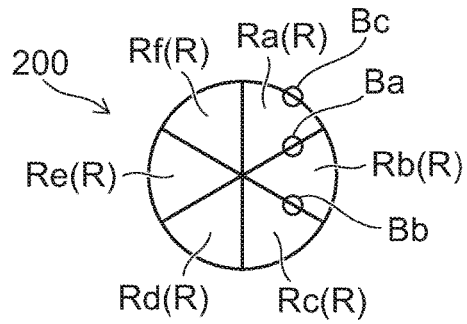
FIG. 18A to FIG. 18F are schematic plan views describing the heater element according to the embodiment.

In the example shown in FIG. 18A, the heater plate 200 is subdivided into multiple regions R (Ra to Rf). The region R is one of the first heater region R1 or the second heater region R2. Multiple heater electrodes 239 are provided in the multiple regions R. In the case where the region R is the first heater region R1, the heater electrode 239 is taken to be the first heater electrode 239a. In the case where the region R is the second heater region R2, the heater electrode 239 is taken to be the second heater electrode 239b.

Figure 18E:
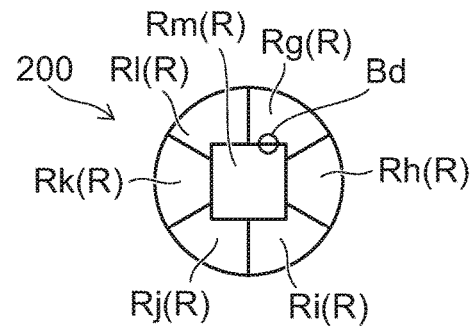
Figure 18B:
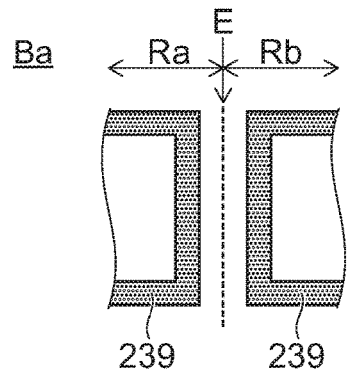

FIG. 18B is an enlarged view illustrating the heater electrodes 239 provided in a region Ba shown in FIG. 18A. The two heater electrodes 239 shown in FIG. 18B are independent from each other. In such a case, a boundary E of the regions R is determined to pass through the midpoint of the mutually-independent heater electrodes 239. In other words, in the case where the regions R where the heater electrodes 239 are provided are adjacent to each other, the boundary E is the intermediate point of the independent heater electrodes 239. In the example of FIG. 18A, the boundary E includes the center of the heater plate 200. In the case where the heater electrode 239 and an electrically conductive portion 235 described below (referring to FIG. 23) are adjacent to each other, the boundary E can be taken to be the intermediate point between the heater electrode 239 and the electrically conductive portion 235.

Figure 18F:
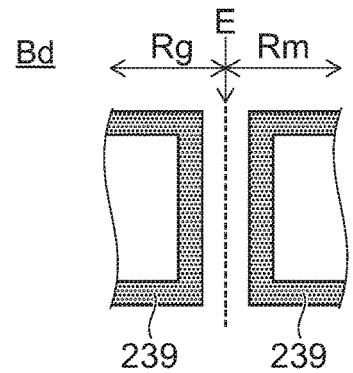
Figure 18C:
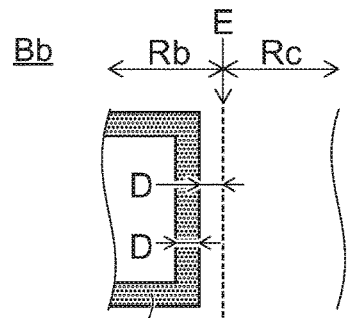

FIG. 18C is an enlarged view illustrating the heater electrode 239 provided in a region Bb shown in FIG. 18A. For example, the heater electrode 239 is provided in a region Rb; and the heater electrode 239 is not provided in a region Rc. In such a case, the boundary E of the regions R may be a position separated from the heater electrode 239 by a width D of the heater electrode 239.

Figure 18D:
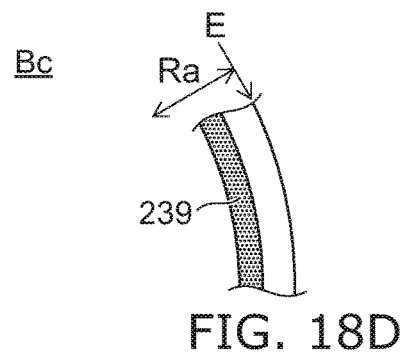

FIG. 18D is an enlarged view illustrating the heater electrode 239 provided in a region Bc shown in FIG. 18A. At the outermost perimeter of the heater plate 200, the boundary E of the region R is the outermost perimeter of the heater plate.

FIG. 18E is a schematic plan view illustrating another heater plate. In the example shown in FIG. 18E, the heater plate 200 is subdivided into multiple regions R (Rg to Rm). FIG. 18F is an enlarged view illustrating the heater electrode 239 provided in a region Bd shown in FIG. 18E. Even in such a case, the boundary E of the regions R is determined to pass through the midpoint of the mutually-independent heater electrodes 239.

The surface areas of the regions surrounded with the boundary E such as those described above are used as the surface areas of the region R (the first heater region R1 or the second heater region R2).

Figure 19A:
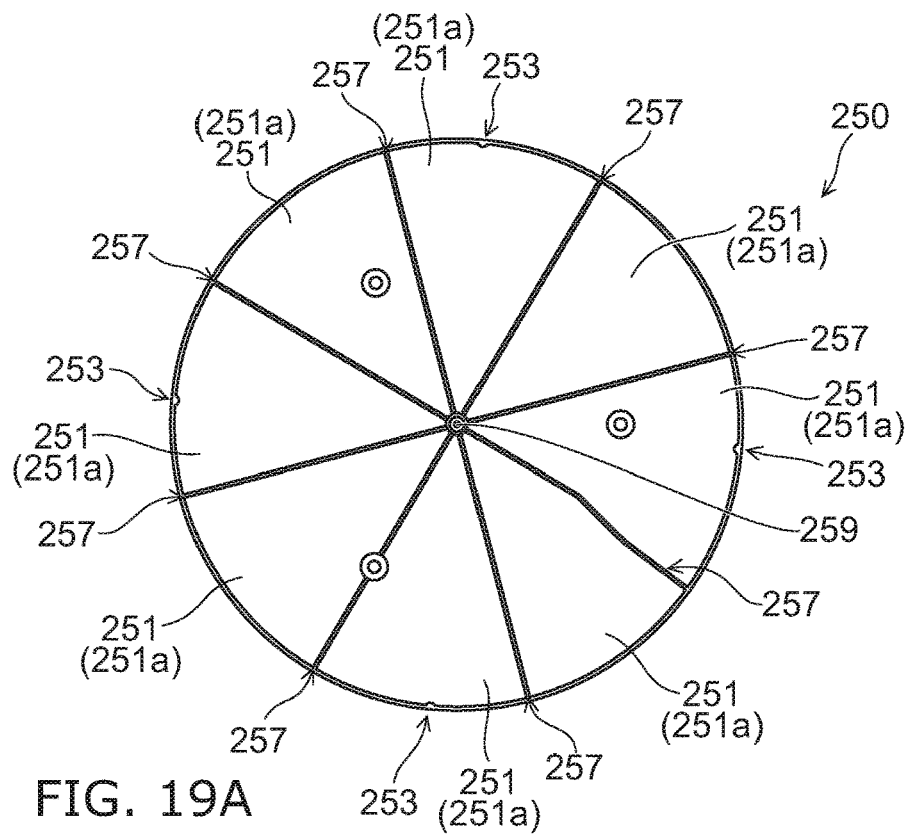
FIG. 19A and FIG. 19B are schematic plan views illustrating the bypass layer according to the embodiment.
Figure 19B:
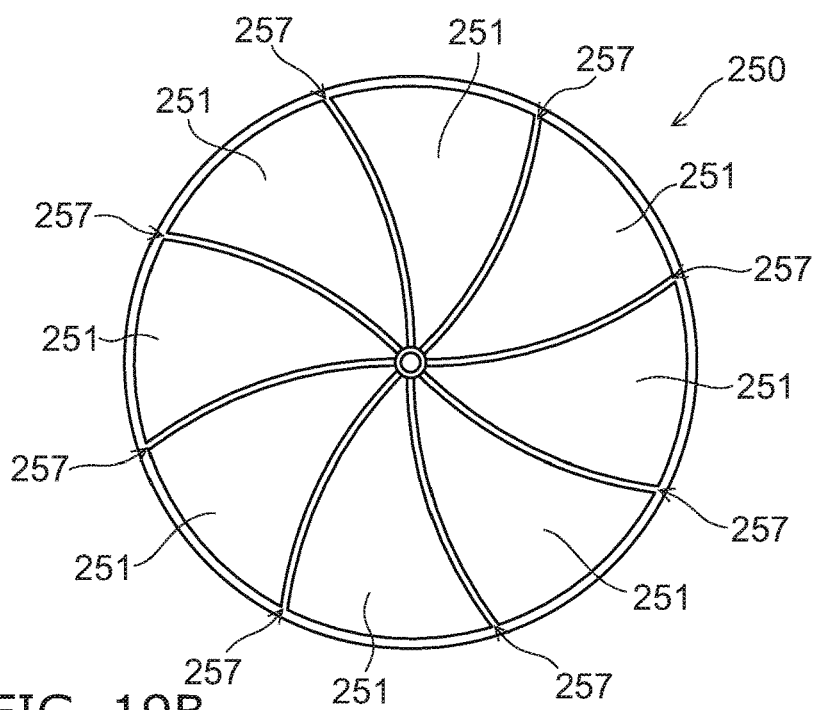

FIG. 19A and FIG. 19B are schematic plan views illustrating the bypass layer according to the embodiment.

At least one of the multiple bypass portions 251 of the bypass layer 250 has a notch 253 in an edge portion. In the example, four notches 253 are provided in the bypass layer 250. The number of the notches 253 is not limited to four.

Because at least one of the multiple bypass portions 251 has the notch 253, the second support plate 270 can contact the first support plate 210. The coupling region JA described in reference to FIG. 15A and FIG. 15B is provided at the outer edges of the first support plate 210 and the second support plate 270 to correspond to the notch 253 of the bypass layer 250.

As illustrated in FIG. 19A, the bypass portions 251 of the bypass layer 250 have a fan-like shape. The bypass portions 251 of the multiple fan-like shapes are arranged to be separated from each other; and the bypass layer 250 has a substantially circular shape as an entirety. As illustrated in FIG. 19A, a separating portion 257 that is between the mutually-adjacent bypass portions 251 extends in the diametrical direction from a center 259 of the bypass layer 250. In other words, the separating portion 257 that is between the mutually-adjacent bypass portions 251 extends in a radial configuration from the center 259 of the bypass layer 250. The surface area of the surface 251a of the bypass portion 251 is greater than the surface area of the separating portion 257. The surface area of the bypass layer 250 (the surface area of the surface 251a of the bypass portion 251) is wider than the surface area of the first heater element 230a (the surface area of the first heater electrode 239a) and wider than the surface area of the second heater element 230b (the surface area of the second heater electrode 239b).

As illustrated in FIG. 19B, the configuration of the multiple bypass portions 251 of the bypass layer 250 may be, for example, a curved fan-like configuration. Thus, the number and configurations of the multiple bypass portions 251 provided in the bypass layer 250 may be arbitrary.

Figure 20:
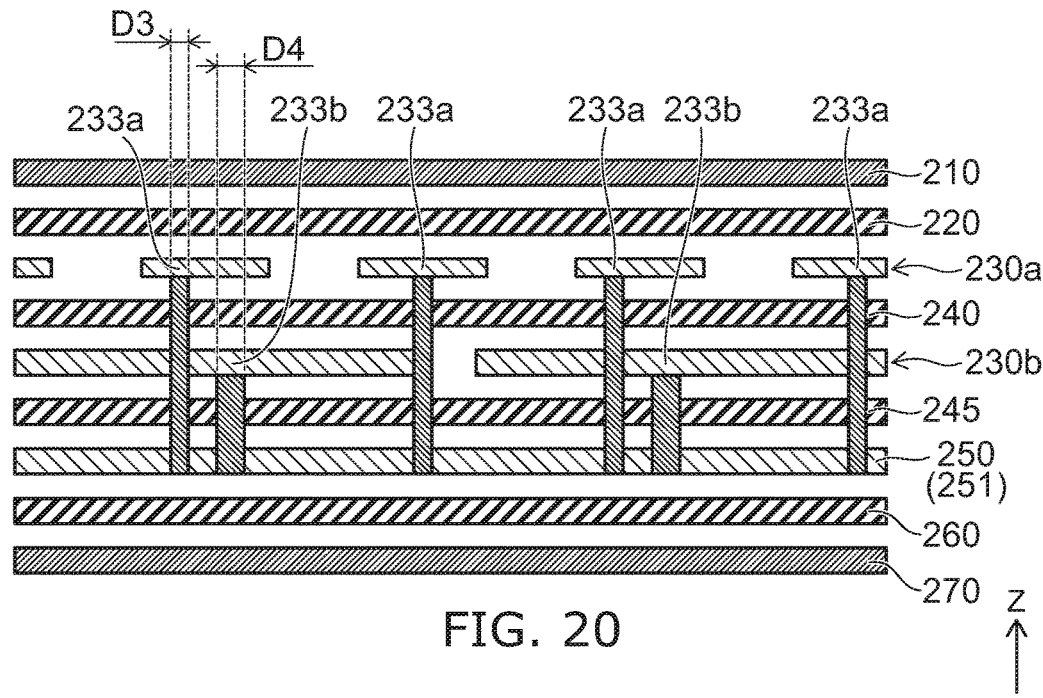
FIG. 20 is a schematic exploded view illustrating the heater plate according to the embodiment.

FIG. 20 is a schematic exploded view illustrating the heater plate according to the embodiment.

In the example as illustrated in FIG. 20, the bypass layer 250 is electrically connected to both the first heater element 230a and the second heater element 230b. In other words, one bypass portion 251 is connected to the first heater element 230a (the first heater electrode 239a) and connected to the second heater element 230b (the second heater electrode 239b). In other words, a common bypass layer 250 is used for the electrical power supply to the first heater element 230a and the electrical power supply to the second heater element 230b.

In the embodiment, two layers of bypass layers including the bypass layer supplying the electrical power to the first heater element 230a and the bypass layer supplying the electrical power to the second heater element 230b may be provided. However, by using the common bypass layer 250 as in the example shown in FIG. 20, the number of layers of the heater plate 200 can be suppressed; and the thermal capacity of the entire heater plate 200 can be reduced. Accordingly, the response (the ramp rate) of the temperature can be improved.

The first heater element 230a includes a first connection portion 233a. The first connection portion 233a is the portion where the electrically conductive body that supplies the electrical power to the first heater element 230a (in the example, the bypass layer 250) is connected. For example, the first connection portion 233a corresponds to the coupling portion between the first heater element 230a and the bypass layer 250 such as that described in reference to FIG. 11A and FIG. 11B. The first connection portion 233a is, for example, the portion contacting the bypass layer 250. The first connection portion 233a is one of the portion Ain where the current enters the first heater element 230a (referring to FIG. 5) or the portion Aout where the current exits from the first heater element 230a (referring to FIG. 5). In the case where the bypass layer 250 is not provided, for example, the first connection portion 233a corresponds to the coupling portion between the first heater element 230a and the power supply terminal.

Similarly, the second heater element 230b includes a second connection portion 233b. The second connection portion 233b is the portion where an electrically conductive body that supplies the electrical power to the second heater element 230b (in the example, the bypass layer 250) is connected. For example, the second connection portion 233b corresponds to the coupling portion between the second heater element 230b and the bypass layer 250 such as that described in reference to FIG. 11A and FIG. 11B. The second connection portion 233b is, for example, the portion contacting the bypass layer 250. The second connection portion 233b is one of the portion Bin where the current enters the second heater element 230b (referring to FIG. 5) or the portion Bout where the current exits from the second heater element 230b (referring to FIG. 5) described in reference to FIG. 5. For example, in the case where the bypass layer 250 is not provided, the second connection portion 233b corresponds to the coupling portion between the second heater element 230b and the power supply terminal.

A width D3 along a direction in the plane of the first connection portion 233a is narrower than a width D4 along a direction in the plane of the second connection portion 233b. The vicinities of the first connection portion 233a and the second connection portion 233b easily become singularities of the temperature. Conversely, by setting the width of the first connection portion 233a proximal to the processing object W to be narrow, the effects of the first connection portion 233a can be suppressed; and the unevenness of the temperature distribution that occurs in the processing object W can be suppressed.

The first heater element 230a (the first heater electrode 239a) covers at least a portion of the second connection portion 233b. In other words, a portion of the first heater element 230a is positioned between the second connection portion 233b and the first major surface 101. Thus, by disposing the first heater element 230a on the second connection portion 233b, the effects of the second connection portion 233b can be suppressed; and the unevenness of the temperature distribution that occurs in the processing object W can be suppressed further.

Figure 21:
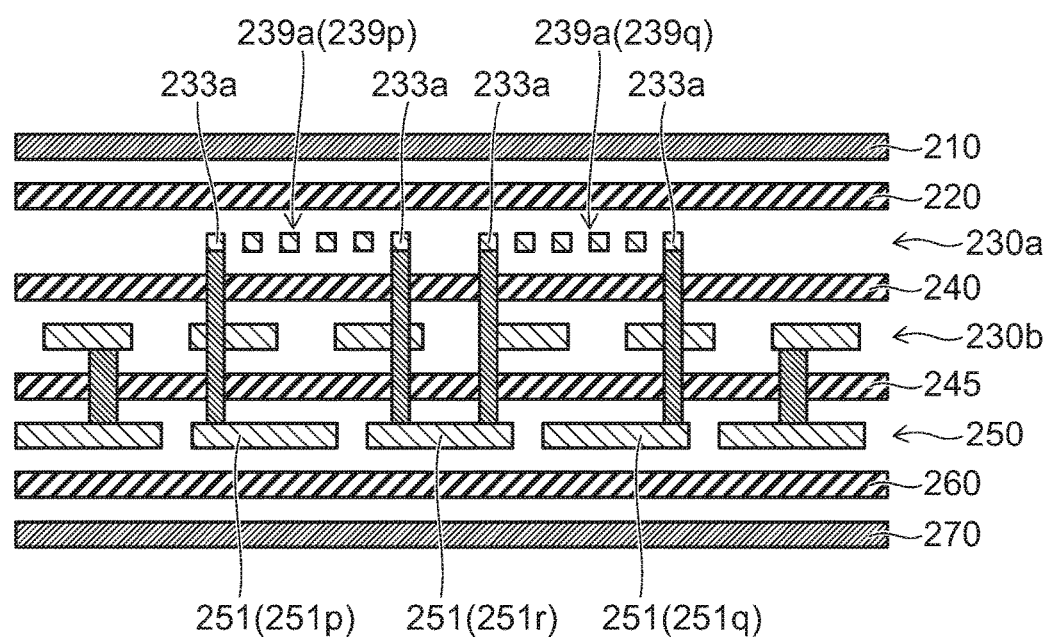
FIG. 21 is a schematic exploded view illustrating the heater plate according to the embodiment.

FIG. 21 is a schematic exploded view illustrating the heater plate according to the embodiment.

One first heater electrode 239a includes two first connection portions 233a including the first connection portion 233a corresponding to the inlet of the current and the first connection portion 233a corresponding to the outlet of the current.

The two first connection portions 233a are connected respectively to mutually-different bypass portions 251. One is a bypass portion 251 having a high potential; and the other is a bypass portion 251 having a low potential. The multiple first heater electrodes 239a may use commonly one bypass portion 251 (e.g., the bypass portion 251 having the low potential).

More specifically, for example, as illustrated in FIG. 21, the multiple first heater electrodes 239a include first heater electrodes 239p and 239q. The multiple bypass portions 251 include bypass portions 251p, 251q, and 251r. The first heater electrode 239p is connected to the bypass portion 251p and the bypass portion 251r. The first heater electrode 239q is connected to the bypass portion 251q and the bypass portion 251r. In other words, the first heater electrode 239p and the first heater electrode 239q are connected to a common bypass portion 251r.

Thereby, the number of the bypass portions 251 electrically connected to the first heater element 230a can be not more than 2 times the number of the first heater electrodes 239a (the number of the first heater regions R1). By suppressing the number of the bypass portions 251, the number of the power supply terminals 280 connected to the bypass portions 251 can be reduced. Accordingly, the temperature unevenness in the surface of the processing object W due to the singularities of the temperature can be suppressed.

Figure 22:
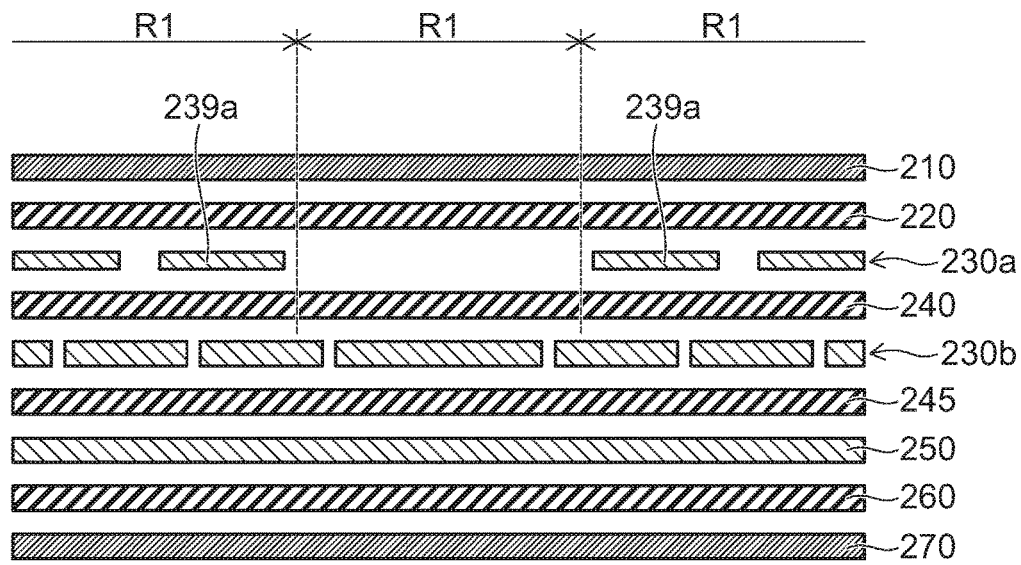
FIG. 22 is a schematic exploded view illustrating the heater plate according to the embodiment.
Figure 23:
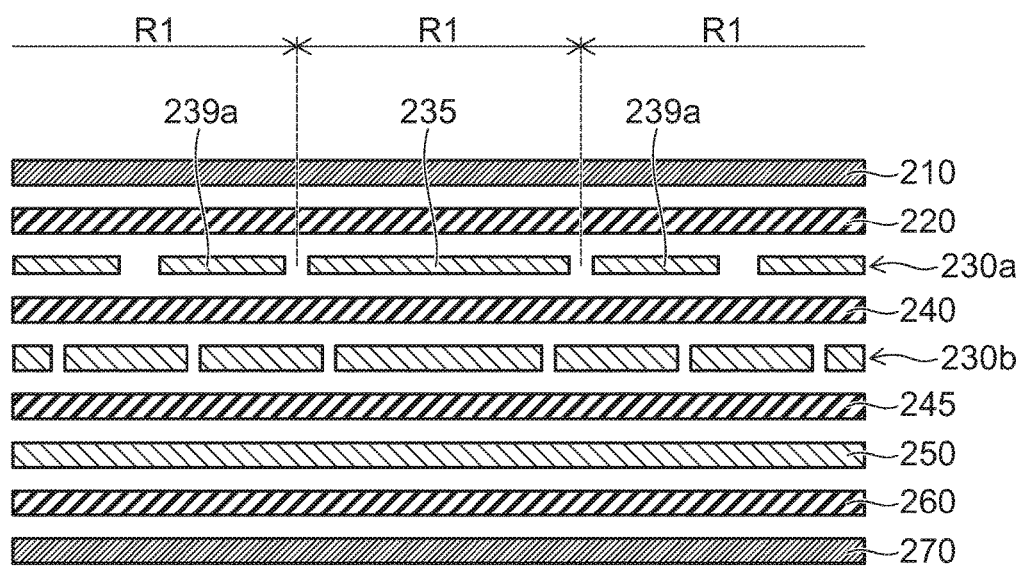
FIG. 23 is a schematic exploded view illustrating the heater plate according to the embodiment.

FIG. 22 and FIG. 23 are schematic exploded views illustrating the heater plate according to the embodiment. In the example of FIG. 22, the first heater electrode 239a is not provided in one first heater region R1. Thus, the first heater electrode 239a may not be provided in one of the multiple first heater regions R1. Thereby, the heater plate 200 can be thin in the region where the first heater electrode 239a is not provided; and the thermal capacity of the heater plate 200 can be reduced. Accordingly, the response (the ramp rate) of the temperature of the processing object W can be improved.

On the other hand, in the case where the difference is too large between the thickness of the portion where the heater plate 200 is thin and the thickness of the portion where the heater plate 200 is thick, there are cases where the difference becomes large between the temperature of the portion where the heater plate 200 is thin and the temperature of the portion where the heater plate 200 is thick. Conversely, in the example of FIG. 23, the heater plate 200 includes the electrically conductive portion (the metal foil) 235 provided in the same layer as the first heater element 230a. The electrically conductive portion 235 is provided in the first heater region R1 where the first heater electrode 239a is not provided. The thickness and/or material of the electrically conductive portion 235 can be similar to that of the first heater element 230a. The electrically conductive portion 235 is insulated from the first heater element 230a, the bypass layer 250, the power supply terminal 280, etc. In other words, the electrically conductive portion 235 is a dummy heater electrode that is not supplied with electrical power from the outside.

By providing the dummy heater electrode, the unevenness of the heater plate 200 is improved; and the uniformity of the temperature distribution in the surface of the processing object W can be increased.

Figure 24:
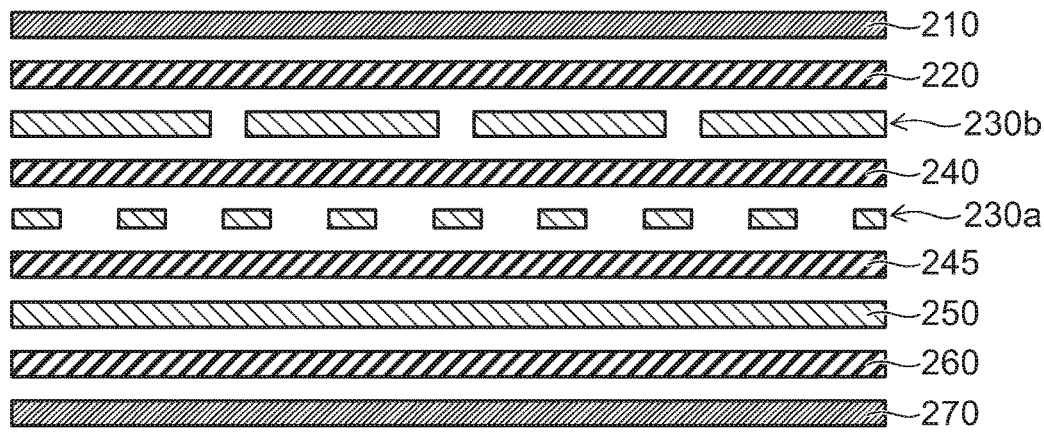
FIG. 24 is a schematic exploded view illustrating the heater plate according to the embodiment.

FIG. 24 is a schematic exploded view illustrating the heater plate according to the embodiment.

In the example shown in FIG. 24, compared to the heater plate 200 described in reference to FIG. 1 to FIG. 23, the stacking order of the first heater element 230a and the second heater element 230b is different. In the example shown in FIG. 1 to FIG. 23, the first heater element 230a is positioned higher than the second heater element 230b. In other words, the first heater element 230a is provided between the first major surface 101 and the second heater element 230b.

Conversely, in the example shown in FIG. 24, the second heater element 230b is positioned higher than the first heater element 230a. In other words, the second heater element 230b is provided between the first major surface 101 and the first heater element 230a. Thus, the position of the first heater element 230a and the position of the second heater element 230b may be interchanged.

In the case where the first heater element 230a is positioned higher than the second heater element 230b, the distance between the first heater element 230a and the processing object W is shorter than the distance between the second heater element 230b and the processing object W. By providing the first heater element 230a to be relatively proximal to the processing object W, the temperature of the processing object is controlled easily by the first heater element 230a. In other words, the temperature unevenness in the surface of the processing object W occurring due to the pattern of the second heater element 230b is suppressed easily by the first heater element 230a. Accordingly, the uniformity of the temperature distribution in the surface of the processing object can be increased.

On the other hand, in the case where the second heater element 230b is positioned higher than the first heater element 230a, the high-output second heater element 230b is relatively proximal to the processing object W. Thereby, the response (the ramp rate) of the temperature of the processing object W can be improved.

Figure 25:
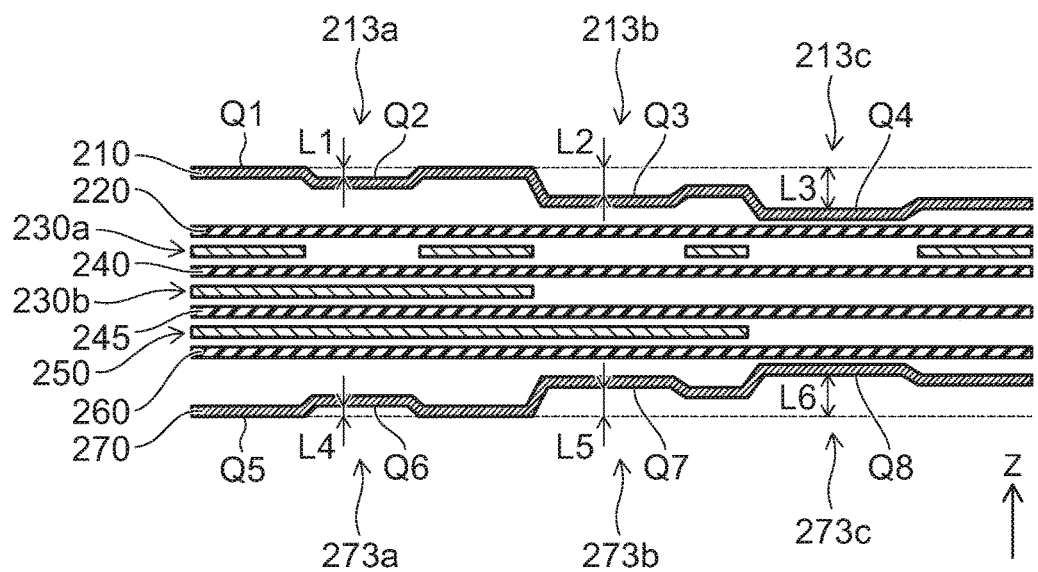
FIG. 25 is a schematic exploded view illustrating the heater plate according to the embodiment.

FIG. 25 is a schematic exploded view illustrating the heater plate according to the embodiment.

An unevenness is formed in at least one of the first support plate 210 or the second support plate 270 according to the thicknesses of the layers provided between the first support plate 210 and the second support plate 270. In other words, at least one of the first support plate 210 or the second support plate 270 has multiple types of recesses having mutually-different depths. Although not illustrated, multiple types of unevennesses are formed also in at least one of the first resin layer 220, the first heater element 230a, the second resin layer 240, the second heater element 230b, the third resin layer 245, the bypass layer 250, or the fourth resin layer 260.

For example, the first support plate 210 has a recess 213a, a recess 213b, and a recess 213c. In other words, the first support plate 210 includes multiple portions Q1 to Q4 having mutually-different positions in the Z-direction. The portion Q1 is the portion of the first support plate 210 most proximal to the first major surface 101. The portions Q2 to Q4 respectively form the recess 213a to 213c.

The depth of the recess 213a is a distance L1 along the Z-direction between the portion Q1 and the portion Q2. The depth of the recess 213b is a distance L2 along the Z-direction between the portion Q1 and the portion Q3. The depth of the recess 213c is a distance L3 along the Z-direction between the portion Q1 and the portion Q4. The distance L1, the distance L2, and the distance L3 are different from each other.

For example, the second support plate 270 has a recess 273a, a recess 273b, and a recess 273c. In other words, the second support plate 270 includes multiple portions Q5 to Q8 having mutually-different positions in the Z-direction. The portion Q5 is the portion of the second support plate 270 most distal to the first major surface 101. The portions Q6 to Q8 respectively form the recess 273a to 273c.

The depth of the recess 273a is a distance L4 along the Z-direction between the portion Q5 and the portion Q6. The depth of the recess 273b is a distance L5 along the Z-direction between the portion Q5 and the portion Q7. The depth of the recess 273c is a distance L6 along the Z-direction between the portion Q5 and the portion Q8. The distance L4, the distance L5, and the distance L6 are different from each other.

The heater plate 200 is thick at the shallow recesses; and the heater plate 200 is thin at the deep recesses. For example, the temperature becomes high easily at the thick portions compared to the thin portions. Therefore, the temperature distribution in the surface of the processing object W can be adjusted by adjusting the arrangement pattern of the multiple types of unevennesses. Thereby, the temperature unevenness in the surface of the processing object W is improved; and it is also possible to increase the uniformity of the temperature distribution in the surface.

Figure 26A:
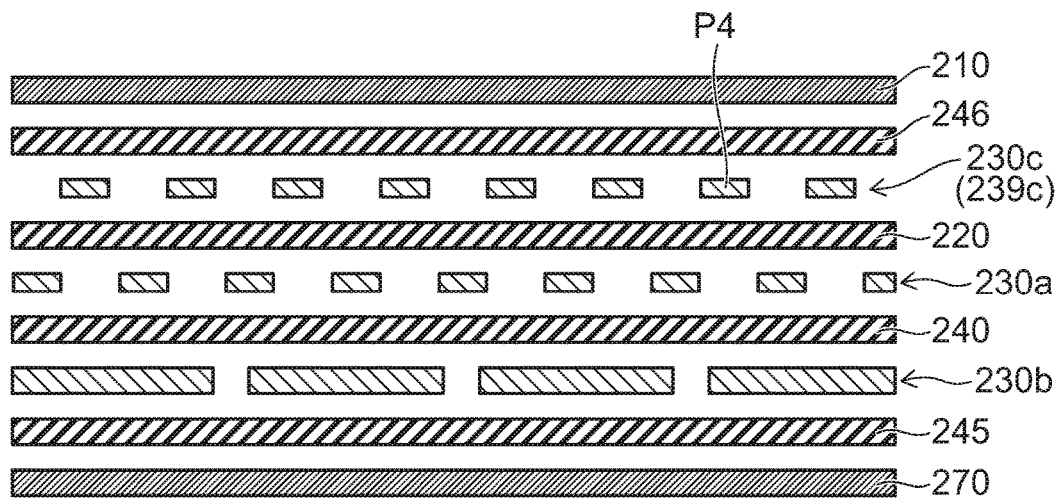
FIG. 26A and FIG. 26B are schematic views illustrating the heater plate according to the embodiment.
Figure 26B:
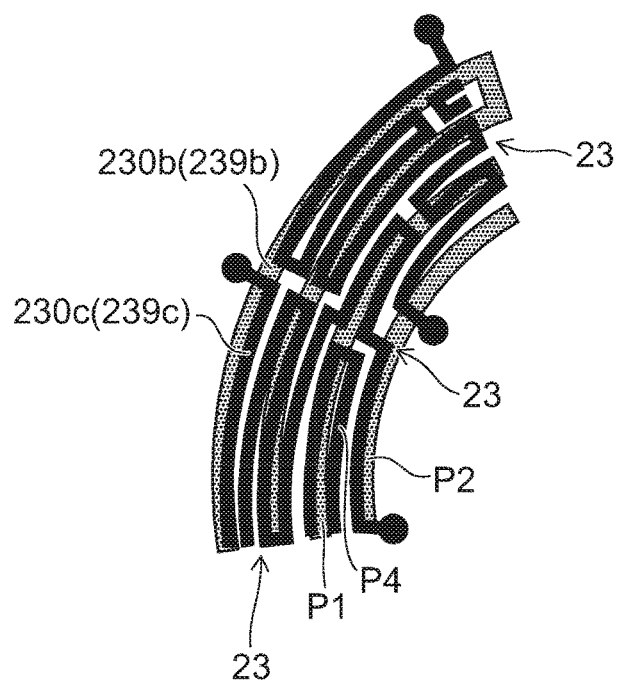

FIG. 26A and FIG. 26B are schematic views illustrating the heater plate according to the embodiment.

FIG. 26A is a schematic exploded view of the heater plate. In the embodiment, low-output heaters may be provided in multiple layers. For example, in the example shown in FIG. 26A, the heater plate 200 further includes a third heater element 230c and a resin layer 246. The third heater element 230c is, for example, a low-output heater similar to the first heater element 230a. The bypass layer 250 and the fourth resin layer 260 are not illustrated in the example.

The third heater element 230c is electrically connected to the power supply terminal 280 or the bypass layer 250 and generates heat due to a current flowing. The third heater element 230c is provided in a layer that is different from the layer in which the first heater element 230a is provided and the layer in which the second heater element 230b is provided. In the example, the third heater element 230c is provided between the first support plate 210 and the first resin layer 220; and the resin layer 246 is provided between the third heater element 230c and the first support plate 210.

The third heater element 230c includes, for example, a third heater electrode 239c having multiple band configurations. The thickness, width, and material of the third heater element 230c (the third heater electrode 239c) can be similar to those of the first heater element 230a.

The electrical resistance of the third heater element 230c is higher than the electrical resistance of the second heater element 230b. In other words, the electrical resistance of one third heater electrode 239c (the electrical resistance between the power supply terminals supplying the electrical power to the third heater electrode 239c) is higher than the electrical resistance of one second heater electrode 239b.

FIG. 26B is an enlarged plan view illustrating the second heater element 230b and the third heater element 230c.

When viewed along the Z-direction as in FIG. 26B, the third heater element 230c (the third heater electrode 239c) includes bent portions 23. When viewed along the Z-direction, the number of the bent portions 23 of the third heater element 230c is more than the number of bent portions of the second heater element 230b.

When viewed along the Z-direction, the third heater element 230c includes, for example, a fourth portion P4. The fourth portion P4 is positioned between the portions (P1 and P2) of the second heater element 230b that are separated from each other. In other words, when viewed along the Z-direction, the third heater element 230c includes a portion positioned at a gap of the second heater element 230b. For example, the fourth portion P4 is positioned at a gap of the first heater element 230a when viewed along the Z-direction.

The temperature unevenness in the surface of the processing object W occurring due to the pattern of the first and second heater elements 230a and 230b can be suppressed by the third heater element 230c. Accordingly, the uniformity of the temperature distribution in the surface of the processing object W can be increased further.

Figure 27:
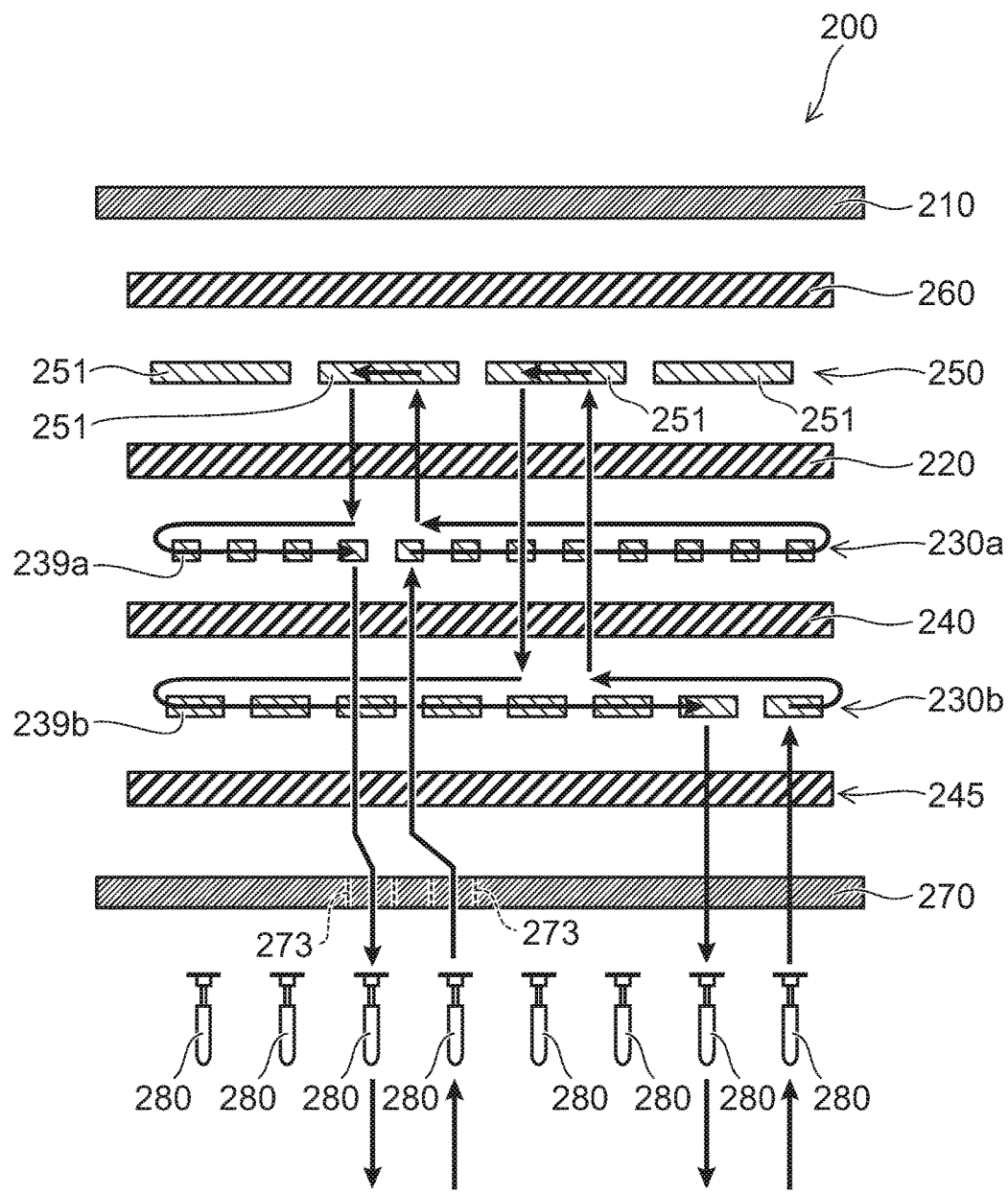
FIG. 27 is a schematic exploded view illustrating a modification of the heater plate of the embodiment.

FIG. 27 is a schematic exploded view illustrating a modification of the heater plate of the embodiment.

In the example as illustrated in FIG. 27, the bypass layer 250 is provided between the first support plate 210 and the first heater element 230a. More specifically, the bypass layer 250 is provided between the first support plate 210 and the first resin layer 220; and the fourth resin layer 260 is provided between the first support plate 210 and the bypass layer 250.

Thus, the bypass layer 250 may be provided between the first support plate 210 and the heater elements (the first and second heater elements 230a and 230b). In other words, the bypass layer 250 may be provided between the ceramic dielectric substrate 100 and the heater elements (the first and second heater elements 230a and 230b).

Even in such a case, the diffusability of the heat supplied from the first and second heater elements 230a and 230b can be improved by the bypass layer 250. For example, the thermal diffusion in the in-plane direction (the horizontal direction) of the processing object W can be improved. Thereby, for example, the uniformity of the temperature distribution in the surface of the processing object W can be increased.

For example, the bypass layer 250 may be provided both between the first support plate 210 and the first heater element 230a and between the second heater element 230b and the second support plate 270. In other words, the heater plate 200 may include two bypass layers 250.

Figure 28:
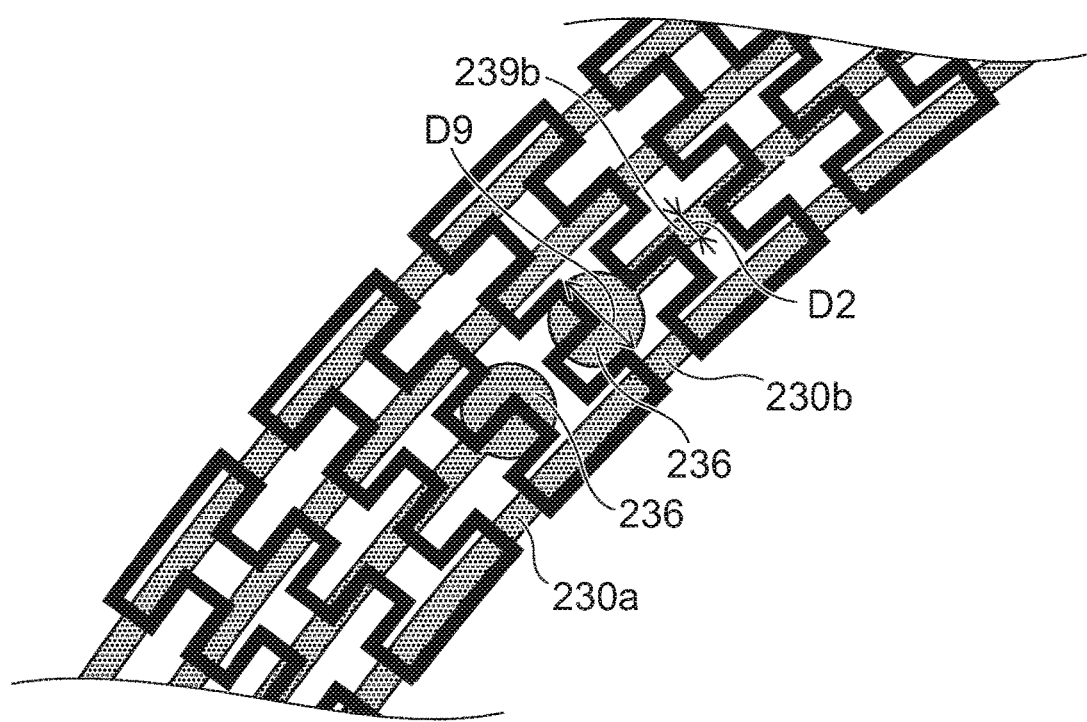
FIG. 28 is a schematic plan view illustrating the heater plate of the embodiment.

FIG. 28 is a schematic plan view illustrating the heater plate of the embodiment.

As illustrated in FIG. 28, the second heater element 230b includes a connection region 236. The connection region 236 is a region where an electrically conductive body (in the example, the bypass layer 250) supplying the electrical power to the second heater element 230b is connected. The connection region 236 includes the second connection portion 233b recited above. The connection region 236 includes one of the portion Bin where the current enters the second heater element 230b (referring to FIG. 5) or the portion Bout where the current exits from the second heater element 230b (referring to FIG. 5). In the case where the bypass layer 250 is not provided, for example, the connection region 236 corresponds to the coupling portion between the second heater element 230b and the power supply terminal.

When viewed along the Z-direction, the connection region 236 is, for example, substantially circular. A width (a diameter) D9 of the connection region 236 is wider than the width D2 of the second heater electrode 239b. Accordingly, the heat generation of the connection region 236 is small compared to that of the second heater electrode 239b. In other words, the connection region 236 is a region of the second heater element 230b that easily becomes a singularity of the temperature.

When viewed along the Z-direction in the example, at least a portion of the first heater element 230a overlaps the connection region 236. In other words, at least a portion of the first heater element 230a is provided on the connection region 236 of the second heater element 230b. Thereby, the temperature unevenness in the surface of the processing object W caused by the connection region 236 of the second heater element 230b having the small heat generation can be suppressed by the first heater element 230a. Accordingly, the uniformity of the temperature distribution in the surface of the processing object can be increased.

Figure 29A:
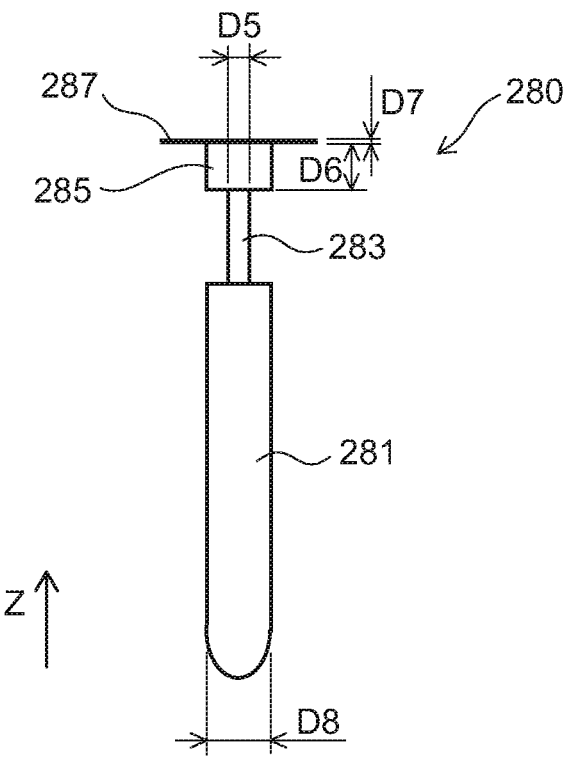
FIG. 29A and FIG. 29B are schematic plan views illustrating a specific example of the power supply terminal of the embodiment.
Figure 29B:
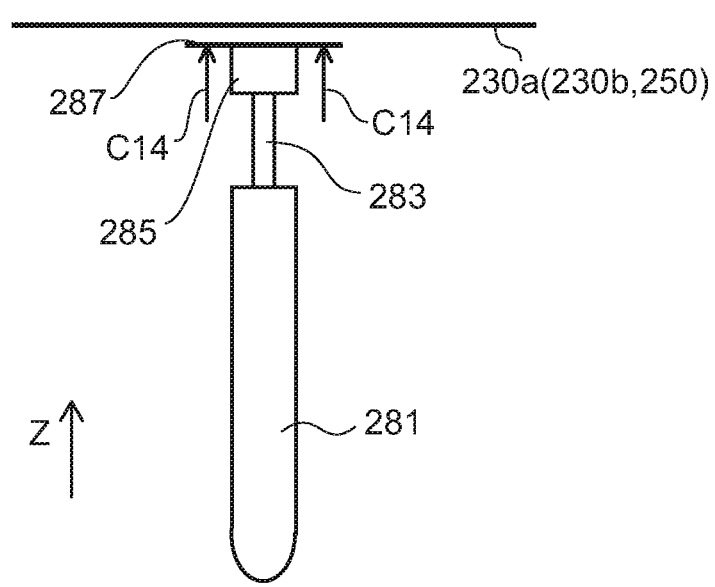

FIG. 29A and FIG. 29B are schematic plan views illustrating a specific example of the power supply terminal of the embodiment.

FIG. 29A is a schematic plan view illustrating the power supply terminal of this specific example. FIG. 29B is a schematic plan view illustrating the method for coupling the power supply terminal of this specific example.

The power supply terminal 280 illustrated in FIG. 29A and FIG. 29B includes a connection member 281, a conducting lead portion 283, a supporter 285, and a coupling portion 287. The connection member 281 is connected to a member called a socket, etc. The socket supplies the electrical power from outside the electrostatic chuck 10. In the example, the connection member 281 has a pin configuration that is connectable to the socket. However, the configuration of the connection member 281 may be modified as appropriate according to the configuration of the member to be connected. For example, in the case where the member that is connected to the power supply terminal 280 and supplies the electrical power from the outside has a pin configuration, the connection member 281 may have a socket configuration to which the member having the pin configuration is connectable. The conducting lead portion 283 is connected to the connection member 281 and the supporter 285. The supporter 285 is connected to the conducting lead portion 283 and the coupling portion 287. As illustrated by arrows C14 illustrated in FIG. 29B, the coupling portion 287 is coupled to the bypass layer 250 or at least one of the first heater element 230a or the second heater element 230b. Thereby, the power supply terminal 280 supplies the electrical power to at least one of the first heater element 230a or the second heater element 230b. In the case where the coupling portion 287 is coupled to the bypass layer 250, the power supply terminal 280 supplies the electrical power to at least one of the first heater element 230a or the second heater element 230b via the bypass layer 250.

The conducting lead portion 283 relaxes the stress applied to the power supply terminal 280. In other words, the connection member 281 is fixed to the base plate 300. On the other hand, the coupling portion 287 is coupled to the bypass layer 250 or at least one of the first heater element 230a or the second heater element 230b. A temperature difference occurs between the base plate 300 and one of the first heater element 230a, the second heater element 230b, or the bypass layer 250. Therefore, a thermal expansion difference occurs between the base plate 300 and the one of the first heater element 230a, the second heater element 230b, or the bypass layer 250. Therefore, the stress that is caused by the thermal expansion difference may be applied to the power supply terminal 280. For example, the stress that is caused by the thermal expansion difference is applied in the diametrical direction of the base plate 300. The conducting lead portion 283 can relax the stress. The coupling between the coupling portion 287 and the one of the first heater element 230a, the second heater element 230b, or the bypass layer 250 is performed by welding, coupling utilizing laser light, soldering, brazing, etc. The resistance of the contact portion between the power supply terminal 280 and the one of the first heater element 230a, the second heater element 230b, or the bypass layer 250 can be reduced by the coupling portion 287. Thereby, the abnormal heat can be suppressed; and the uniformity of the temperature distribution in the surface of the processing object can be increased.

For example, molybdenum or the like is an example of the material of the connection member 281. For example, copper or the like is an example of the material of the conducting lead portion 283. A diameter D5 of the conducting lead portion 283 is smaller than a diameter D8 of the connection member 281. The diameter D5 of the conducting lead portion 283 is, for example, not less than about 0.3 mm and not more than about 2.0 mm. For example, stainless steel or the like is an example of the material of the supporter 285. A thickness D6 (the length in the Z-direction) of the supporter 285 is, for example, not less than about 0.5 mm and not more than about 2.0 mm. For example, stainless steel or the like is an example of the material of the coupling portion 287. A thickness D7 (the length in the Z-direction) of the coupling portion 287 is, for example, not less than about 0.05 mm and not more than about 0.50 mm.

According to this specific example, because the diameter D8 of the connection member 281 is larger than the diameter D5 of the conducting lead portion 283, the connection member 281 can supply a relatively large current to the heater element 230. Because the diameter D5 of the conducting lead portion 283 is smaller than the diameter D8 of the connection member 281, the conducting lead portion 283 can be deformed more easily than the connection member 281; and the position of the connection member 281 can be shifted from the center of the coupling portion 287. Thereby, the power supply terminal 280 can be fixed to a member (e.g., the base plate 300) that is different from the heater plate 200.

For example, the supporter 285 is coupled to the conducting lead portion 283 and the coupling portion 287 by welding, coupling utilizing laser light, soldering, brazing, etc. Thereby, a wider contact surface area for the first heater element 230a, the second heater element 230b, or the bypass layer 250 can be ensured while relaxing the stress applied to the power supply terminal 280.

Figure 30:
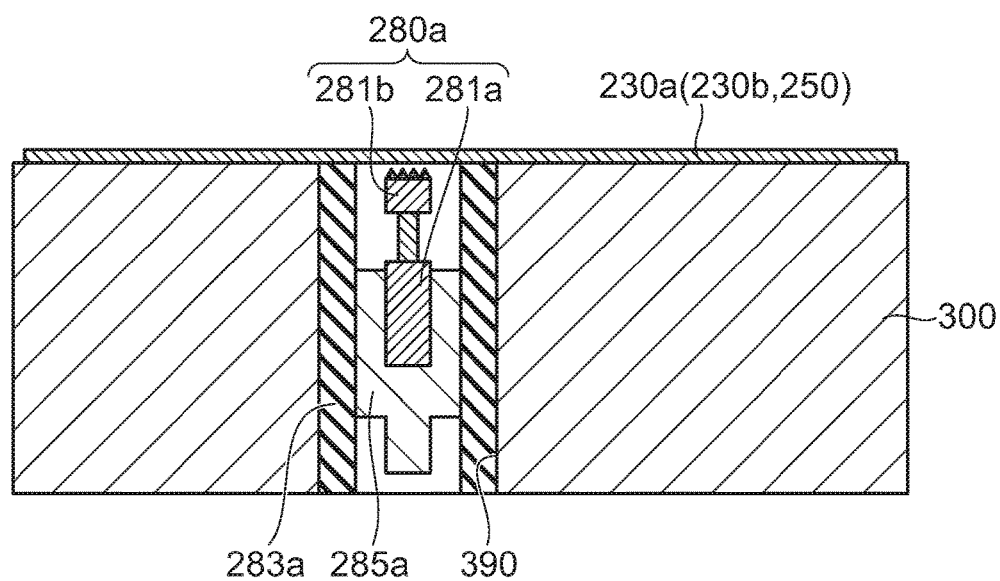
FIG. 30 is a schematic cross-sectional view illustrating a modification of the power supply terminal of the embodiment.

FIG. 30 is a schematic cross-sectional view illustrating a modification of the power supply terminal of the embodiment.

In the example, the electrostatic chuck according to the embodiment includes a power supply terminal 280a instead of the power supply terminal 280 described above. The power supply terminal 280a includes a power supply portion (a main portion) 281a and a terminal portion 281b. The power supply terminal 280a is, for example, a contact probe.

For example, a hole 390 is provided in the base plate 300. A sleeve 283a that has a tubular configuration is fixed in the hole 390. The power supply terminal 280a is provided in the interior of the sleeve 283a and is fixed to the base plate 300 by, for example, screwing together, etc.

A socket 285a that supplies the electrical power from the outside to at least one of the first heater element 230a or the second heater element 230b can be connected to the power supply portion 281a. In the example, the power supply portion 281a has a pin configuration that can be connected to the socket 285a. However, the configuration of the power supply portion 281a may be modified as appropriate according to the configuration of the member to be connected. For example, in the case where the member that is connected to the power supply terminal 280a and supplies the electrical power from the outside has a pin configuration, the power supply portion 281a may have a socket configuration to which the member having the pin configuration is connectable.

The terminal portion 281b is provided at the tip of the power supply terminal 280a and contacts the bypass layer 250 or at least one of the first heater element 230a or the second heater element 230b. The terminal portion 281b is slidable with respect to the power supply portion 281a; and the power supply terminal 280a is extendable/retractable.

The power supply terminal 280a includes a spring fixed to the power supply portion 281a in the interior of the power supply terminal 280a. The terminal portion 281b is urged by the spring so that the power supply terminal 280a elongates.

The terminal portion 281b is pressed onto the heater plate 200 (the bypass layer 250 or at least one of the first heater element 230a or the second heater element 230b). At this time, the power supply terminal 280a is in a contracted state against the elastic force of the spring. In other words, the terminal portion 281b is pressed by being urged in the direction toward the bypass layer 250 or the at least one of the first heater element 230a or the second heater element 230b by the elastic force of the spring. Thereby, the socket 285a is electrically connected to the bypass layer 250 or the at least one of the first heater element 230a or the second heater element 230b via the power supply terminal 280a. The electrical power is supplied from the outside via the power supply terminal 280a and the socket 285a to the bypass layer 250 or the at least one of the first heater element 230a or the second heater element 230b.

In the case where such a power supply terminal 280a is used, the diameter of the hole provided for supplying power (the hole 390 of the base plate 300 and/or the hole 273 of the second support plate 270) can be reduced compared to the case where the coupling of the power supply terminal is performed by welding, etc. Because the power supply terminal 280a can be reduced compared to the case where the coupling of the power supply terminal is performed by welding, etc., the periphery of the power supply terminal 280a that becomes a singularity of the temperature can be suppressed. Thereby, the uniformity of the temperature distribution in the surface of the processing object can be increased.

The electrostatic chuck 10 includes, for example, a first power supply terminal that supplies the electrical power to the first heater element 230a, and a second power supply terminal that supplies the electrical power to the second heater element 230b. The first power supply terminal is, for example, the power supply terminal 280a recited above. For example, the terminal portion 281b of the power supply terminal 280a is pressed onto the first heater element 230a and is electrically connected to the first heater element 230a. Thereby, the electrical power is supplied to the first heater element 230a from the outside without going through the bypass layer 250. On the other hand, the second power supply terminal is, for example, the power supply terminal 280 recited above. The coupling portion 287 of the power supply terminal 280 is coupled to the second heater element 230b and is electrically connected to the second heater element 230b. Thereby, the electrical power is supplied to the second heater element 230b from the outside without going through the bypass layer 250.

Also, the first power supply terminal and the second power supply terminal may supply the electrical power to the heater plate 200 via the bypass layer 250. For example, the terminal portion 281b of the first power supply terminal (the power supply terminal 280a) is pressed onto the bypass layer 250 and is electrically connected to the bypass layer 250. The bypass layer 250 is electrically connected to the first heater element 230a. Thereby, the electrical power is supplied to the first heater element 230a from the outside via the bypass layer 250. On the other hand, the second power supply terminal (the power supply terminal 280) is coupled to the bypass layer 250 and is electrically connected to the bypass layer 250. The bypass layer 250 is electrically connected to the second heater element 230b. Thereby, the electrical power is supplied to the second heater element 230b from the outside via the bypass layer 250.

Thus, one of the first power supply terminal or the second power supply terminal may be the power supply terminal 280; and the other may be the power supply terminal 280a. Both of the first power supply terminal and the second power supply terminal may be the power supply terminal 280; or both of the first power supply terminal and the second power supply terminal may be the power supply terminal 280a.

Figure 31:
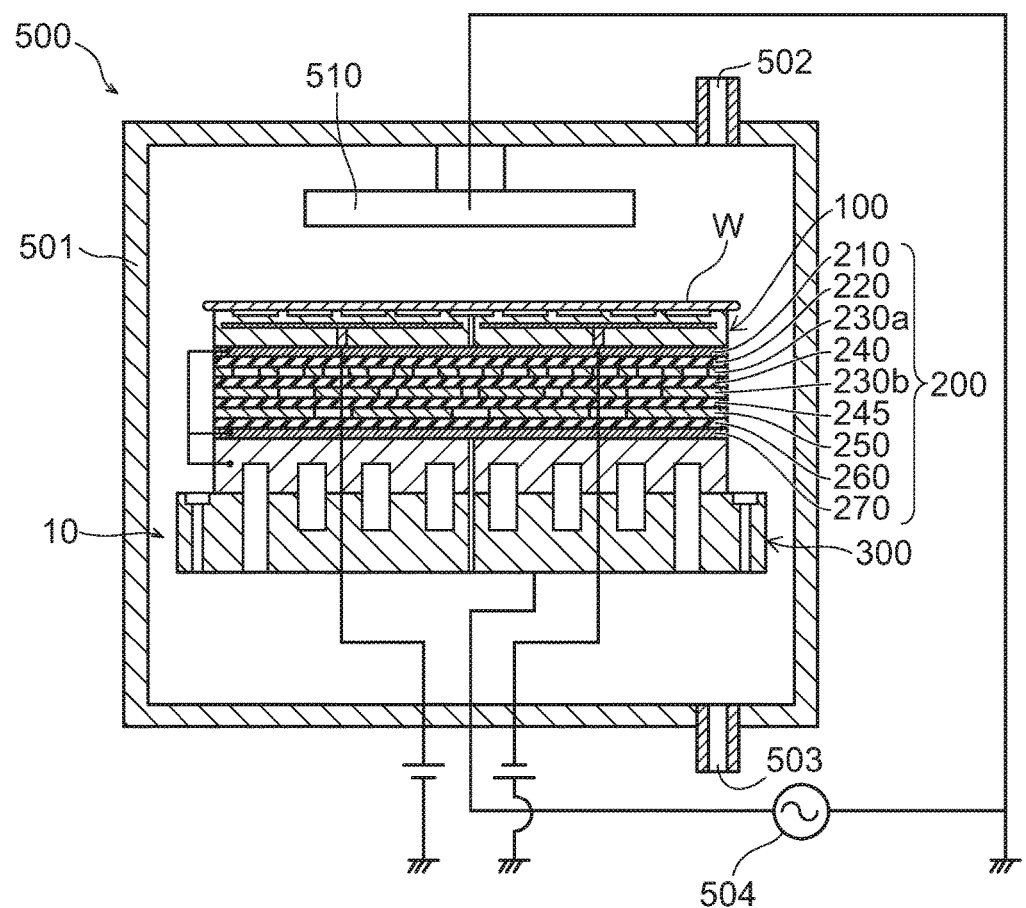
FIG. 31 is a schematic cross-sectional view illustrating a wafer processing apparatus according to the embodiment.

FIG. 31 is a schematic cross-sectional view illustrating a wafer processing apparatus according to the embodiment.

The wafer processing apparatus 500 according to the embodiment includes a processing container 501, an upper electrode 510, and an electrostatic chuck (e.g., the electrostatic chuck 10) described above in reference to FIG. 1 to FIG. 27. A processing gas inlet 502 for introducing the processing gas to the interior is provided in the ceiling of the processing container 501. An exhaust port 503 for evacuating the interior is provided in the bottom plate of the processing container 501. A high frequency power supply 504 is connected to the upper electrode 510 and the electrostatic chuck 10; and a pair of electrodes including the upper electrode 510 and the electrostatic chuck 10 opposes itself to be parallel and separated by a prescribed spacing.

When the high frequency voltage is applied between the upper electrode 510 and the electrostatic chuck 10 in the wafer processing apparatus 500 according to the embodiment, high frequency electric discharge occurs; the processing gas that is introduced to the processing container 501 is excited and activated by the plasma; and the processing object W is processed. As the processing object W, a semiconductor substrate (a wafer) may be illustrated. However, the processing object W is not limited to the semiconductor substrate (the wafer) and may be, for example, a glass substrate that is used in a liquid crystal display device, etc.

The high frequency power supply 504 is electrically connected to the base plate 300 of the electrostatic chuck 10. As described above, the base plate 300 includes a metal material such as aluminum, etc. In other words, the base plate 300 is electrically conductive. Thereby, the high frequency voltage is applied between an upper electrode 410 and the base plate 300.

In the wafer processing apparatus 500 of the example, the base plate 300 is electrically connected to the first support plate 210 and the second support plate 270. Thereby, in the wafer processing apparatus 500, the high frequency voltage is applied also between the first support plate 210 and the upper electrode 510 and between the second support plate 270 and the upper electrode 510.

Thus, the high frequency voltage is applied between the upper electrode 510 and each of the support plates 210 and 270. Thereby, compared to the case where the high frequency voltage is applied only between the base plate 300 and the upper electrode 510, the location where the high frequency voltage is applied can be more proximal to the processing object W. Thereby, for example, the plasma can be generated more efficiently and using a low potential.

Although an apparatus that has a configuration such as that of the wafer processing apparatus 500 generally is called a parallel plate-type RIE (Reactive Ion Etching) apparatus, the electrostatic chuck 10 according to the embodiment is not limited to applications for such an apparatus. For example, the electrostatic chuck 10 according to the embodiment is widely applicable to so-called reduced pressure processing apparatuses such as an ECR (Electron Cyclotron Resonance) etching apparatus, an inductively coupled plasma processing apparatus, a helicon wave plasma processing apparatus, a downstream plasma processing apparatus, a surface wave plasma processing apparatus, a plasma CVD (Chemical Vapor Deposition) apparatus, etc. The electrostatic chuck 10 according to the embodiment also is widely applicable to substrate processing apparatuses such as an exposure apparatus or an inspection apparatus in which the processing or the inspection is performed at atmospheric pressure. However, considering the high plasma resistance of the electrostatic chuck 10 according to the embodiment, it is favorable for the electrostatic chuck 10 to be applied to a plasma processing apparatus. In the configurations of these apparatuses, known configurations are applicable to the portions other than the electrostatic chuck 10 according to the embodiment; and a description is therefore omitted.

Figure 32:
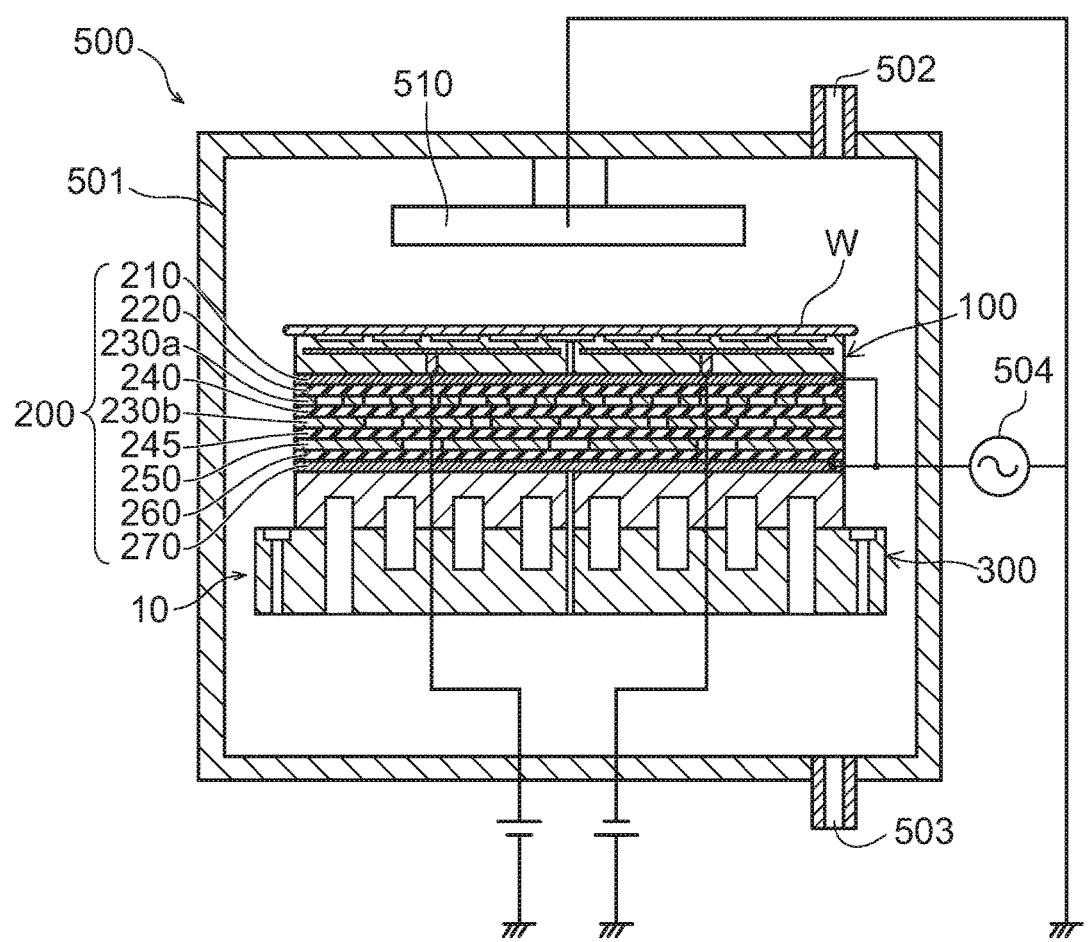
FIG. 32 is a schematic cross-sectional view illustrating a modification of the wafer processing apparatus according to the embodiment.

FIG. 32 is a schematic cross-sectional view illustrating a modification of the wafer processing apparatus according to the embodiment.

As illustrated in FIG. 32, the high frequency power supply 504 may be electrically connected only between the first support plate 210 and the upper electrode 510 and between the second support plate 270 and the upper electrode 510. Even in such a case, the location where the high frequency voltage is applied can be more proximal to the processing object W; and the plasma can be generated efficiently.

Figure 33:
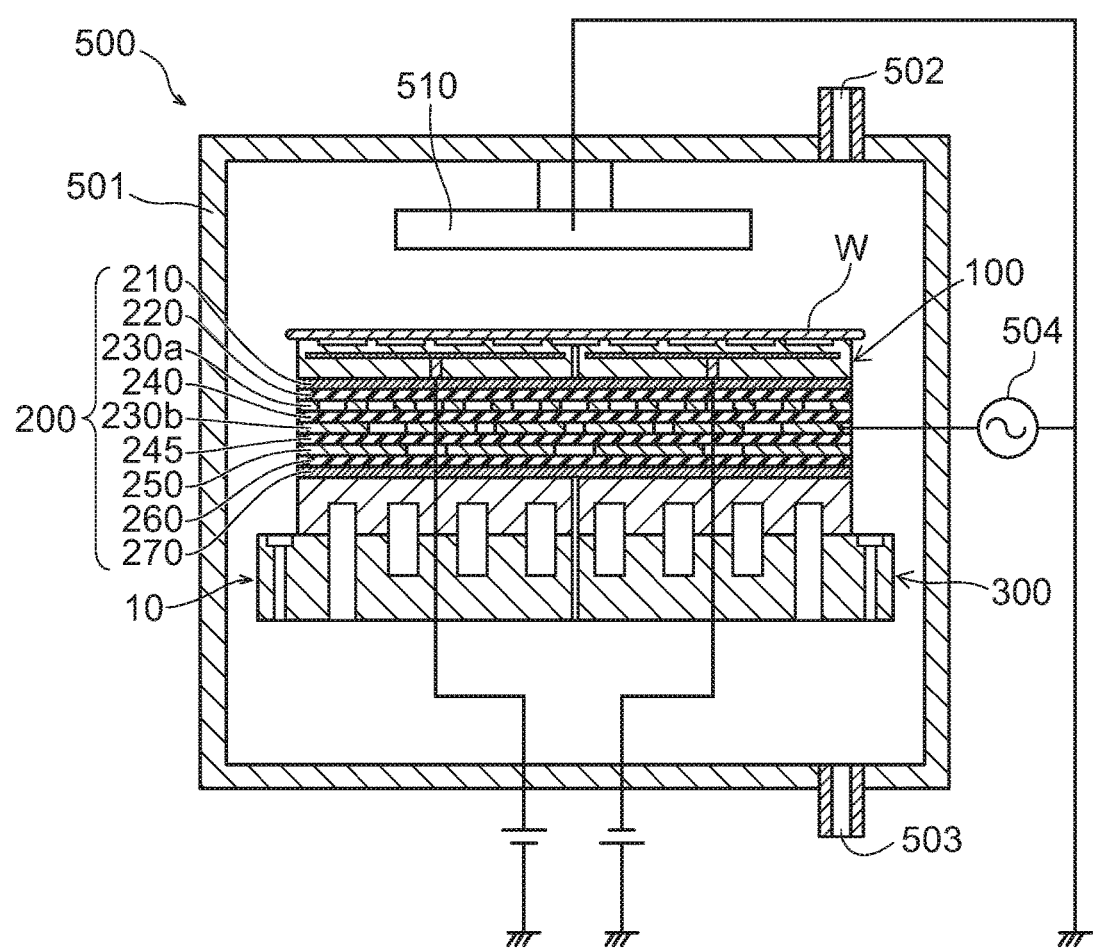
FIG. 33 is a schematic cross-sectional view illustrating a modification of the wafer processing apparatus according to the embodiment.

FIG. 33 is a schematic cross-sectional view illustrating a modification of the wafer processing apparatus according to the embodiment.

In the example as illustrated in FIG. 33, the high frequency power supply 504 is electrically connected to the second heater element 230b. Thus, the high frequency voltage may be applied between the second heater element 230b and the upper electrode 510. Or, the high frequency voltage may be applied between the first heater element 230a and the upper electrode 510. Even in such a case, the location where the high frequency voltage is applied can be more proximal to the processing object W; and the plasma can be generated efficiently.

For example, the high frequency power supply 504 is electrically connected to the first and second heater elements 230a and 230b via the power supply terminals 280. For example, the high frequency voltage is selectively applied to the multiple first heater regions R1 (the multiple first heater electrodes 239a) of the first heater element 230a. Or, the high frequency voltage is selectively applied to the multiple second heater regions R2 (the multiple second heater electrodes 239b) of the second heater element 230b. Thereby, the distribution of the high frequency voltage can be controlled.

For example, the high frequency power supply 504 may be electrically connected to the first support plate 210, the second support plate 270, the first heater element 230a, and the second heater element 230b. The high frequency voltage may be applied between the first support plate 210 and the upper electrode 510, between the second support plate 270 and the upper electrode 510, between the first heater element 230a and the upper electrode 510, and between the second heater element 230b and the upper electrode 510.

The invention has been described with reference to the embodiments. However, the invention is not limited to these embodiments. Any design changes in the above embodiments suitably made by those skilled in the art are also encompassed within the scope of the invention as long as they fall within the spirit of the invention. For example, the shape, the size the material, the disposition and the arrangement or the like of the components included in the electrostatic chuck are not limited to illustrations and can be changed appropriately.

The components included in the embodiments described above can be combined to the extent possible, and these combinations are also encompassed within the scope of the invention as long as they include the features of the invention.

What is claimed is:

1. An electrostatic chuck, comprising:
a ceramic dielectric substrate having a first major surface where a processing object is placed;
an electrode layer provided in the ceramic dielectric substrate;
a base plate supporting the ceramic dielectric substrate; and
a heater plate provided between the base plate and the first major surface, the heater plate including a first heater element provided for emitting heat due to a current flowing therethrough, and a second heater element provided for emitting heat due to a current flowing therethrough, the second heater element having a gap,
each of the first and second heater elements including a plurality of bends, wherein a direction in which the heater element extends changes from a first direction second direction different from the first direction,
wherein:
when viewed along a direction perpendicular to the first major surface, a number of the bends of the first heater element is more than a number of the bends of the second heater element, and the first heater element comprises a portion positioned proximate the gap of the second heater element,
the heater plate includes a plurality of first heater regions and a plurality of second heater regions,
the first heater element includes a plurality of first heater electrodes provided independently from each other in the plurality of first heater regions,
the second heater element includes a plurality of second heater electrodes provided independently from each other in the plurality of second heater regions, and
a number of the first heater regions is larger than a number of the second heater regions.

2. The chuck according to claim 1, wherein an electrical resistance of each of the first heater electrodes is higher than an electrical resistance of each of the second heater electrodes.

3. The chuck according to claim 1, wherein:
the second heater element includes a connection region where an electrically conductive body is connected, the electrically conductive body configured to supply electrical power to the second heater element, and
at least a portion of the first heater element overlaps the connection region when viewed along a direction perpendicular to the first major surface.

4. The chuck according to claim 1, wherein the heater plate further includes a bypass layer electrically connected to at least one of the first heater element and Pill the second heater element, the bypass layer being electrically conductive.

5. The chuck according to claim 4, wherein the bypass layer is electrically connected to both the first heater element and the second heater element.

6. The chuck according to claim 4, wherein
the bypass layer includes a plurality of bypass portions, and
the number of the bypass portions electrically connected to the first heater element is not more than 2 times the number of the first heater regions.

7. The chuck according to claim 1, wherein one of the first heater electrodes is not provided in one of the plurality of first heater regions.

8. The chuck according to claim 1, wherein:
one of the first heater electrodes is not provided in one of the plurality of first heater regions,
the heater plate includes an electrically conductive portion provided in the first heater region where the first heater electrode is not provided, and
the electrically conductive portion is not supplied with power from the outside.

9. The chuck according to claim 1, wherein:
the heater plate further includes a third heater element provided for emitting heat due to a current flowing therethrough,
the third heater element is provided in a third layer different from a first layer where the first heater element is provided and different from a second layer where the second heater element is provided, and
when viewed along the direction perpendicular to the first major surface, a number of the bends of the third heater element is more than a number of the bends of the second heater element, and the third heater element includes a portion positioned proximate the gap of the second heater element.

10. The chuck according to claim 1, wherein the first heater element is provided between the first major surface and the second heater element.

11. The chuck according to claim 1, wherein:
the heater plate further includes at least one of a first support plate and Pill a second support plate,
where present, the first support plate is provided on the first heater element and the second heater element,
where present, the second support plate is provided under the first heater element and the second heater element,
a thermal conductivity of the first support plate is higher than a thermal conductivity of the first heater element and higher than a thermal conductivity of the second heater element, and
a thermal conductivity of the second support plate is higher than the thermal conductivity of the first heater element and higher than the thermal conductivity of the second heater element.

12. The chuck according to claim 11, wherein at least one of the first support plate and the second support plate has multiple types of recesses having mutually-different depths.

13. The chuck according to claim 1, wherein:
the first heater element includes a first connection portion, an electrically conductive body being connected to the first connection portion for supplying electrical power to the first heater element,
the second heater element includes a second connection portion, an electrically conductive body being connected to the second connection portion for supplying electrical power to the second heater element, and
a width of the first connection portion is narrower than a width of the second connection portion.

14. The chuck according to claim 1, further comprising a power supply terminal for supplying electrical power to the heater plate, the power supply terminal extending from the heater plate toward the base plate, the power supply terminal configured to supply the electrical power to at least one of the first heater element and the second heater element, the power supply terminal including:
a connection member connected to a socket, the socket supplying the electrical power from the outside;

a conducting lead portion finer than the connection member;
a supporter connected to the conducting lead portion; and
a coupling portion connected to the supporter and coupled to said at least one of the first heater element and Pill the second heater element.

15. The chuck according to claim 1, further comprising a power supply terminal for supplying electrical power to the heater plate, the power supply terminal provided in the base plate,
the power supply terminal including:
a power supply portion connected to a socket, the socket supplying the electrical power from the outside; and
a terminal portion connected to the power supply portion and pressed onto at least one of the first heater element and Pill the second heater element.

16. The chuck according to claim 1, further comprising:
a first power supply terminal for supplying electrical power to the heater plate, the first power supply terminal being provided in the base plate; and
a second power supply terminal for supplying electrical power to the heater plate, the second power supply terminal configured to supply the electrical power to the second heater element, the second power supply terminal extending from the heater plate toward the base plate,
the first power supply terminal configured to supply the electrical power to the first heater element and including
a power supply portion connected to a socket, the socket supplying the electrical power from the outside, and
a terminal portion connected to the power supply portion and pressed onto the first heater element,
the second power supply terminal including:
a connection member connected to a socket, the socket supplying the electrical power from the outside,
a conducting lead portion finer than the connection member,
a supporter connected to the conducting lead portion, and
a coupling portion connected to the supporter and coupled to the second heater element.

17. The chuck according to claim 4, further comprising a power supply terminal for supplying electrical power to the heater plate, the power supply terminal extending from the heater plate toward the base plate, the power supply terminal configured to supply the electrical power via the bypass layer to at least one of the first heater element and the second heater element via the bypass layer, the power supply terminal including:
a connection member connected to a socket, the socket supplying the electrical power from the outside;
a conducting lead portion finer than the connection member;
a supporter connected to the conducting lead portion; and
a coupling portion connected to the supporter and coupled to the bypass layer.

18. The chuck according to claim 4, further comprising a power supply terminal for supplying electrical power to the heater plate, the power supply terminal being provided in the base plate, the power supply terminal including:
a power supply portion connected to a socket, the socket supplying the electrical power from the outside; and
a terminal portion connected to the power supply portion and pressed onto the bypass layer.

19. The chuck according to claim 4, further comprising:
a first power supply terminal for supplying electrical power to the heater plate, the first power supply terminal provided in the base plate; and
a second power supply terminal for supplying electrical power to the heater plate, the second power supply terminal extending from the heater plate toward the base plate, the second power supply terminal configured to supply the electrical power to the second heater element via the bypass layer;
the first power supply terminal configured to supply the electrical power to the first heater element and including
a power supply portion connected to a socket, the socket supplying the electrical power from the outside, and
a terminal portion connected to the power supply portion and pressed onto the bypass layer,
the second power supply terminal including
a connection member connected to a socket, the socket supplying the electrical power from the outside,
a conducting lead portion finer than the connection member,
a supporter connected to the conducting lead portion, and
a coupling portion connected to the supporter and coupled to the bypass layer.

20. An electrostatic chuck, comprising:
a ceramic dielectric substrate having a first major surface where a processing object is placed;
an electrode layer provided in the ceramic dielectric substrate;
a base plate supporting the ceramic dielectric substrate; and
a heater plate provided between the base plate and the first major surface, the heater plate including a first heater element provided for emitting heat due to a current flowing therethrough, a second heater element provided for emitting heat due to a current flowing therethrough, and a third heater element provided for emitting heat due to a current flowing therethrough, the second heater element having a gap,
each of the first, second and third heater elements including a plurality of bends, wherein a direction in which the heater element extends changes from a first direction to a second direction different from the first direction,
wherein:
when viewed along a direction perpendicular to the first major surface, a number of the bends of the first heater element is more than a number of the bends of the second heater element, and the first heater element comprises a portion positioned proximate the gap of the second heater element,
the third heater element is provided in a third layer different from a first layer where the first heater element is provided and different from a second layer where the second heater element is provided, and
when viewed along the direction perpendicular to the first major surface, a number of the bends of the third heater element is more than a number of the bends of the second heater element, and the third heater element includes a portion positioned proximate the gap of the second heater element.

21. An electrostatic chuck, comprising:
a ceramic dielectric substrate having a first major surface where a processing object is placed;

an electrode layer provided in the ceramic dielectric substrate;
a base plate supporting the ceramic dielectric substrate; and
a heater plate provided between the base plate and the first major surface, the heater plate including a first heater element provided for emitting heat due to a current flowing, and a second heater element provided for emitting heat due to a current flowing, the second heater element having a gap, each of the first and second heater elements including a plurality of bends, wherein a direction in which the heater element extends changes from a first direction to a second direction different from the first direction,
wherein:
when viewed along a direction perpendicular to the first major surface, a number of the bends of the first heater element is more than a number of the bends of the second heater element, and the first heater element comprises a portion positioned proximate the gap of the second heater element,
the heater plate further includes at least one of a first support plate and a second support plate,
the first support plate is provided on the first heater element and the second heater element,
the second support plate is provided under the first heater element and the second heater element,
a thermal conductivity of the first support plate is higher than a thermal conductivity of the first heater element and higher than a thermal conductivity of the second heater element, and
a thermal conductivity of the second support plate is higher than the thermal conductivity of the first heater element and higher than the thermal conductivity of the second heater element.

22. An electrostatic chuck, comprising:
a ceramic dielectric substrate having a first major surface where a processing object is placed;
an electrode layer provided in the ceramic dielectric substrate;
a base plate supporting the ceramic dielectric substrate; and
a heater plate provided between the base plate and the first major surface, the heater plate including a first heater element provided for emitting heat due to a current flowing, and a second heater element provided for emitting heat due to a current flowing, the second heater element having a gap, each of the first and second heater elements including a plurality of bends, wherein a direction in which the heater element extends changes from a first direction to a second direction different from the first direction,
wherein:
when viewed along a direction perpendicular to the first major surface, a number of the bends of the first heater element is more than a number of the bends of the second heater element, and the first heater element comprises a portion positioned proximate the gap of the second heater element, wherein at least one of the first support plate and the second support plate has multiple types of recesses having mutually-different depths.

23. An electrostatic chuck, comprising:
a ceramic dielectric substrate having a first major surface where a processing object is placed;
an electrode layer provided in the ceramic dielectric substrate;
a base plate supporting the ceramic dielectric substrate; and
a heater plate provided between the base plate and the first major surface, the heater plate including a first heater element provided for emitting heat due to a current flowing, and a second heater element provided for emitting heat due to a current flowing, the second heater element having a gap, each of the first and second heater elements including a plurality of bends, wherein a direction in which the heater element extends changes from a first direction to a second direction different from the first direction,
wherein:
when viewed along a direction perpendicular to the first major surface, a number of the bends of the first heater element is more than a number of the bends of the second heater element, and the first heater element comprises a portion positioned proximate the gap of the second heater element,
the first heater element includes a first connection portion, an electrically conductive body being connected to the first connection portion for supplying electrical power to the first heater element,
the second heater element includes a second connection portion, an electrically conductive body being connected to the second connection portion for supplying electrical power to the second heater element, and
a width of the first connection portion is narrower than a width of the second connection portion.

24. An electrostatic chuck, comprising:
a ceramic dielectric substrate having a first major surface where a processing object is placed;
an electrode layer provided in the ceramic dielectric substrate;
a base plate supporting the ceramic dielectric substrate;
a heater plate provided between the base plate and the first major surface, the heater plate including a first heater element provided for emitting heat due to a current flowing, and a second heater element provided for emitting heat due to a current flowing, the second heater element having a gap, and
a power supply terminal for supplying electrical power to the heater plate, the power supply terminal extending from the heater plate toward the base plate, the power supply terminal configured to supply the electrical power to the at least one of the first heater element and the second heater element,
wherein:
each of the first and second heater elements includes a plurality of bends, wherein a direction in which the heater element extends changes from a first direction to a second direction different from the first direction,
when viewed along a direction perpendicular to the first major surface, a number of the bends of the first heater element is more than a number of the bends of the second heater element, and the first heater element comprises a portion positioned proximate the gap of the second heater element,
and wherein the power supply terminal comprises:
a connection member connected to a socket, the socket supplying the electrical power from the outside;
a conducting lead portion finer than the connection member;
a supporter connected to the conducting lead portion; and a coupling portion connected to the supporter and coupled to at least one of the first heater element and the second heater element.

25. An electrostatic chuck, comprising:

a ceramic dielectric substrate having a first major surface where a processing object is placed;

an electrode layer provided in the ceramic dielectric substrate;

a base plate supporting the ceramic dielectric substrate; and a heater plate provided between the base plate and the first major surface, the heater plate including a first heater element provided for emitting heat due to a current flowing, and a second heater element provided for emitting heat due to a current flowing, the second heater element having a gap, a first power supply terminal for supplying electrical power to the heater plate, the first power supply terminal being provided in the base plate; and a second power supply terminal for supplying electrical power to the heater plate, the second power supply terminal configured to supply the electrical power to the second heater element, the second power supply terminal extending from the heater plate toward the base plate, wherein:

when viewed along a direction perpendicular to the first major surface, a number of the bends of the first heater element is more than a number of the bends of the second heater element, and the first heater element comprises a portion positioned proximate the gap of the second heater element, the first power supply terminal is configured to supply the electrical power to the first heater element and comprises:

a power supply portion connected to a socket, the socket supplying the electrical power from the outside, and a terminal portion connected to the power supply portion and pressed onto the first heater element, and the second power supply terminal comprises:

a connection member connected to a socket, the socket supplying the electrical power from the outside, a conducting lead portion finer than the connection member, a supporter connected to the conducting lead portion, and a coupling portion connected to the supporter and coupled to the second heater element.

* * * * *